(12) United States Patent
Yamazaki et al.

(10) Patent No.: US 7,439,115 B2
(45) Date of Patent: *Oct. 21, 2008

(54) SEMICONDUCTOR FABRICATING APPARATUS

(75) Inventors: Shunpei Yamazaki, Tokyo (JP); Hisashi Ohtani, Tochigi (JP); Masaaki Hiroki, Kanagawa (JP); Koichiro Tanaka, Kanagawa (JP); Aiko Shiga, Kanagawa (JP); Mai Akiba, Kanagawa (JP)

(73) Assignee: Semiconductor Eneregy Laboratory Co., Ltd., Kanagawa-Ken (JP)

( * ) Notice: Subject to any disclaimer, the term of this patent is extended or adjusted under 35 U.S.C. 154(b) by 215 days.

This patent is subject to a terminal disclaimer.

(21) Appl. No.: 11/370,009

(22) Filed: Mar. 8, 2006

(65) Prior Publication Data
US 2006/0155413 A1    Jul. 13, 2006

Related U.S. Application Data

(62) Division of application No. 10/300,927, filed on Nov. 21, 2002, now Pat. No. 7,050,878.

(30) Foreign Application Priority Data
Nov. 22, 2001    (JP)    ............... 2001-358553

(51) Int. Cl.
    *H01L 21/84*    (2006.01)
(52) U.S. Cl. ..................... 438/166; 438/487
(58) Field of Classification Search ......... 438/141–166, 438/795–799, 479–487
See application file for complete search history.

(56) References Cited

U.S. PATENT DOCUMENTS

| 4,177,372 A | 12/1979 | Kotera et al. |
| 4,316,074 A | 2/1982 | Daly |
| 4,330,363 A | 5/1982 | Biegesen et al. |
| 4,370,175 A | 1/1983 | Levatter |
| 4,388,145 A | 6/1983 | Hawkins et al. |
| 4,406,709 A | 9/1983 | Celler et al. |
| 4,409,724 A | 10/1983 | Tasch, Jr. et al. |

(Continued)

FOREIGN PATENT DOCUMENTS

EP    0 088 004 A2    9/1983

(Continued)

OTHER PUBLICATIONS

Hayzelden, C. et al.; Appl. Phys. Lett.; In Situ Transmission Electron Microscopy Studies of Silicide-Mediated Crystallization of Amorphous Silicon; Jan. 13, 1992; pp. 225-227; vol. 60, No. 2.

(Continued)

*Primary Examiner*—Savitri Mulpuri
(74) *Attorney, Agent, or Firm*—Nixon Peabody LLP; Jeffrey L. Costellia

(57) ABSTRACT

Providing a semiconductor fabricating apparatus using a laser crystallization technique for enhancing the processing efficiency for substrate and for increasing the mobility of a semiconductor film. The semiconductor fabricating apparatus of multi-chamber system includes a film formation equipment for forming a semiconductor film, and a laser irradiation equipment. The laser irradiation equipment includes first means for controlling a laser irradiation position relative to an irradiation object, second means (laser oscillator) for emitting laser light, third means (optical system) for processing or converging the laser light, and fourth means for controlling the oscillation of the second means and for controlling the first means in a manner that a beam spot of the laser light processed by the third means may cover a place determined based on data on a mask configuration (pattern information).

16 Claims, 42 Drawing Sheets

U.S. PATENT DOCUMENTS

| | | | |
|---|---|---|---|
| 4,554,823 A | 11/1985 | Lilley | |
| 4,566,043 A | 1/1986 | Tamura | |
| 4,592,799 A | 6/1986 | Hayafuji | |
| 4,668,089 A | 5/1987 | Oshida et al. | |
| 4,692,191 A | 9/1987 | Maeda et al. | |
| 4,780,590 A | 10/1988 | Griner et al. | |
| 4,861,964 A | 8/1989 | Sinohara | |
| 4,978,970 A | 12/1990 | Okazaki | |
| RE33,947 E | 6/1992 | Shinohara | |
| 5,147,826 A | 9/1992 | Liu et al. | |
| 5,214,001 A | 5/1993 | Ipposhi et al. | |
| 5,225,886 A | 7/1993 | Koizumi et al. | |
| 5,246,870 A | 9/1993 | Merchant | |
| 5,275,851 A | 1/1994 | Fonash et al. | |
| 5,294,555 A | 3/1994 | Mano et al. | |
| 5,306,584 A | 4/1994 | Palmer | |
| 5,315,101 A | 5/1994 | Hughes et al. | |
| 5,365,875 A | 11/1994 | Asai et al. | |
| 5,367,392 A | 11/1994 | Janai | |
| 5,403,772 A | 4/1995 | Zhang et al. | |
| 5,409,867 A | 4/1995 | Asano | |
| 5,432,122 A | 7/1995 | Chae | |
| 5,466,958 A | 11/1995 | Kakumu | |
| 5,488,000 A | 1/1996 | Zhang et al. | |
| 5,488,005 A | 1/1996 | Han et al. | |
| 5,517,312 A | 5/1996 | Finarov | |
| 5,521,107 A | 5/1996 | Yamazaki et al. | |
| 5,528,056 A | 6/1996 | Shimada et al. | |
| 5,529,630 A | 6/1996 | Imahashi et al. | |
| 5,529,937 A | 6/1996 | Zhang et al. | |
| 5,543,636 A | 8/1996 | Yamazaki | |
| 5,563,427 A | 10/1996 | Yudasaka et al. | |
| 5,569,610 A | 10/1996 | Zhang et al. | |
| 5,580,801 A | 12/1996 | Maegawa et al. | |
| 5,591,668 A | 1/1997 | Maegawa et al. | |
| 5,592,318 A | 1/1997 | Majima et al. | |
| 5,604,360 A | 2/1997 | Zhang et al. | |
| 5,608,232 A | 3/1997 | Yamazaki et al. | |
| 5,618,741 A | 4/1997 | Young et al. | |
| 5,620,906 A | 4/1997 | Yamaguchi et al. | |
| 5,625,473 A | 4/1997 | Kondo et al. | |
| 5,632,915 A | 5/1997 | Schnetzer et al. | |
| 5,643,826 A | 7/1997 | Ohtani et al. | |
| 5,656,825 A | 8/1997 | Kusumoto et al. | |
| 5,679,588 A | 10/1997 | Choi | |
| 5,696,003 A | 12/1997 | Makita et al. | |
| 5,698,882 A | 12/1997 | Park | |
| 5,708,252 A | 1/1998 | Shinohara et al. | |
| 5,712,191 A | 1/1998 | Nakajima et al. | |
| 5,736,751 A | 4/1998 | Mano et al. | |
| 5,761,381 A | 6/1998 | Arci et al. | |
| 5,795,816 A | 8/1998 | Teramoto et al. | |
| 5,803,965 A | 9/1998 | Yoon | |
| 5,804,471 A | 9/1998 | Yamazaki et al. | |
| 5,815,494 A | 9/1998 | Yamazaki et al. | |
| 5,821,137 A | 10/1998 | Wakai et al. | |
| 5,851,862 A | 12/1998 | Ohtani et al. | |
| 5,854,803 A | 12/1998 | Yamazaki et al. | |
| 5,886,320 A | 3/1999 | Gallo et al. | |
| 5,886,366 A | 3/1999 | Yamazaki et al. | |
| 5,891,764 A | 4/1999 | Ishihara et al. | |
| 5,923,962 A | 7/1999 | Ohtani et al. | |
| 5,937,282 A | 8/1999 | Nakajima et al. | |
| 5,940,690 A | 8/1999 | Kusumoto et al. | |
| 5,943,593 A | 8/1999 | Noguchi et al. | |
| 5,953,597 A | 9/1999 | Kusumoto et al. | |
| 5,980,088 A | 11/1999 | Iwasaki et al. | |
| 5,986,306 A | 11/1999 | Nakajima et al. | |
| 6,020,224 A | 2/2000 | Shimogaichi et al. | |
| 6,043,453 A | 3/2000 | Arai | |
| 6,059,873 A | 5/2000 | Yamaguchi et al. | |
| 6,066,516 A | 5/2000 | Miyasaka | |
| 6,071,765 A | 6/2000 | Noguchi et al. | |
| 6,136,632 A | 10/2000 | Higashi | |
| 6,149,988 A | 11/2000 | Shinohara et al. | |
| 6,169,292 B1 | 1/2001 | Yamazaki et al. | |
| 6,174,374 B1 | 1/2001 | Zhang et al. | |
| 6,176,922 B1 | 1/2001 | Aklufi et al. | |
| 6,177,301 B1 | 1/2001 | Jung | |
| 6,204,099 B1 | 3/2001 | Kusumoto et al. | |
| 6,210,996 B1 | 4/2001 | Yamazaki et al. | |
| 6,221,701 B1 | 4/2001 | Yamazaki | |
| 6,242,289 B1 | 6/2001 | Nakajima et al. | |
| 6,256,849 B1 | 7/2001 | Kim | |
| 6,261,856 B1 | 7/2001 | Shinohara et al. | |
| 6,265,745 B1 | 7/2001 | Kusumoto et al. | |
| 6,285,042 B1 | 9/2001 | Ohtani et al. | |
| 6,322,625 B2 | 11/2001 | Im | |
| 6,335,541 B1 | 1/2002 | Ohtani et al. | |
| 6,337,232 B1 | 1/2002 | Kusumoto et al. | |
| 6,363,296 B1 | 3/2002 | Schulze | |
| 6,365,933 B1 | 4/2002 | Yamazaki et al. | |
| 6,372,039 B1 | 4/2002 | Okumura et al. | |
| 6,373,870 B1 | 4/2002 | Yamazaki et al. | |
| 6,393,042 B1 | 5/2002 | Tanaka | |
| 6,396,616 B1 | 5/2002 | Fitzer et al. | |
| 6,437,284 B1 | 8/2002 | Okamoto et al. | |
| 6,449,123 B1 | 9/2002 | Tsujimoto et al. | |
| 6,468,842 B2 | 10/2002 | Yamazaki et al. | |
| 6,469,729 B1 | 10/2002 | Ryan | |
| 6,475,872 B1 | 11/2002 | Jung | |
| 6,479,329 B2 | 11/2002 | Nakajima et al. | |
| 6,487,307 B1 | 11/2002 | Hennessey et al. | |
| 6,489,188 B2 | 12/2002 | Jung | |
| 6,521,492 B2 | 2/2003 | Miyasaka et al. | |
| 6,524,977 B1 | 2/2003 | Yamazaki et al. | |
| 6,556,652 B1 | 4/2003 | Mazor et al. | |
| 6,558,991 B2 | 5/2003 | Yamazaki et al. | |
| 6,573,163 B2 | 6/2003 | Voutsas et al. | |
| 6,573,919 B2 | 6/2003 | Benear et al. | |
| 6,576,919 B1 | 6/2003 | Yoshida | |
| 6,577,380 B1 | 6/2003 | Sposili et al. | |
| 6,583,381 B1 | 6/2003 | Duignan | |
| 6,590,230 B1 | 7/2003 | Yamazaki et al. | |
| 6,590,698 B1 | 7/2003 | Ohtsuki et al. | |
| 6,599,788 B1 | 7/2003 | Kawasaki et al. | |
| 6,602,744 B1 | 8/2003 | Ino et al. | |
| 6,642,091 B1 | 11/2003 | Tanabe | |
| 6,657,154 B1 | 12/2003 | Tanabe et al. | |
| 6,660,085 B2 | 12/2003 | Hara et al. | |
| 6,662,063 B2 | 12/2003 | Hunter et al. | |
| 6,677,222 B1 | 1/2004 | Mishima et al. | |
| 6,698,944 B2 | 3/2004 | Fujita | |
| 6,700,096 B2 | 3/2004 | Yamazaki et al. | |
| 6,727,125 B2 | 4/2004 | Adachi et al. | |
| 6,759,628 B1 | 7/2004 | Ino et al. | |
| 6,764,886 B2 | 7/2004 | Yamazaki et al. | |
| 6,797,550 B2 * | 9/2004 | Kokubo et al. | 438/164 |
| 6,822,263 B2 | 11/2004 | Satou et al. | |
| 6,830,617 B1 | 12/2004 | Ohtani et al. | |
| 6,863,733 B1 | 3/2005 | Tanabe | |
| 6,893,987 B2 | 5/2005 | Shiota et al. | |
| 6,979,605 B2 * | 12/2005 | Yamazaki et al. | 438/166 |
| 7,279,372 B2 * | 10/2007 | Yamazaki et al. | 438/487 |
| 2001/0000243 A1 | 4/2001 | Sugano et al. | |
| 2001/0019861 A1 | 9/2001 | Yamazaki et al. | |
| 2001/0038127 A1 | 11/2001 | Yamazaki et al. | |
| 2001/0055830 A1 | 12/2001 | Yoshimoto | |
| 2002/0045288 A1 | 4/2002 | Yamazaki et al. | |
| 2002/0054231 A1 | 5/2002 | Masuyuki | |
| 2002/0068391 A1 | 6/2002 | Jung | |
| 2002/0094008 A1 | 7/2002 | Tanaka | |
| 2002/0096680 A1 | 7/2002 | Sugano et al. | |
| 2002/0100937 A1 | 8/2002 | Yamazaki et al. | |

| | | | |
|---|---|---|---|
| 2002/0119609 A1 | 8/2002 | Hatano et al. | |
| 2002/0145711 A1 | 10/2002 | Magome et al. | |
| 2002/0146873 A1 | 10/2002 | Tanaka | |
| 2003/0024905 A1 | 2/2003 | Tanaka | |
| 2003/0047732 A1 | 3/2003 | Yamazaki et al. | |
| 2003/0059990 A1 | 3/2003 | Yamzaki | |
| 2003/0075733 A1 | 4/2003 | Yamazaki et al. | |
| 2003/0089691 A1 | 5/2003 | Tanaka | |
| 2003/0089907 A1 | 5/2003 | Yamaguchi et al. | |
| 2003/0104682 A1* | 6/2003 | Hara et al. | 438/487 |
| 2003/0112322 A1 | 6/2003 | Tanaka | |
| 2003/0136772 A1 | 7/2003 | Yamazaki et al. | |
| 2003/0148594 A1 | 8/2003 | Yamzuki et al. | |
| 2003/0153182 A1 | 8/2003 | Yamazaki et al. | |
| 2003/0153999 A1 | 8/2003 | Miyanaga et al. | |
| 2003/0166315 A1* | 9/2003 | Tanada et al. | 438/166 |
| 2003/0171837 A1 | 9/2003 | Yamazaki et al. | |
| 2003/0211714 A1 | 11/2003 | Yamazaki et al. | |
| 2003/0215973 A1 | 11/2003 | Yamazaki et al. | |
| 2003/0228723 A1 | 12/2003 | Yamazaki et al. | |
| 2003/0234395 A1 | 12/2003 | Kokubo et al. | |
| 2003/0235971 A1 | 12/2003 | Yamazaki et al. | |
| 2004/0040938 A1 | 3/2004 | Yamazaki et al. | |
| 2004/0053450 A1 | 3/2004 | Sposili et al. | |
| 2004/0053480 A1 | 3/2004 | Tanabe et al. | |
| 2004/0060515 A1 | 4/2004 | Tanabe et al. | |
| 2004/0106237 A1 | 6/2004 | Yamazaki | |
| 2004/0132266 A1 | 7/2004 | Yamazaki et al. | |
| 2005/0009251 A1 | 1/2005 | Yamazaki et al. | |
| 2005/0037554 A1 | 2/2005 | Ohtani et al. | |

FOREIGN PATENT DOCUMENTS

| | | |
|---|---|---|
| EP | 0 488 801 B1 | 6/1992 |
| EP | 0 646 950 A2 | 4/1995 |
| EP | 1049144 A1 | 11/2000 |
| GB | 2 354 111 A | 3/2001 |
| JP | 59-165450 | 9/1984 |
| JP | 59-205761 | 11/1984 |
| JP | 60-161396 A | 8/1985 |
| JP | 60-245172 | 12/1985 |
| JP | 60-245173 | 12/1985 |
| JP | 60-245174 | 12/1985 |
| JP | 61-048976 | 3/1986 |
| JP | 61-071636 | 4/1986 |
| JP | 61-085868 | 5/1986 |
| JP | 61-251115 | 11/1986 |
| JP | 62-104117 A | 5/1987 |
| JP | 63-142807 | 6/1988 |
| JP | 01-134345 | 5/1989 |
| JP | 01-154124 | 6/1989 |
| JP | 01-194351 | 8/1989 |
| JP | 02-140915 | 5/1990 |
| JP | 02-181419 A | 7/1990 |
| JP | 04-170067 | 6/1992 |
| JP | 04-206970 | 7/1992 |
| JP | 04-282869 | 10/1992 |
| JP | 04-313272 | 11/1992 |
| JP | 05-067785 | 3/1993 |
| JP | 05-090589 | 4/1993 |
| JP | 05-206464 | 8/1993 |
| JP | 05-315278 | 11/1993 |
| JP | 06-163401 | 6/1994 |
| JP | 07-130652 A | 5/1995 |
| JP | 07-183540 | 7/1995 |
| JP | 07-193247 | 7/1995 |
| JP | 07-326769 | 12/1995 |
| JP | 08-078329 A | 3/1996 |
| JP | 08-195357 A | 7/1996 |
| JP | 09-219380 | 8/1997 |
| JP | 09-253879 | 9/1997 |
| JP | 09-270393 | 10/1997 |
| JP | 09-289321 | 11/1997 |
| JP | 10-135468 A | 5/1998 |
| JP | 10-135469 A | 5/1998 |
| JP | 11-354463 | 12/1999 |
| JP | 2000-068520 | 3/2000 |
| JP | 2001-102373 | 4/2001 |
| JP | 3221724 | 8/2001 |
| JP | 2003-229432 | 8/2003 |

OTHER PUBLICATIONS

Liu, G. et al.; Appl. Phys. Lett.; Polycrystalline Silicon Thin Film Transistors on Corning 7059 Glass Substrates Using Short Time, Low Temperature Processing; May 17, 1993; pp. 2554-2556; vol. 62, No. 20.

Liu, G. et al.; Appl. Phys. Lett.; Selective Area Crystallization of Amorphous Silicon Films By Low-Temperature Rapid Thermal Annealing; Aug. 14, 1989; pp. 660-662; vol. 55, No. 7.

Caune, S. et al.; Applied Surface Science; Combined CW Laser and Furnace Annealing of Amorphous Si and Ge in Contact with Some Metals; Jan. 1, 1989; pp. 597-604; vol. 36.

Takeuchi.F et al; IDMC 2002; Performace of Poly-Si TFT Using the CW Laser Lateral Crystallization (CLC); Jan. 1, 2002; pp. 73-76.

Hara, A. et al.; IEDM 2001; High Performance Poly-Si TFTs on a Glass By a Stable Scanning CW Laser Lateral Crystallization; pp. 747-750; Jan. 1, 2001.

Lee, J. et al.; IEDM 94; ECR Plasma Oxidation Effects on Performance and Stability of Polysilicon Thin Film Transistors; pp. 523-526; Jan. 1, 1994.

Lee, J. et al.; IEEE Electron Device Letters; High Performance Low Temperature Polysilicon Thin Film Transistor Using ECR Plasma Thermal Oxide as Gate Insulator; Aug. 1, 1994; pp. 301-303; vol. 15, No. 8.

U.S. Appl. No. 10/882,343; filed Jul. 2, 2004; Shunpei Yamazaki "Manufacturing Methods of Semiconductor Device".

Li, T. et al.; IEEE Electron Device Letters; On the Pseudo-Subthreshold Characteristics of Polycrystalline-Silicon Thin-Film Transistors with Large Grain Size; May 1, 1993; pp. 240-242; vol. 14, No. 5.

Lin, P. et al.; IEEE Electron Device Letters; The Impact of Scaling-Down Oxide Thickness on Poly-Si Thin-Film Transistors' I-V Characteristics; Apr. 1, 1994; pp. 138-139; vol. 15, No. 4.

Kakkad, R. et al.; J. Appl. Phys.; Crystallized Si Films by Low-Temperature Rapid Thermal Annealing of Amorphous Silicon; Mar. 1, 1989; pp. 2069-2072; vol. 65.

Kakkad, R. et al.; Journal of Non-Crystalline Solids; Low Temperature Selective Crystallization of Amorphous Silicon; Aug. 1, 1989; pp. 66-68; vol. 115.

Hara, A. Et al.; JPN.J Appl. Phys.; High-Performance Polycrystalline Silicon Thin Film Taransistors on Non-Alkali Glass Produced Using Continuous Wave Laser Lateral Crystallization; Mar. 15, 2002; pp. L311-L313; vol. 41-Part 2; No. 3.

Dvurechenskii, A. et al.; Phys. Stat. Sol.; Transport Phenomena in Amorphous Silicon Doped By Ion Implantation of 3D Metals; Jan. 1, 1986; pp. 635-640; vol. 95.

Hempel, T. et al.; Solid State Communications; Needle-Like Crystallization of Ni Doped Amorphous Silicon Thin Films; Mar. 1, 1993; pp. 921-924; vol. 85, No. 11.

Appl. Phys. Lett. (vol. 64, No. 17; pp. 2303-2305), Apr. 25, 1994; IM. S/Kim. H. "On the Super Lateral Growth Phenomenon Observed in Excimer Laser-induced Crystallization of Thin Si Films".

Appl. Phys. Lett. (vol. 69/No. 19; pp. 2864-2866), Nov. 4, 1996; Sposili R. et al. "Sequential Lateral Solidification of Thin Silicon Films on SiO2".

AM-LCD '01 "Performance of poly-Si TFTs fabricated by a Stable Scanning CW Laser Crystallization" F. Takeuchi et al. pp. 251-254.

AM-LCD '01 "Ultra-high Performance Poly-Si TFTs on a Glass by a Stable Scanning CW Laser Lateral Crystallization" Akito Hara et al. pp. 227-230.

U.S. Appl. No. 10/279,960, filed Oct. 25, 2002 "Laser apparatus, Laser Irradiation Method, Manufaturing Method for Semiconductor Device, Semiconductor Device, Production System for Semiconductor Device Using the Laser Apparatus" (Specification, Claims and Drawings).

Kakkad, R. et al.; J. Appl. Phys.; Crystallized Si Films by Low-Temperature Rapid Thermal Annealing of Amorphous Silicon; Mar. 1, 1989; pp. 2069-2072; vol. 65, No. 5.

Dvurechenskii, A. et al.; Phys. Stat. Sol. (A); Transport Phenomena in Amorphous Silicon Doped By Ion Implantation of 3D Metals; Jan. 1, 1986; pp. 635-640; vol. 95.

* cited by examiner

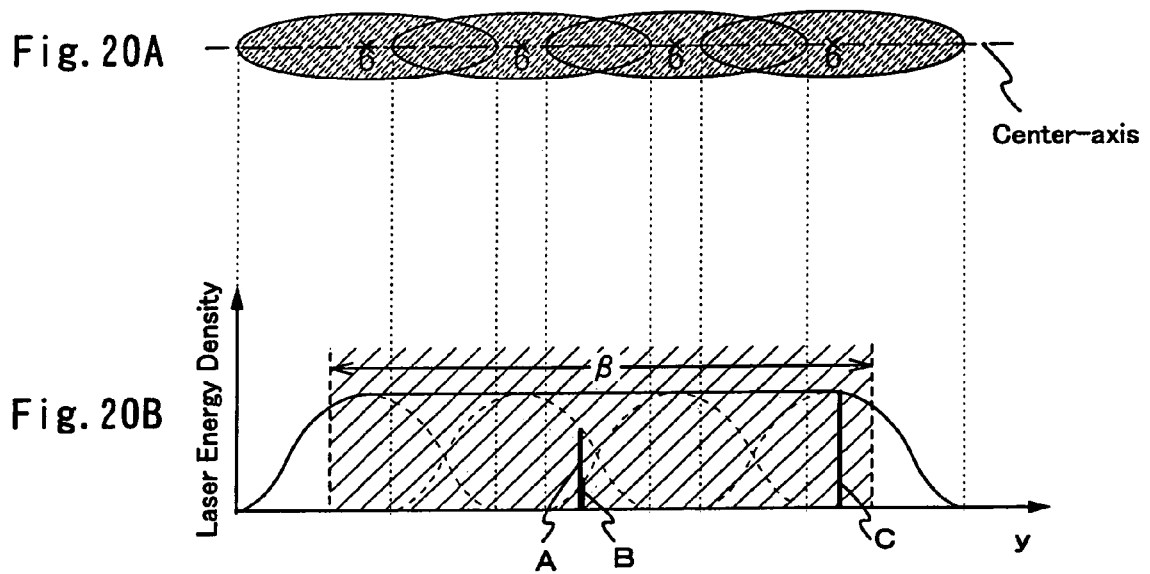

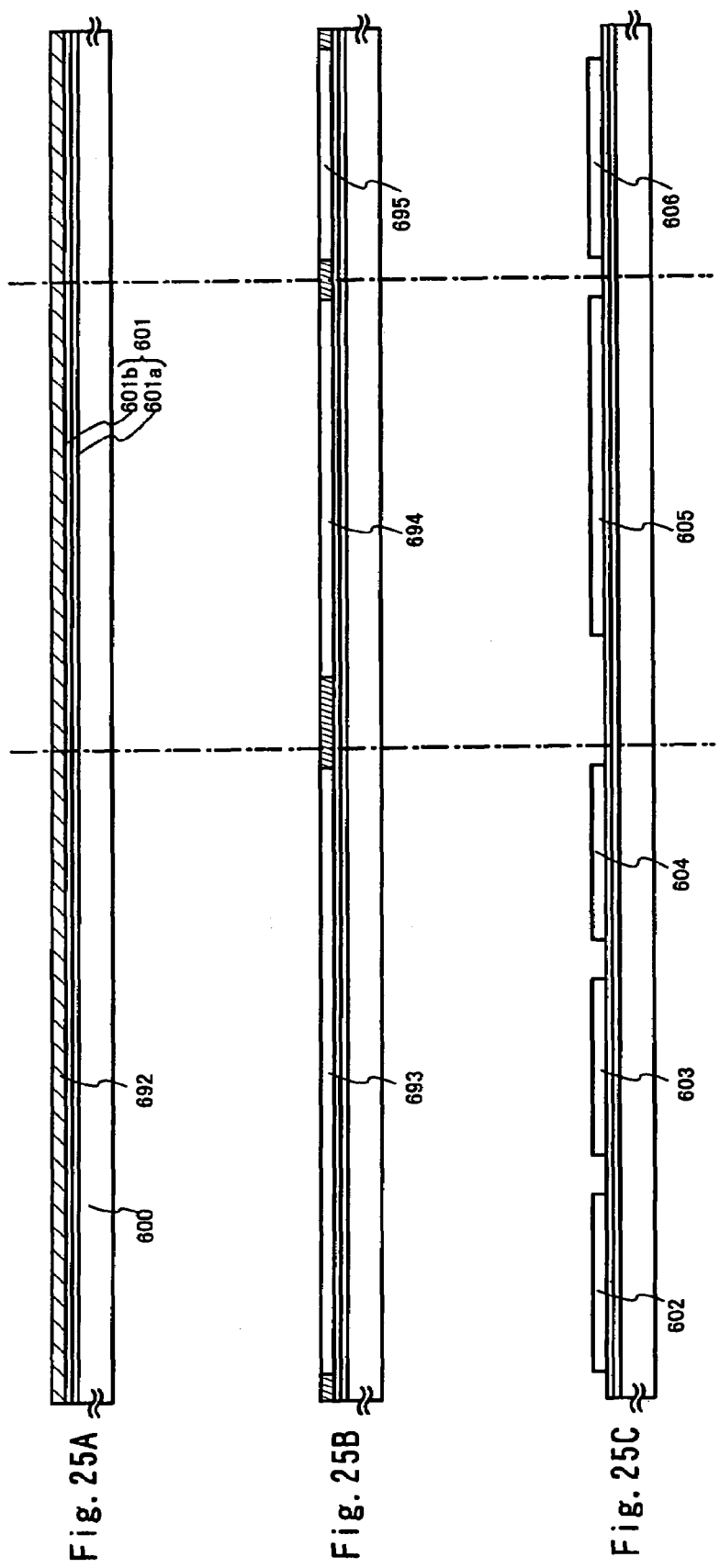

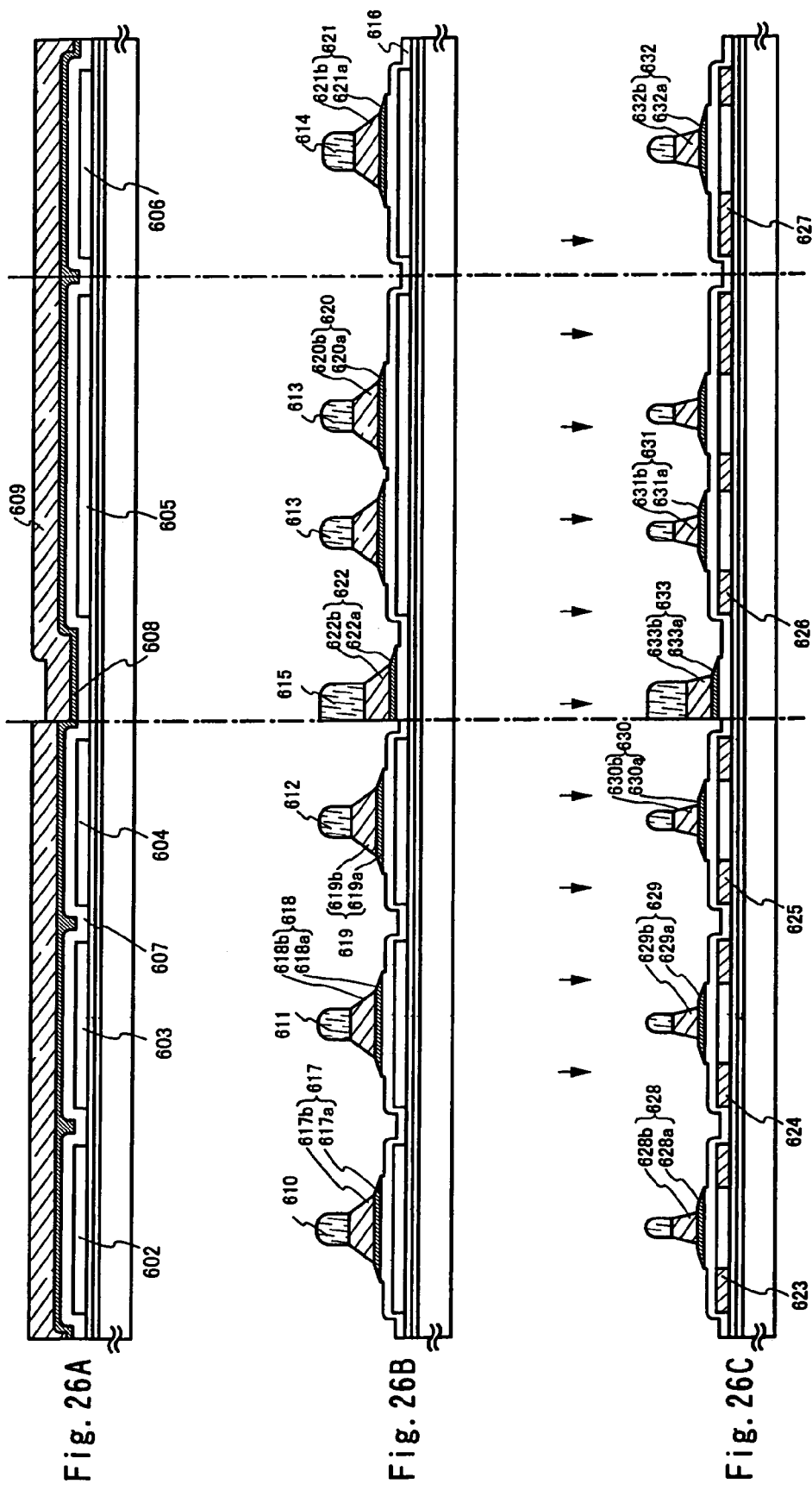

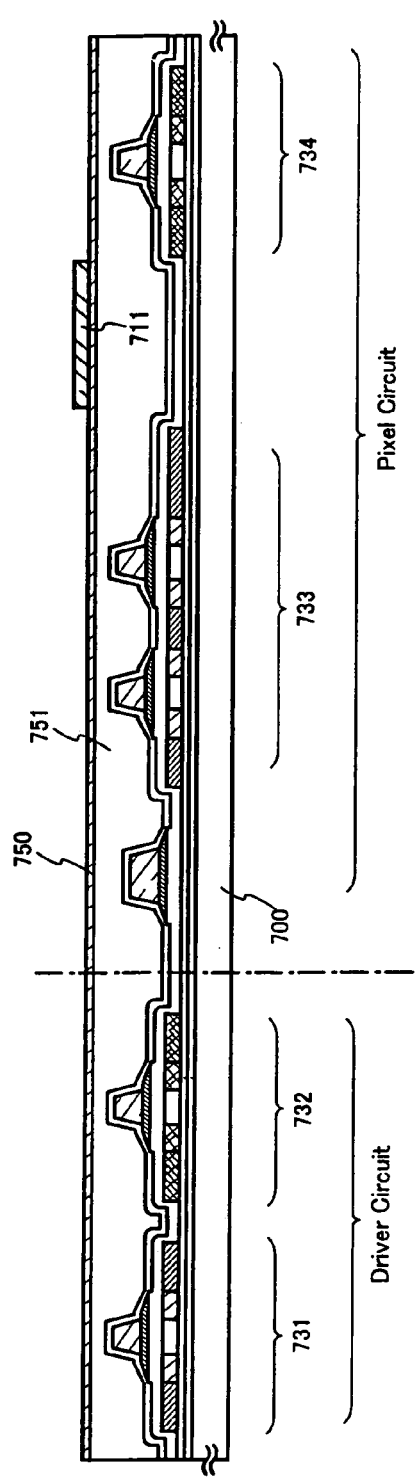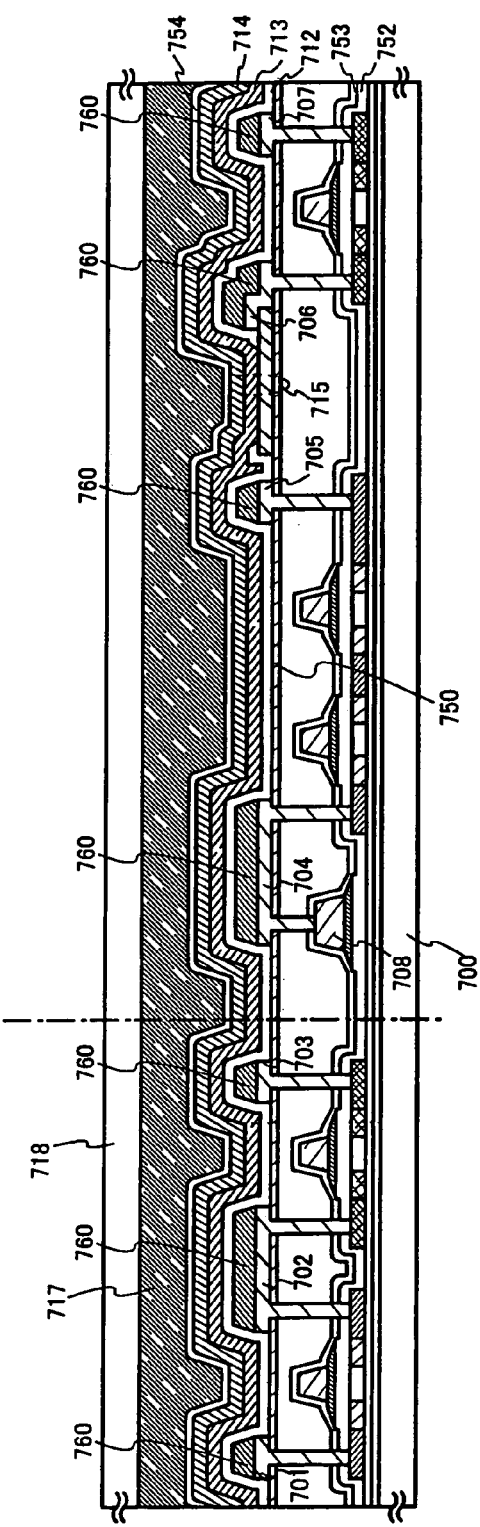
Fig. 30A
Fig. 30B

SEMICONDUCTOR FABRICATING APPARATUS

BACKGROUND OF THE INVENTION

1. Field of the Invention

The present invention relates to a semiconductor fabricating device of a multi-chamber method equipped with a laser apparatus performing a crystallization or an activation after an ion injection of a semiconductor film using a laser beam.

2. Description of the Related Art

In recent years, a technique of forming a TFT on a substrate has greatly progressed, and its application and development for active matrix semiconductor display device has been advanced. In particular, since a TFT using a polycrystalline semiconductor film has higher field-effect mobility than a TFT using a conventional amorphous silicon film, it enables high speed operation. Therefore, although the pixel is conventionally controlled on a driving circuit provided outside the substrate, it is possible to control the pixel on the driving circuit formed on the same substrate.

Incidentally, as the substrate used in the semiconductor device, a glass substrate is regarded as important in comparison with a single crystal silicon substrate in terms of the cost. Since a glass substrate is inferior in heat resistance and is susceptible to heat-deformation, in the case where a polysilicon TFT is formed on the glass substrate, laser annealing is used for crystallization of the semiconductor film in order to avoid heat-deformation of the glass substrate.

Characteristics of laser annealing are as follows: it can greatly reduce a processing time in comparison with an annealing method using radiation heating or conductive heating; and it hardly causes thermal damage to the substrate by selectively and locally heating a semiconductor or the semiconductor film.

Note that the laser annealing method here indicates a technique of recrystallizing the damaged layer formed on the semiconductor substrate or the semiconductor film, and a technique of crystallizing the amorphous semiconductor film formed on the substrate. Also, the laser annealing method here includes a technique applied to leveling or surface reforming of the semiconductor substrate or the semiconductor film. A laser oscillation apparatus applied is a gas laser oscillation apparatus represented by an excimer laser or a solid laser oscillation apparatus represented by a YAG laser. It is known as the apparatus which performs crystallization by heating a surface layer of the semiconductor by irradiation of the laser beam in an extremely short period of time of about several ten nanoseconds to several hundred microseconds.

Lasers are roughly divided into two types: pulse oscillation and continuous oscillation, according to an oscillation method. In the pulse oscillation laser, an output energy is relatively high, so that mass productivity can be increased assuming the size of a beam spot to be several $cm^2$ or more. In particular, when the shape of the beam spot is processed using an optical system and made to be a linear shape of 10 cm or more in length, it is possible to efficiently perform irradiation of the laser beam to the substrate and further enhance the mass productivity. Therefore, for crystallization of the semiconductor film, the use of a pulse oscillation laser is becoming mainstream.

However, in recent years, in crystallization of the semiconductor film, it is found that grain size of the crystal formed in the semiconductor film is larger in the case where the continuous oscillation laser is used than the case where the pulse oscillation laser is used. When the crystal grain size in the semiconductor film becomes large, the mobility of the TFT formed using the semiconductor film becomes high and variation of the TFT characteristics due to a grain boundary is suppressed. Therefore, a continuous oscillation laser is recently attracting attention.

However, since the maximum output energy of the continuous oscillation laser is generally small in comparison with that of the pulse oscillation laser, the size of the beam spot is small, which is about $10^{-3}$ $mm^2$. Accordingly, in order to treat one large substrate, it is necessary to move a beam irradiation position on the substrate upward and downward, and right and left, it results in increasing the processing time per one substrate. Thus, processing efficiency is poor and it is an important object to improve the processing speed of the substrate.

SUMMARY OF THE INVENTION

The present invention has been made in view of the above problems, and therefore it is an object of the present invention to provide a semiconductor fabricating device using the laser crystallizing method, which can enhance a processing efficiency of a substrate and the mobility of a semiconductor film in comparison with the conventional example.

The invention relates to a semiconductor fabricating apparatus of multi-chamber system comprising a film formation equipment for forming a semiconductor film and a laser irradiation equipment. The laser irradiation equipment provided at the semiconductor fabricating apparatus of the invention comprises first means for controlling a laser irradiation position relative to an irradiation object, second means for emitting laser light (laser oscillator), third means for processing the laser light (optical system), and fourth means for controlling the oscillation of the second means as well as for controlling the first means in a manner to apply a beam spot of the laser light processed by the third means to a predetermined place based on data indicative of a mask configuration (pattern information).

The place defined based on the mask data means a portion of a semiconductor film that is obtained by patterning following the crystallization of the semiconductor film. According to the invention, the fourth means determines from the mask the portion of the semiconductor film that is left on the substrate after patterning, the semiconductor film overlaid on an insulating layer. Subsequently, the fourth means defines an area to be scanned with the laser light such that at least the portion obtained by patterning may be crystallized, and then controls the first means for applying the beam spot to the area to be scanned thereby partially crystallizing the semiconductor film. According to the invention, the laser light is scanned on at least the minimum prerequisite area for crystallization rather than on the overall surface of the semiconductor film. The above arrangement obviates time required for irradiating the laser light on a part removed by the patterning following the crystallization of the semiconductor film.

For implementing the above arrangement, the invention provides a step for forming a marker on the semiconductor film by means of the laser light, the step performed between the formation of the semiconductor film and the crystallization by the laser light. Then, the area to be scanned with the laser light is defined based on the mask using the marker as reference.

Incidentally, an alternative procedure may be taken which includes patterning the insulating film formed over the substrate, forming the marker, and then forming the semiconductor film.

According to the invention as described above, the laser scanning and irradiation is not performed on the overall surface of the semiconductor film but at least on the minimum prerequisite area for crystallization. The above arrangement obviates the time spent for irradiating the laser light on the part to be removed by patterning following the crystallization of the semiconductor film. This result in the reduction of time required for the laser irradiation as well as in the speedup of the processing of the substrate.

It is noted that the laser irradiation may be performed twice. In this case, the two laser irradiation processes may be performed as follows. In order to crystallize at least a portion to be obtained by patterning, an area to be scanned with a first laser light is defined. The first means is so controlled as to apply the beam spot to the scanning area thereby locally crystallizing the semiconductor film. Subsequently, the scanning direction is changed by controlling the first means. An area to be scanned with a second laser light is so defined as to crystallize at least the portion to be obtained by patterning. Then, the second laser light is irradiated on the area thus defined. At this time, an angle between the scanning direction of the first laser light and that of the second laser light is most preferably as close to 90° as possible.

Some of the crystal grains formed by the irradiation of the first laser light grow into a single crystal grain of a larger size due to the irradiation of the second laser light in the different scanning direction. This is because the crystal grains grown in a given direction due to the irradiation of the first laser light act as seeds, which grow along the different direction from the above given direction as a result of the irradiation of the second laser light. Accordingly, the two laser irradiation processes in the different scanning directions provide a semiconductor film locally enhanced in crystallinity. A portion of the semiconductor film that has an even higher crystallinity may be used for forming an active layer of a TFT and thus, the TFT having an enhanced mobility may be obtained.

By adopting the multi-chamber system, the semiconductor fabricating apparatus of the invention may be arranged such that after the formation of the semiconductor film in the film formation equipment, the substrate is transported to the laser irradiation equipment without being exposed to the atmosphere and then is irradiated with the laser light without being exposed to the atmosphere (for example, in an atmosphere of an inert gas such as rare gas, nitrogen or the like, or in vacuum), thereby to crystallize the semiconductor film formed thereon. The multi-chamber system includes a radial type wherein a plurality of processing chambers are disposed radially about the conveyance chamber and a linear type wherein a plurality of processing chambers are arranged in lines on laterally opposite sides with respect to the conveyance chamber. The semiconductor fabricating apparatus of multi-chamber system according to the invention may be of the radial type or of the linear type.

In addition, the apparatus of the invention can prevent the invasion of molecular contaminants present in the clean room into the semiconductor film being crystallized by laser irradiation, the contaminants including, for example, boron contained in a filter for increasing air cleanliness of the clean room.

The transistor of the invention may include a thin film transistor (TFT), single crystalline transistor, and a transistor using an organic substance. For instance, the single crystalline transistor may be formed using SOI technique. The thin film transistor may include a polycrystalline semiconductor or an amorphous semiconductor as the active layer. There may be formed, for instance, a TFT using polysilicon or a TFT using amorphous silicon.

BRIEF DESCRIPTION OF THE DRAWINGS

FIGS. 20A and 20B are diagram and graph showing a shape of a synthesized beam spot and an energy density distribution thereof;

FIGS. 25A to 25C are diagrams showing a method for fabricating a semiconductor device using the semiconductor fabricating apparatus of the invention;

FIGS. 26A to 26C are diagrams showing the method for fabricating the semiconductor device using the semiconductor fabricating apparatus of the invention;

FIGS. 30A and 30B are diagrams showing a method for fabricating a light emitting device using the semiconductor fabricating apparatus of the invention;

DESCRIPTION OF THE PREFERRED EMBODIMENTS

An arrangement of a semiconductor fabricating apparatus of multi-chamber system according to the invention will hereinbelow be described with reference to FIG. 1.

Figure 1:
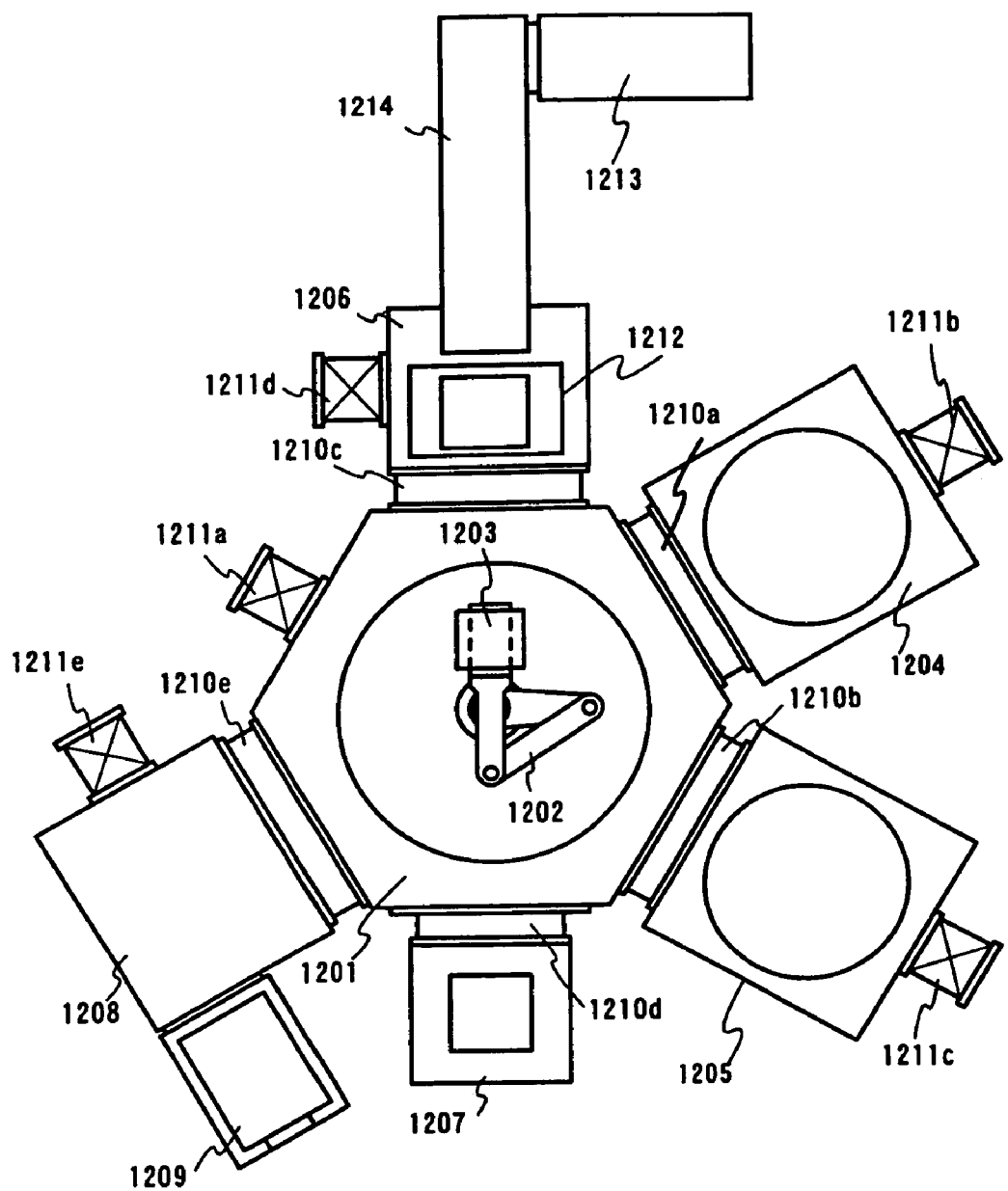
FIG. 1 is a diagram showing an arrangement of a semiconductor fabricating apparatus of multi-chamber system according to the invention.

Referring to FIG. 1, a reference numeral 1201 denotes a conveyance chamber which is provided with conveyance means 1202. A plurality of processing chambers are disposed radially about the conveyance chamber 1201. FIG. 1 illustrates the processing chambers which include a vapor phase film formation chamber(A) 1204, a vapor phase film formation chamber(B) 1205, a laser irradiation chamber 1206 and a pre-processing chamber 1207. A reference numeral 1208 denotes a stock chamber, also referred to as load lock chamber, where a substrate delivered from a delivery chamber 1209 is set (loaded) on the conveyance means 1202. It is noted that the stock chamber 1208 may be divided into a substrate delivery section and a substrate discharge section.

Although FIG. 1 illustrates, as the processing chambers, the vapor phase film formation chambers (A) 1204 and (B) 1205 for forming a semiconductor film using the vapor phase growth method, the invention is not limited to this arrangement. The processings performed in the processing chambers may properly be changed depending upon the film formation methods. Additionally, there may be provided a laser irradiation chamber for forming a marker.

The conveyance chamber 1201 is maintained in an atmosphere of inert gas or vacuum and hence, each connection between the conveyance chamber 1201 and the vapor phase film formation chamber(A) 1204, vapor phase film formation chamber(B) 1205, laser irradiation chamber 1206, pre-processing chamber 1207 or stock chamber 1208 is blocked by means of a corresponding gate (valve) 1210a, 1210b, 1210c, 1210d or 1210e. The conveyance of a substrate 1203 between the conveyance chamber 1201 and any one of the processing chambers or the stock chamber 1208 is performed by the conveyance means 1202 via the corresponding gate 1210a to 1210e.

The conveyance chamber 1201 is provided with an exhaust port 1211a, through which the air in the conveyance chamber is exhausted by means of a vacuum exhaust system. The processing chambers and the stock chamber 1208 are also provided with an exhaust port, respectively. As shown in FIG. 1, the vapor phase film formation chamber(A) 1204, vapor phase film formation chamber(B) 1205, laser irradiation chamber 1206 and stock chamber 1208 are also provided with exhaust ports 1211b to 1211e, respectively. However, the exhaust ports need not be provided at all of the processing chambers. The semiconductor fabricating apparatus of the invention only need to provide the abilities to form a semiconductor film on the substrate in the atmosphere of vacuum at a pressure on the order of $10^{-3}$ torr, for example, or of inert gas; to convey the substrate to the laser irradiation chamber without exposing the substrate to the atmosphere; and to irradiate the formed semiconductor film with laser light in the vacuum or inert gas atmosphere. In addition to the exhaust ports, there may also be provided a purge line for introduction of a high-purity inert gas.

Figure 2:
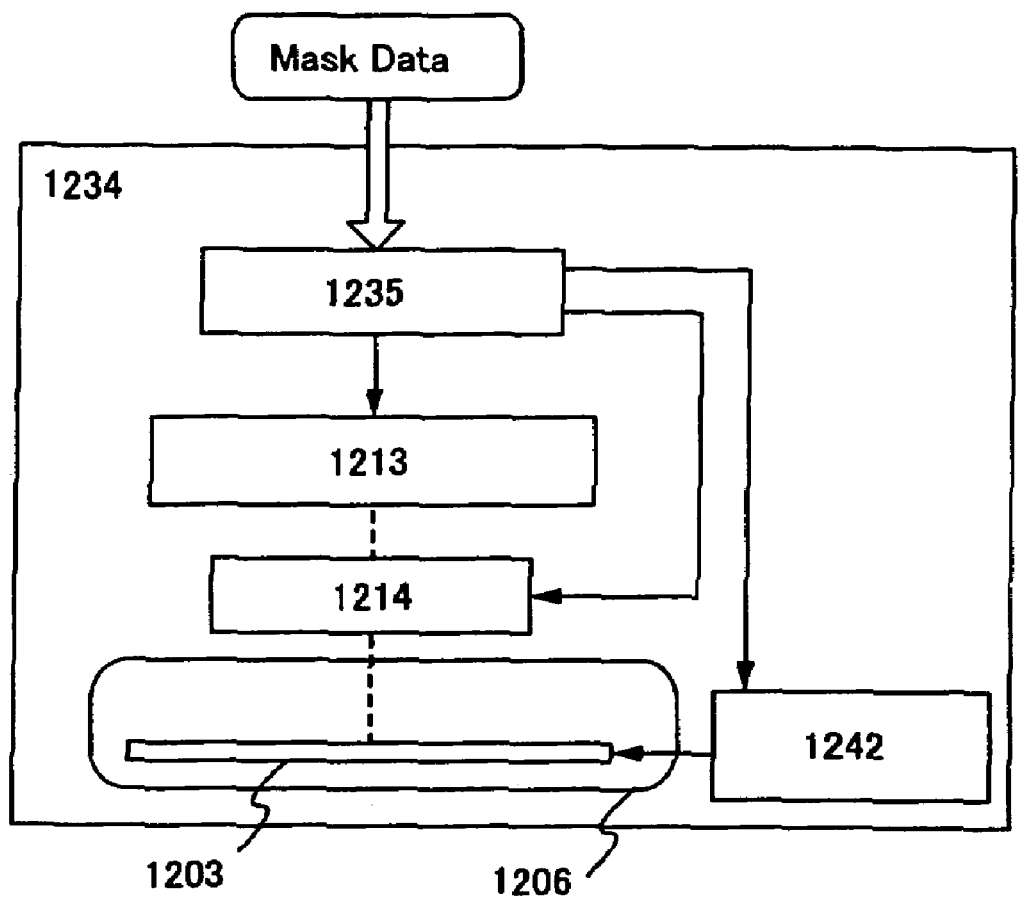
FIG. 2 is a block diagram showing an arrangement of a laser irradiation equipment.

A laser irradiation equipment included in the semiconductor fabrication apparatus of the invention includes the laser irradiation chamber 1206 for shielding the substrate from the atmosphere; position control means 1242 for carrying thereon the substrate and controlling the position thereof; a laser oscillator 1213; an optical system 1214; and a computer (CPU) performing dual duty as a central processing unit and as storage means such as a memory. FIG. 2 is a block diagram showing an arrangement of the laser irradiation equipment provided at the semiconductor fabricating apparatus of the invention.

The position control means 1242 of the laser irradiation equipment 1234 is equivalent to first means for controlling a laser irradiation position relative to an irradiation object. Although the arrangement shown in FIG. 2 is made such that the position control means is used to change the position of the substrate thereby moving (scanning) the laser radiation position or changing the scanning direction of the laser light, the invention is not limited to this arrangement. Alternatively, the optical system may be used to change the irradiation direction of the laser light. In this case, the position control means may be construed as being included in the optical system.

The laser oscillator 1213 of the laser irradiation equipment 1234 is equivalent to second means for emitting the laser light. Although FIG. 2 illustrates an example where one laser oscillator 1213 is provided, the number of laser oscillators 1213 included in the laser irradiation equipment 1234 is not limited to one. Beam spots of respective laser beams from laser oscillators may be superpositioned on each other to form a single beam spot.

The laser may properly be changed according to the purpose of a processing. The invention may employ any one of known lasers. Usable lasers include gas lasers and solid-state lasers of pulse oscillation type or of continuous wave type. Examples of a usable gas laser include an excimer laser, an Ar laser, a Kr laser and the like. Examples of a usable solid-state laser include a YAG laser, a YVO$_4$ laser, a YLF laser, a YAlO$_3$ laser, a glass laser, a ruby laser, an alexandrite laser, a Ti:sapphire laser, a Y$_2$O$_3$ laser and the like. The solid-state laser may use crystals such as YAG, YVO$_4$, YLF, YAlO$_3$ or the like which are doped with Cr, Nd, Er, Ho, Ce, Co, Ti, Yb or Tm. Such lasers provide laser light having a fundamental wave at a wavelength on the order of 1 µm, which may vary depending upon a material used for doping. Higher harmonics relative to the fundamental wave can be obtained by means of a non-linear optical device.

Alternatively, a UV laser light may also be used, which is obtained by converting an infrared laser light from the solid-state laser into a green laser light by means of a non-linear optical device, followed by subjecting the green laser light to another non-linear optical device.

In addition to the aforesaid four means, the laser irradiation equipment may further include means for regulating the temperature of the irradiation object.

The optical system 1214 of the laser irradiation equipment 1234 is equivalent to third means capable of processing the beam spot formed on the substrate by the laser light emitted from the laser oscillator 1213.

The shape of the beam spot formed on the substrate 1203 by the laser light emitted from the laser oscillator 1213 varies depending upon the type of a laser. The beam spot may also be shaped by means of an optical system. For instance, XeCl excimer L3308 commercially available from Lambda Inc. (wavelength: 308 nm, pulse width: 30 ns) emits a laser beam of a rectangular shape having a size of 10 mm×30 mm (half widths in beam profile). A YAG laser having a cylindrical rod emits a circular laser beam whereas a YAG laser having a slab-shaped rod emits a rectangular laser beam. A laser beam of a desired size may be produced by further shaping such a laser beam by means of the optical system.

In a case where a plurality of laser oscillators are employed, the aforesaid optical system may be used to superposition the beam spots outputted from the individual laser oscillators on each another, thereby forming a single beam spot.

A computer 1235 of the laser irradiation equipment 1234 is equivalent to fourth means. The computer 1235 controls the oscillation of the laser oscillator 1213 and also controls the position control means 1242, as the first means, so as to set the substrate to a predetermined position such that the beam spot of the laser light may cover a place determined based on mask data.

Figure 3:
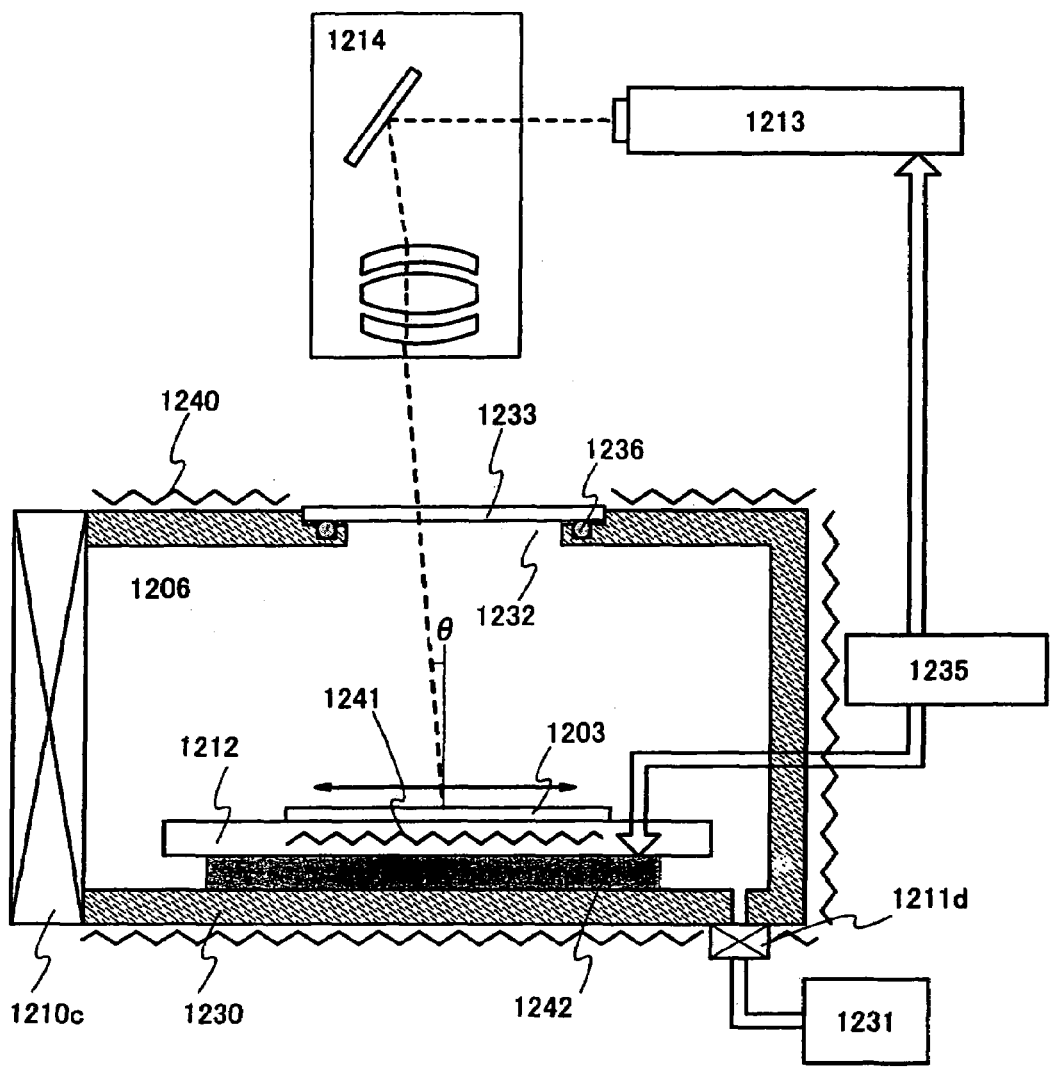
FIG. 3 is a diagram showing an arrangement of a laser irradiation chamber.

FIG. 3 shows a specific arrangement of the laser irradiation chamber 1206. The laser irradiation chamber 1206 is enclosed by a barrier shield 1230. Since the laser light has high directivity and high energy density, it is preferred that the barrier shield has a property of absorbing reflective light such that the barrier shield 1230 may not reflect the laser light to an unwanted area. Incidentally, provision may be made for circulating a cooling water through the barrier shield such that the barrier shield may not be raised in temperature due to the absorption of the reflective light.

As shown in FIG. 3, the barrier shield may be provided with means for heating the barrier shield (barrier shield heating means) 1240 when the air is exhausted from the laser irradiation chamber.

The opening or closure of the connection between the laser irradiation chamber 1206 and the conveyance chamber 1201 is controlled by the gate 1210c. The laser irradiation chamber 1206 can be maintained in the vacuum atmosphere by means of an exhaust system 1231 connected to the exhaust port 1211d. The laser irradiation chamber may further include a purge line for introducing an inert gas, in addition to the exhaust port 1211d.

A reference numeral 1212 denotes a stage, on which the substrate 1203 is placed. The position control means 1242 is adapted to control the position of the substrate by moving the substrate, thereby moving an irradiation point of the laser light. As shown in FIG. 3, the stage 1212 may be provided with means for heating the substrate (substrate heating means) 1241.

An aperture 1232 disposed in the barrier shield 1230 is covered by a window transparent to the laser light (transparent window) 1233. The transparent window 1233 may preferably be formed from a material less absorptive of the laser light, such as crystal or the like. Disposed between the transparent window 1233 and the barrier shield 1230 is a gasket 1236 which prevents the invasion of air into the laser irradiation chamber via a clearance between the transparent window 1233 and the barrier shield 1230.

First, a substrate having a semiconductor film formed thereon in another processing chamber is delivered to the conveyance chamber 1201 by means of the conveyance means 1202. The substrate is placed under the vacuum or inert gas atmosphere during a period between the formation of the semiconductor film and the completion of laser irradiation. Subsequently, the gate 1210c to the laser irradiation chamber 1206 is opened.

When the gate 1210c is opened, the laser irradiation chamber 1206 and conveyance chamber 1201 are both maintained in the same vacuum or inert gas atmosphere. Subsequently, the gate 1210c is opened while the conveyance means 1202 transports the substrate 1203 from the conveyance chamber 1201 into the laser irradiation chamber 1206 and then places the substrate on the stage 1212. In this case, the laser irradiation chamber 1206 may be provided with another conveyance means for placing the substrate 1202, so delivered by the conveyance means 1202, upon the stage 1212.

After the closure of the gate 1210c, the laser light emitted from the laser oscillator 1213 is subjected to the optical system 1214 for shaping the beam spot thereof and then is irradiated on the substrate 1203. An incidence angle θ of the laser light may preferably be greater than 0°, or more preferably in the range of 5° to 30° from the standpoint of preventing return light and of effecting uniform light irradiation.

After completion of the laser irradiation, the gate 1210c is opened again so that the substrate is transported to the conveyance chamber 1203 by means of the conveyance means 1203.

The multi-chamber system may include a processing chamber for performing a processing on the semiconductor film crystallized by the laser light. For instance, such a chamber may be a chamber for etching the semiconductor film, or a laser irradiation chamber using a different laser.

Figure 4A:
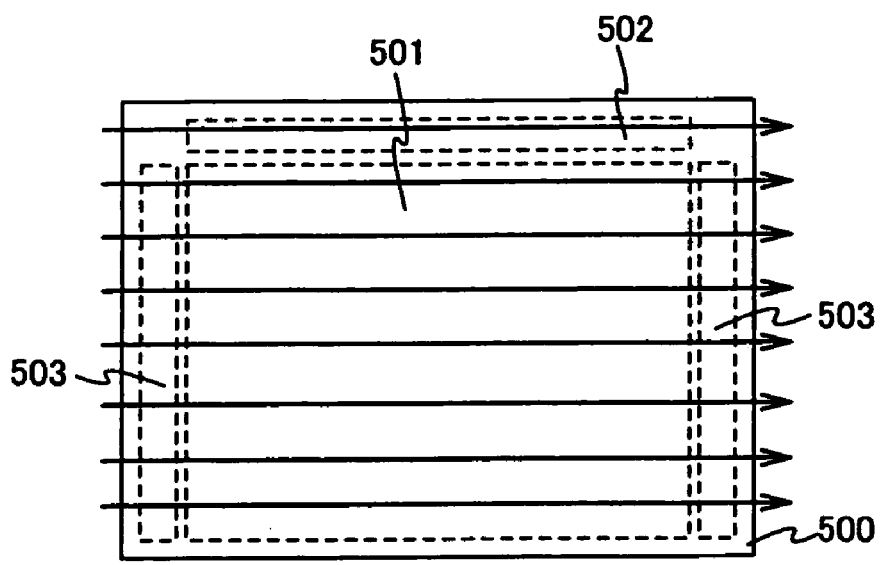
FIGS. 4A and 4B are diagrams showing a movement direction of laser light on an irradiation object.

Now referring to FIG. 4A, description is made on a direction in which the laser light is scanned to irradiate a semiconductor film 500 formed for the fabrication of an active matrix type semiconductor device. In FIG. 4A, a broken line 501 defines an area forming a pixel portion, a broken line 502 defining an area forming a signal line drive circuit, a broken line 503 defining an area forming a scanning line drive circuit.

Figure 4B:
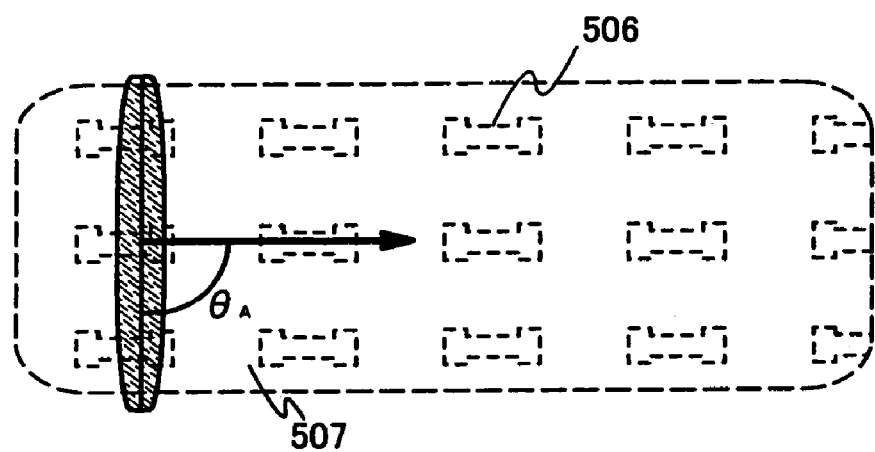

FIG. 4A illustrates an example where an area forming an active layer is subjected to just a single scanning of the laser light. An arrow in the figure indicates a scanning direction of the laser light. FIG. 4B is an enlarged view showing a beam spot 507 on the area 501 where the pixel portion is formed. The active layer is formed on the area irradiated with the laser light.

Figure 5A:
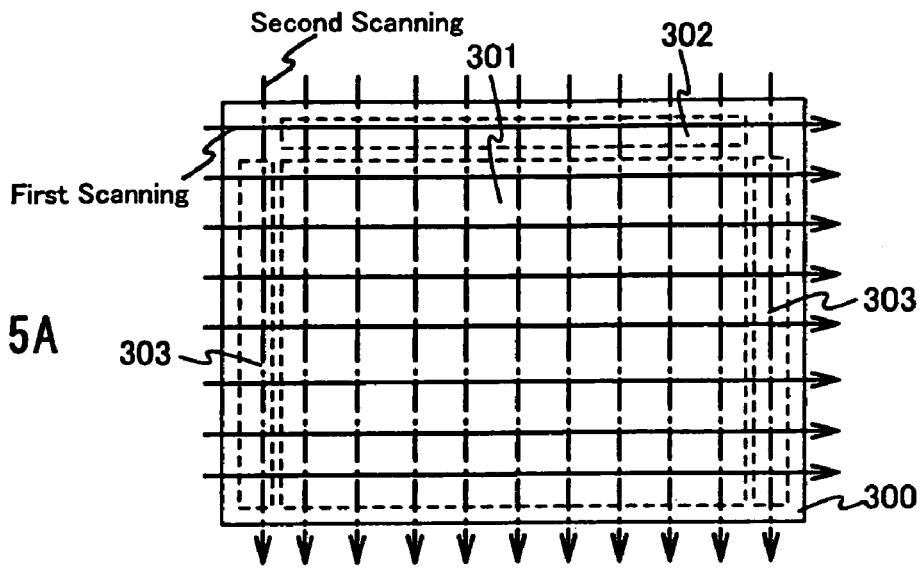
FIGS. 5A to 5C are diagrams showing a movement direction of laser light on an irradiation object.

Next, referring to FIG. 5A, description is made on scanning directions of the laser light when a semiconductor film 300 is scanned twice with the laser light along different scanning directions. In FIG. 5A, a broken line 301 defines an area forming a pixel portion, a broken line 302 defining an area forming a signal line drive circuit, a broken line 303 defining an area forming a scanning line drive circuit.

In FIG. 5A, an arrow indicates a scanning direction of the laser light. Referring to FIG. 5A, the semiconductor film is irradiated with two laser lights of different scanning directions, an arrowy solid line indicating the scanning direction of the first laser light, an arrowy broken line indicating the scanning direction of the second laser light. The active layer is formed at an intersection of the first laser light and the second laser light.

Figure 5B:
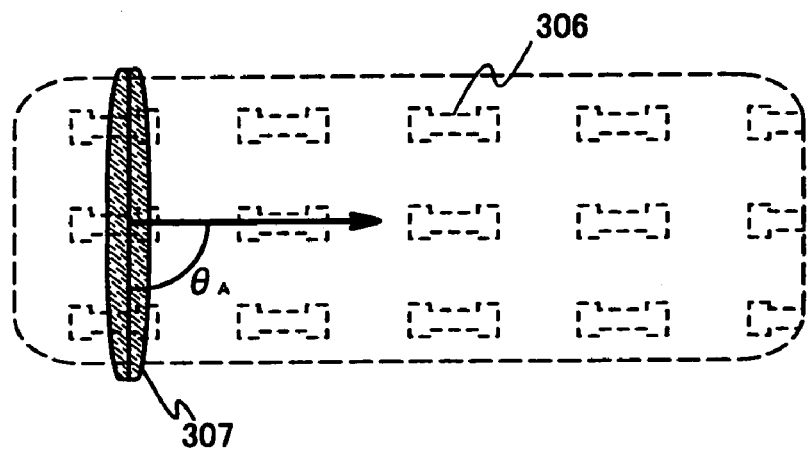
Figure 5C:
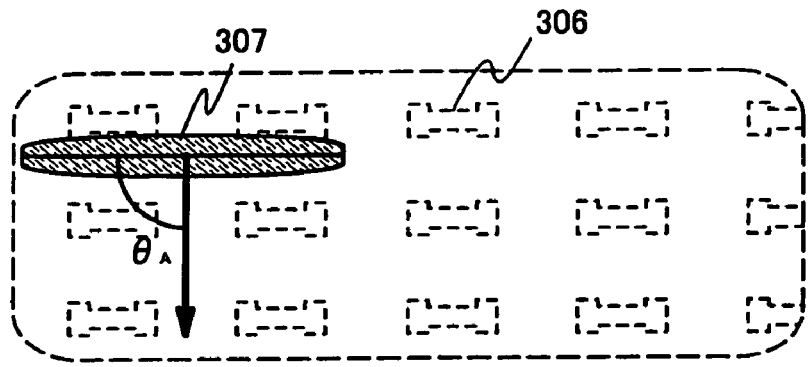

FIG. 5B is an enlarged view showing a beam spot 307 used in the first scanning process, whereas FIG. 5C is an enlarged view showing the beam spot 307 used in the second scanning process. Although FIG. 5 shows that the scanning direction of the first laser light intersects the scanning direction of the second laser light substantially at an angle of 90°, the intersection angle is not limited to this. However, the closer to 90° the intersection angle, the closer to 1 the ratio between a vertical length and a horizontal length of a crystal grain formed in the area where the laser lights intersect with each other. This leads to the correspondingly easier design of the active layer.

In FIGS. 4A and 4B and 5A to 5C, a center axis of the beam spot may be orthogonal to the scanning direction or may not (specifically, an acute angle $\theta_A$ between the center axis of the beam spot and the scanning direction is in the range of 45°±35° or more preferably at 45°). In a case where the center axis of the beam spot is orthogonal to the scanning direction, the substrate may be processed at the highest efficiency. On the other hand, if the scanning is performed in a scanning direction at an angle of 45°±35° or more preferably at 45° relative to the center axis of the synthesized beam spot, the resultant active layer contains a greater number of crystal grains than the case where the scanning is performed in a scanning direction orthogonal to the center axis of the beam spot. Thus, the active layer is reduced in characteristic variations associated with crystal orientations or crystal grains.

The laser light generally exhibits a lower energy density at an edge of the beam spot than at the other portion thereof and hence, there may be a case where the irradiation object is not uniformly processed. Therefore, it is desirable to irradiate the laser light in a manner that an edge of a path of the laser light does not overlap a portion defining a semiconductor film island obtained by patterning a crystallized semiconductor film (indicated at 506 in FIG. 4B and at 306 in FIGS. 5B and 5C)

Although FIG. 5A shows that the pixel portion 301, signal line drive circuit 302 and scanning line drive circuit 303 are all scanned twice with the laser light, the arrangement of the invention is not limited to this.

According to the invention, an area to be scanned with the laser light is defined based on a patterning mask on the semiconductor film, the patterning mask inputted to the computer 1235. It is noted that the area to be scanned with the laser light is so defined as to cover a portion obtained by patterning the crystallized semiconductor film. The computer 1235 defines the area to be scanned with the laser light such that at least the portion of the semiconductor film that is obtained by patterning may be crystallized, and controls the position control means 1242, as the first means, such that the beam spot or the irradiation point may be applied to the area to be scanned for locally crystallizing the semiconductor film.

Figure 7A:
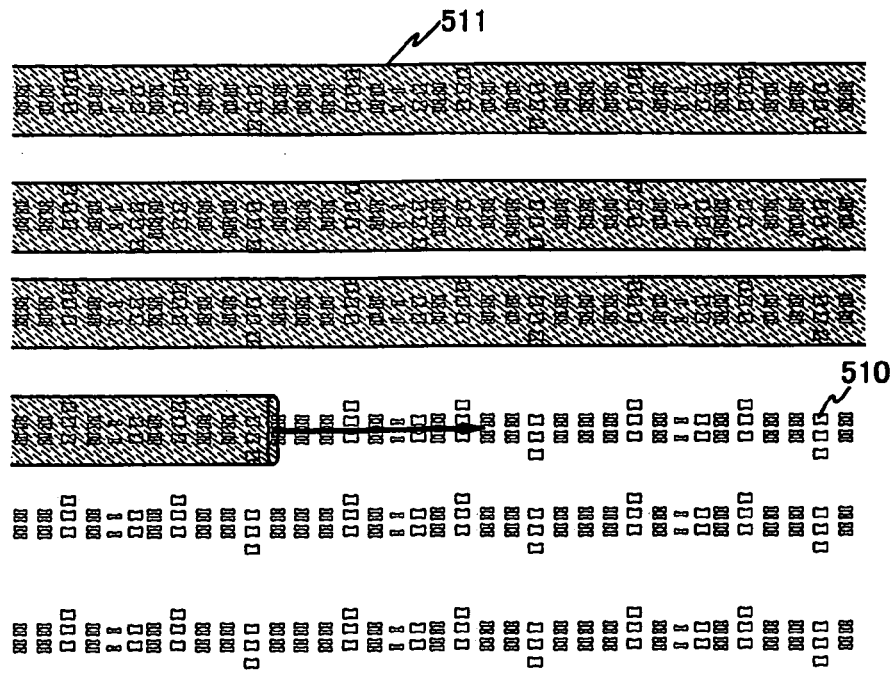
FIGS. 7A and 7B are diagrams showing a positional relation between an area irradiated with the laser light and masks.
Figure 7B:
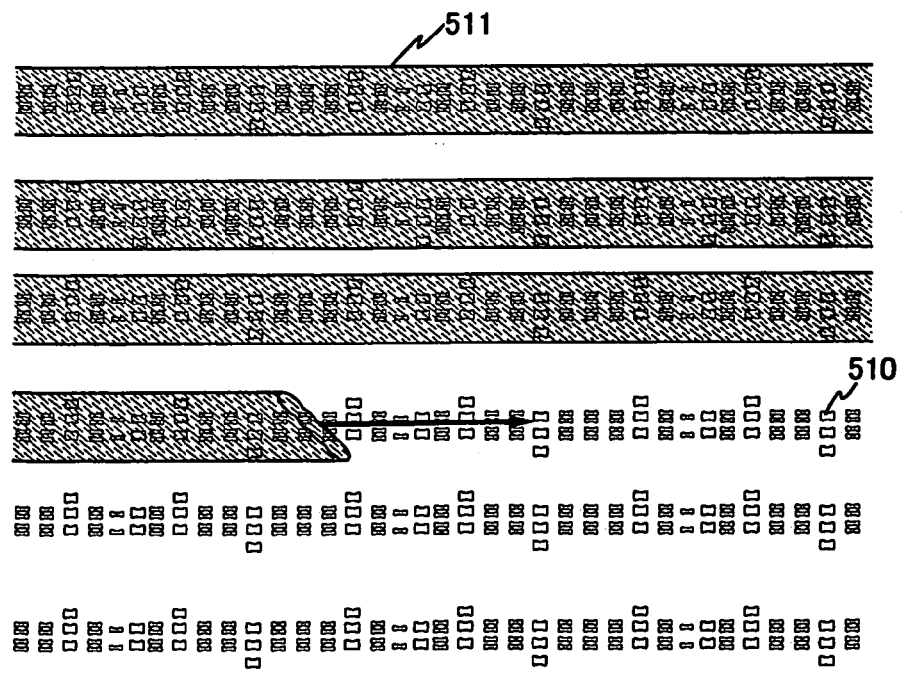

FIG. 7A shows a relation between an area to be scanned with the laser light and a mask when a single laser irradiation is performed. It is noted that the center axis of the beam spot is substantially orthogonal to the scanning direction in FIG. 7A. FIG. 7B shows a relation between an area to be scanned with the laser light and a mask in a case where the center axis of the beam spot is at an angle of 45° relative to the scanning direction. A reference numeral 510 denotes a semiconductor film island obtained by patterning a semiconductor film. The area to be scanned with the laser light is so defined as to cover these semiconductor film islands 510. A reference numeral 511 denotes the area to be scanned with the laser light, the area covering the semiconductor film islands 510. As shown in FIGS. 7A and 7B, the invention is arranged such that instead of irradiating the laser light on the overall surface of the semiconductor film, at least the minimum prerequisite area is scanned with the laser light for crystallization.

In a case where the crystallized semiconductor film is used as an active layer of a TFT, it is preferred to define the scanning direction of the laser light in parallel with a direction of carrier movement in a channel forming region.

Figure 8A:
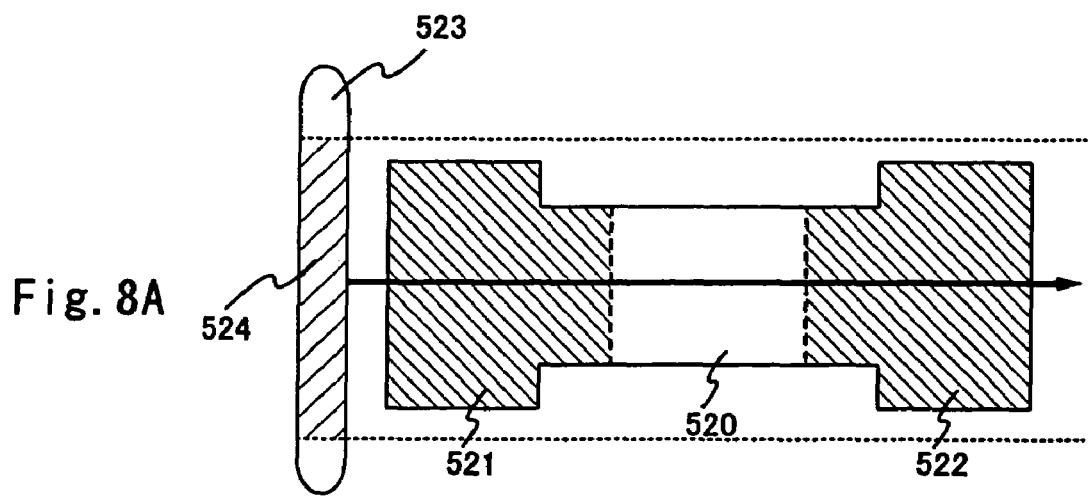
FIGS. 8A and 8B are diagrams showing a movement direction of the laser light on an active layer of a TFT.
Figure 8B:
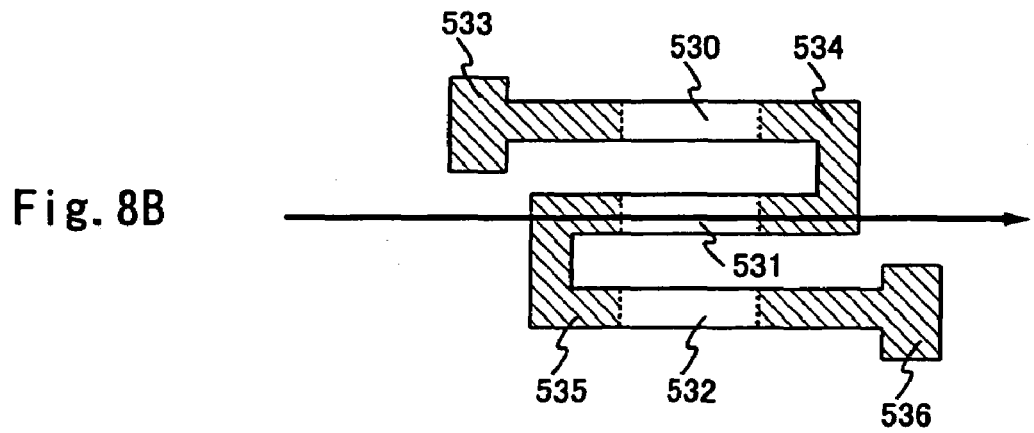

FIGS. 8A and 8B show exemplary layouts of the active layer of a TFT in the case of a single laser irradiation process. FIG. 8A illustrates an active layer including a single channel forming region and having a structure wherein a channel forming region 520 is sandwiched between impurity regions 521, 522 forming a source region and a drain region. When a semiconductor film is crystallized by means of the laser irradiation equipment provided at the semiconductor fabricating apparatus of the invention, a scanning direction of the laser light is defined to be in parallel with the direction of carrier movement in the channel forming region, as indicated by an arrow in the figure. A reference numeral 523 denotes a shape of a beam spot, a hatched region 524 of which has energy densities within a range required for achieving favorable crystals. The active layer may be further enhanced in the crystallinity thereof by irradiating the overall surface of the active layer with the hatched region 524 of the laser light.

FIG. 8B illustrates an active layer including three channel forming regions, and having a structure wherein impurity regions 533, 544 are formed in a manner to sandwich a channel forming region 530 therebetween. In the active layer, another channel forming region 531 is sandwiched between impurity regions 534, 535, and still another channel forming region 532 is sandwiched between impurity regions 535, 536. When a semiconductor film is crystallized by means of the laser irradiation equipment provided at the semiconductor fabricating apparatus of the invention, a scanning direction of the laser light is defined to be in parallel with the direction of carrier movement in the channel forming regions, as indicated by an arrow in the figure. In FIGS. 8A and 8B, the scanning with the beam spot may be performed by moving the substrate, by operating the optical system or by the combination of moving the substrate and operating the optical system.

Figure 9A:
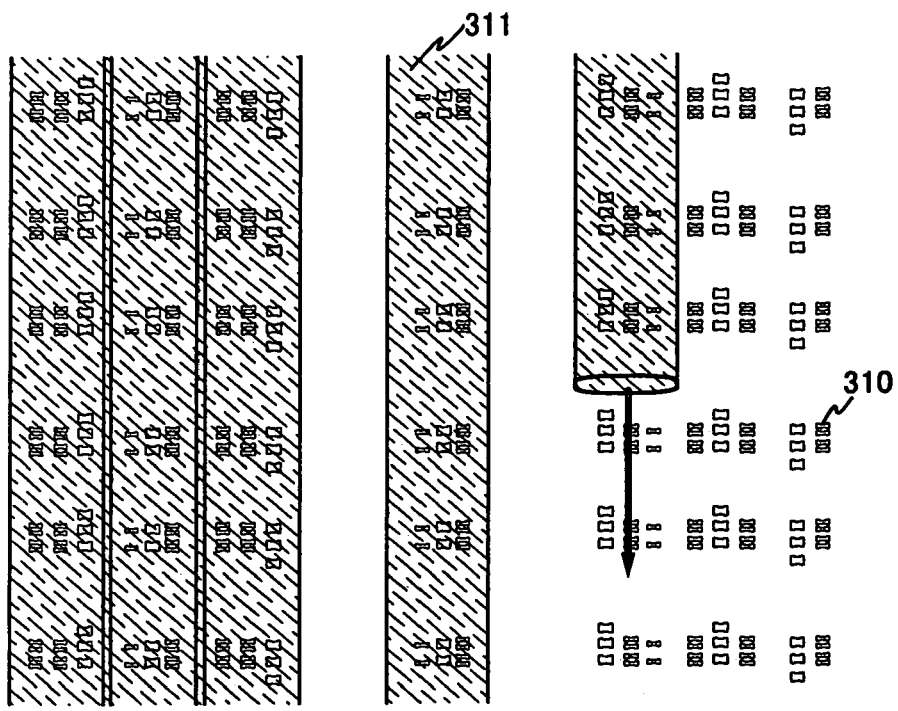
FIGS. 9A and 9B are diagrams showing a positional relation between an area irradiated with the laser light and masks.

Next, FIG. 9A shows a relation between an area to be scanned with a first laser light and a mask in a case where two laser light irradiation processes are performed. In FIG. 9A, the center axis of the beam spot is substantially orthogonal to the scanning direction. A reference numeral 310 denotes a semiconductor film island obtained by patterning a semiconductor film. The area to be scanned with the laser light is so defined as to cover these semiconductor film islands 310. A reference numeral 311 denotes the area to be scanned with the laser light, the area covering the semiconductor film islands 310. As shown in FIG. 9A, the invention is arranged such that the overall surface of the semiconductor film is not irradiated with the first laser light but at least the minimum prerequisite area for crystallization is scanned with the laser light.

Figure 9B:
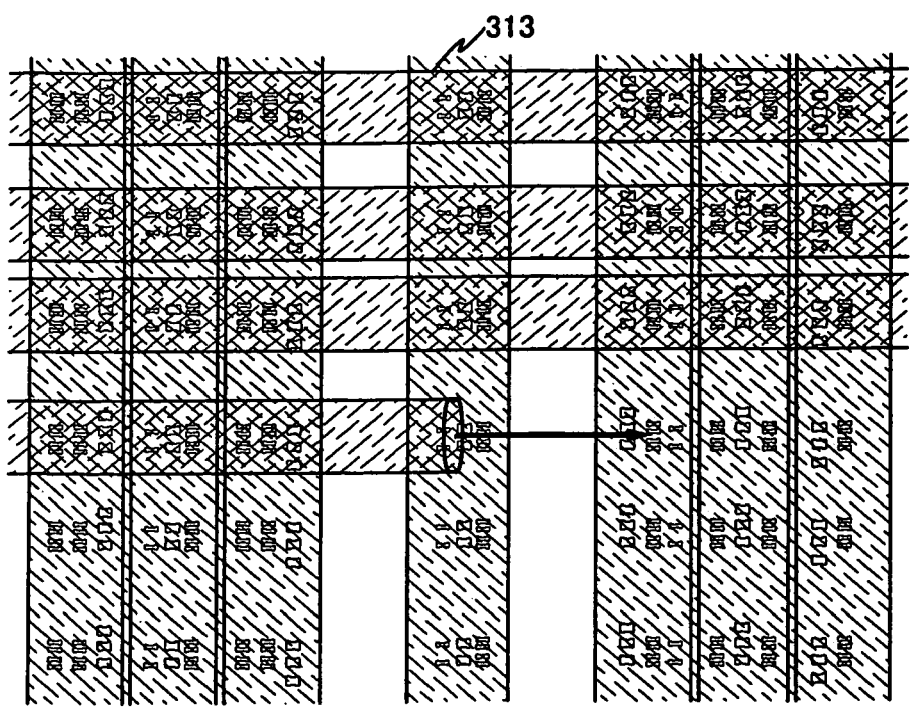

FIG. 9B shows a relation between an area to be scanned with the second laser light of the two laser irradiation processes and a mask when the semiconductor film of FIG. 9A is subjected to the second laser irradiation. In FIG. 9B, the scanning direction of the second laser light and that of the first laser light have a difference of 90° therebetween. An area to be scanned with the second laser light is also defined in a manner to cover the semiconductor film islands 310. A reference numeral 313 denotes the area to be scanned with the second laser light, the area covering the semiconductor film islands 310. As shown in FIG. 9B, the invention is arranged such that the overall surface of the semiconductor film is not irradiated with the second laser light but at least the minimum prerequisite area for crystallization is scanned with the laser light.

Thus, the semiconductor film islands 310 are further enhanced in the crystallinity thereof because they are subjected to the two laser irradiation processes of different scanning directions. In addition, a processing time for one substrate can be decreased because the laser light is irradiated exclusively on the minimum prerequisite area for crystallization that is defined by the mask on the semiconductor film, rather than on the overall surface of the substrate. Thus, the processing efficiency for substrate is increased.

Figure 10A:
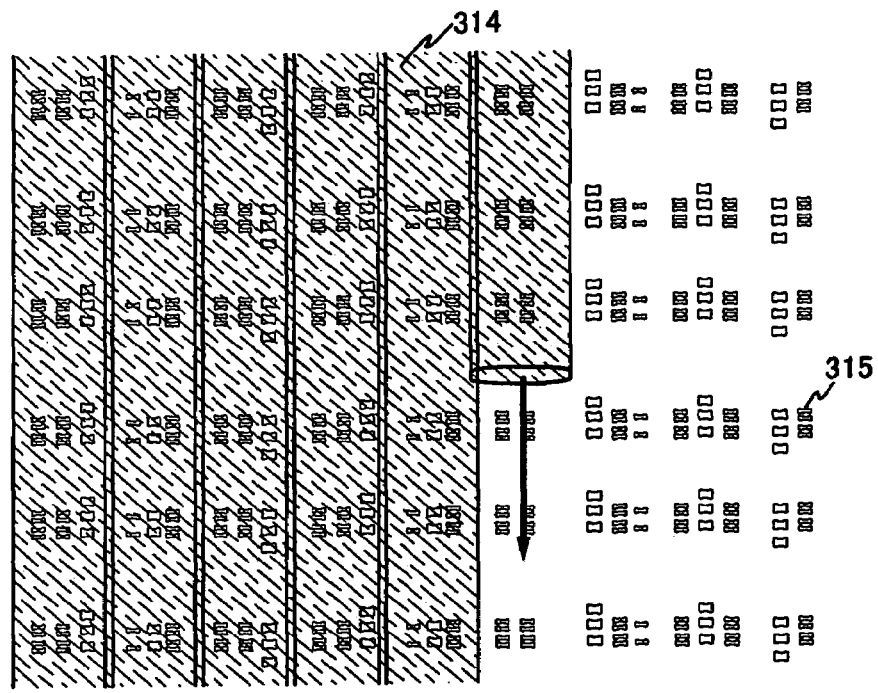
FIGS. 10A and 10B are diagrams showing a positional relation between an area irradiated with the laser light and masks.
Figure 10B:
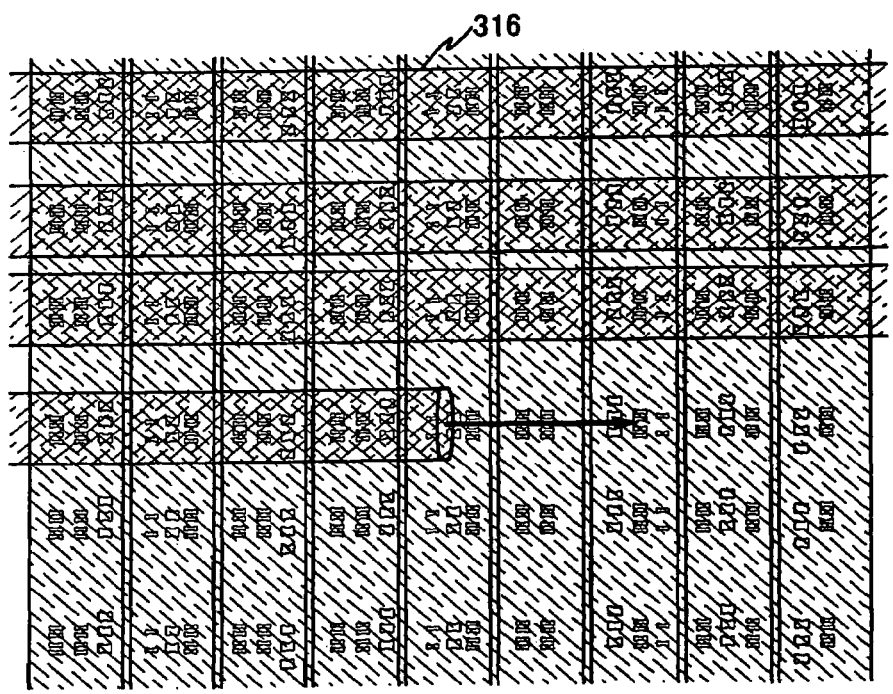

It is noted that FIGS. 9A and 9B illustrate the examples where both the first and second laser lights are locally irradiated on the minimum prerequisite area for crystallization that is defined by the mask on the semiconductor film, rather than irradiated on the overall surface of the semiconductor film. However, the invention is not limited to this arrangement and an alternative arrangement may be made such that the first laser light is irradiated on the overall surface of the semiconductor film whereas the second laser light is locally irradiated. Conversely, the first laser light may be locally irradiated whereas the second laser light may be irradiated on the overall surface of the substrate. FIG. 10A shows a state where the first laser light is irradiated on the overall surface of a semiconductor film, whereas FIG. 10B shows a state where the second laser light is irradiated on the semiconductor film of FIG. 10A. A reference numeral 314 denotes an area to be scanned with the first laser light, the area covering the overall surface of the semiconductor film. A reference numeral 315 denotes a semiconductor film island obtained by patterning the semiconductor film. The semiconductor film islands are so located as not to be overlapped by an edge of a scanning path of the first laser light. A reference numeral 316 denotes an area to be scanned with the second laser light, the area covering the semiconductor film islands 315 obtained by patterning. The second laser light is not irradiated on the overall surface of the semiconductor film but is locally irradiated for applying the laser light to at least the semiconductor film islands 315.

In a case where a crystallized semiconductor film is used as an active layer of a TFT, it is desirable that a scanning direction in either one of the two laser irradiation processes is defined to be in parallel with the direction of carrier movement in a channel forming region.

Figure 11A:
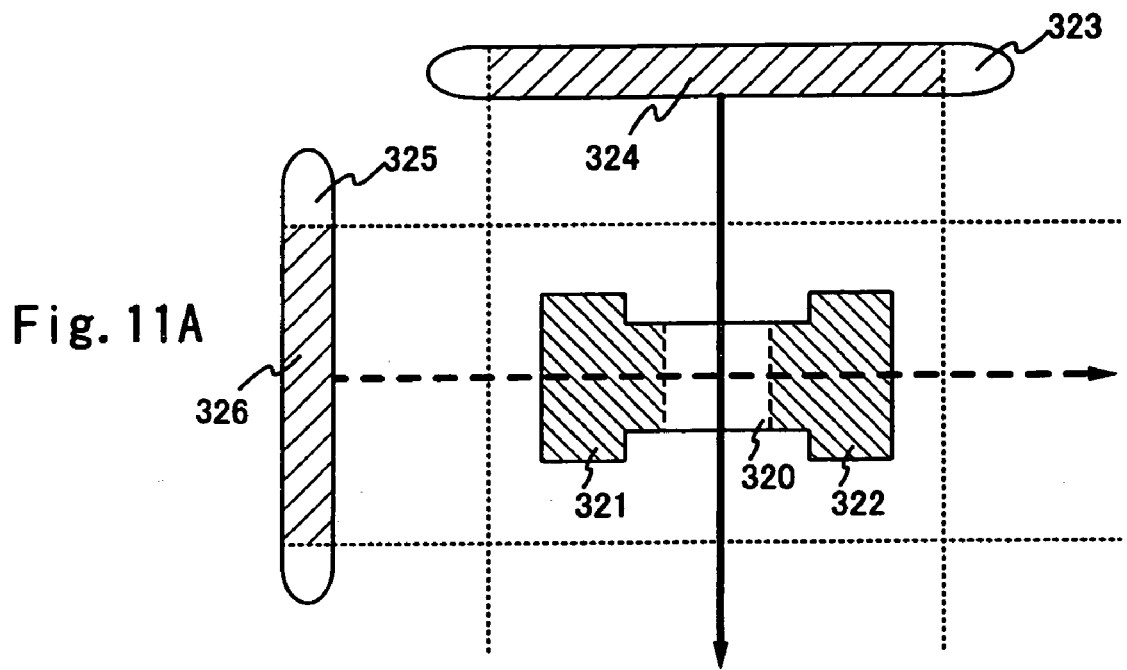
FIGS. 11A and 11B are diagrams showing a movement direction of the laser light on an active layer of a TFT.
Figure 11B:
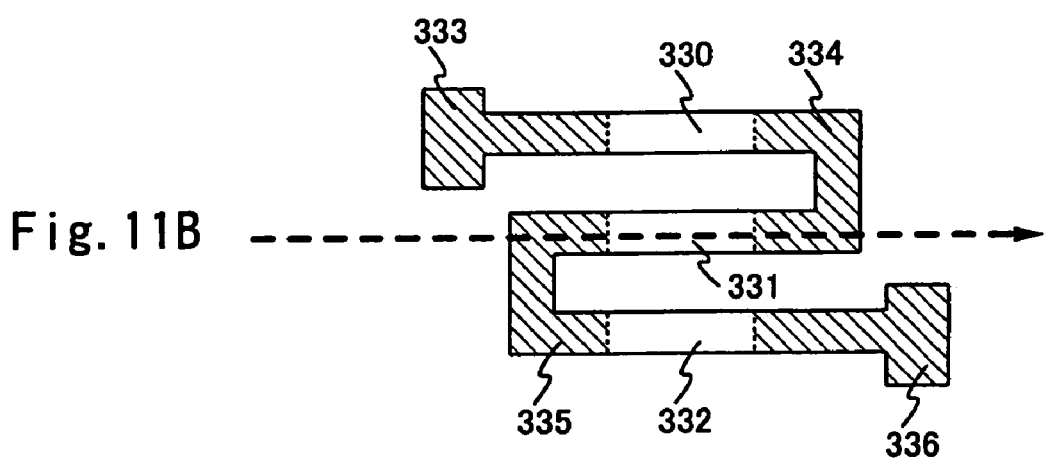

FIGS. 11A and 11B show examples of the active layer of the TFT. FIG. 11A illustrates an active layer including a single channel forming region and having a structure wherein a channel forming region 320 is sandwiched between impurity regions 321, 322 forming a source region and a drain region. When the semiconductor film is crystallized by means of the laser irradiation equipment provided at the semiconductor fabricating apparatus of the invention, a scanning direction of the first or second laser light is defined to be in parallel with the direction of carrier movement in the channel forming region, as indicated by an arrow in the figure. In FIGS. 11A and 11B, scanning with a beam spot may be performed by moving the substrate, by operating the optical system or by the combination of moving the substrate and operating the optical system.

A reference numeral 323 denotes a beam spot of the first laser light which is scanned along a direction indicated by an arrowy solid line in the figure. A hatched area 324 of the beam spot 323 has a sufficient energy density for achieving favorable crystals. The crystallinity of the active layer may be further enhanced by applying the hatched area 324 of the laser light to the whole active layer.

A reference numeral 325 denotes a beam spot of the second laser light which is scanned along a direction indicated by an arrowy broken line in the figure. A scanning direction of the second laser light is different from that of the first laser light shown in FIG. 11A. A hatched area 326 of the beam spot 325 has a sufficient energy density for achieving favorable crystals. The crystallinity of the active layer may be further enhanced by applying the hatched area 326 of the laser light to the whole active layer.

FIG. 11B illustrates the active layer including three channel forming regions and having a structure wherein a channel forming region 330 is sandwiched between impurity regions 333, 344. In the active layer, another channel forming region 331 is sandwiched between impurity regions 334, 335, and still another channel forming region 332 is sandwiched between impurity regions 335, 336. The first laser light is scanned along a direction of an arrowy solid line in the figure whereas the second laser light is scanned along a direction of an arrowy broken line. The scanning direction of the first or second laser light is defined to be in parallel with the direction of carrier movement in the channel forming regions.

Although either the first or second laser irradiation process may be arranged such that the scanning direction of the laser light is in parallel with the direction of carrier movement, it is more preferred that the direction is matched with the laser light having the greater energy density because a direction of crystal growth is more influenced by the laser light having the greater energy density.

Figure 12:
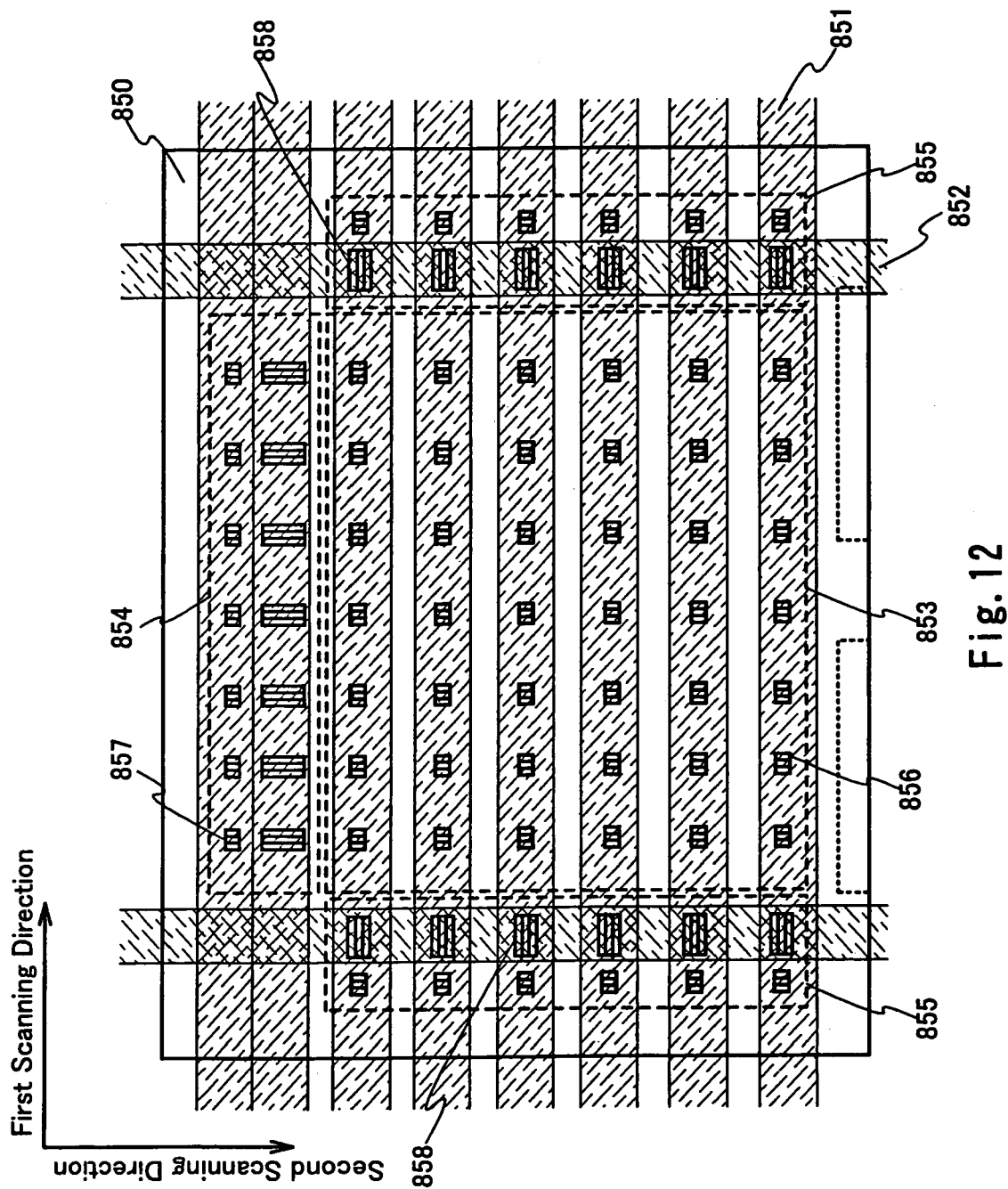
FIG. 12 is a group of diagrams showing a positional relation between an area irradiated with the laser light and mask for individual circuits.

Now, referring to FIG. 12, description is made on a relation between scanning directions of the laser lights on a semiconductor film subjected to two laser irradiation processes and an layout of active layers of circuits, the semiconductor film formed for fabricating an active matrix type semiconductor device.

FIG. 12 shows a semiconductor film 850 formed on a substrate. An area enclosed by a broken line 853 forms a pixel portion, the pixel portion 853 including a plurality of portions 856 forming active layers. An area enclosed by a broken line 854 forms a signal line drive circuit, the signal line drive circuit 854 including a plurality of portions 857 forming active layers. An area enclosed by a broken line 855 forms a scanning line drive circuit, the scanning line drive circuit 855 including a plurality of portions 858 forming active layers.

It is noted that the individual portions 856, 857, 858 forming the active layers included in the respective circuits are actually of a small size on the order of dozens μm. However, FIG. 12 shows these portions in a larger size than the true size in the interest of clarity. The portions 856, 857, 858 forming the active layers of the circuits are laid out in a manner that the directions of carrier movements in the channel forming regions are generally divided into two groups (a first direction and a second direction).

A reference numeral 851 denotes an area to be crystallized by the first laser irradiation, the area covering all the portions

856, 857, 858 forming the active layers. A scanning direction of the first laser light is defined to be in parallel with the first direction.

A reference numeral 852 denotes an area to be crystallized by the second laser light. A scanning direction of the second laser light is different from that of the first laser light, extending in parallel with the second direction. The second laser light does not cover all of the portions 856, 857, 858 forming the active layers but selectively covers the active layers wherein the carriers in the channel forming regions move in parallel with the second direction. In FIG. 12, the second laser light is irradiated exclusively on those of the plural active layers 858 that the carriers in the channel forming regions move in parallel with the scanning direction of the second laser light.

Figure 13A:
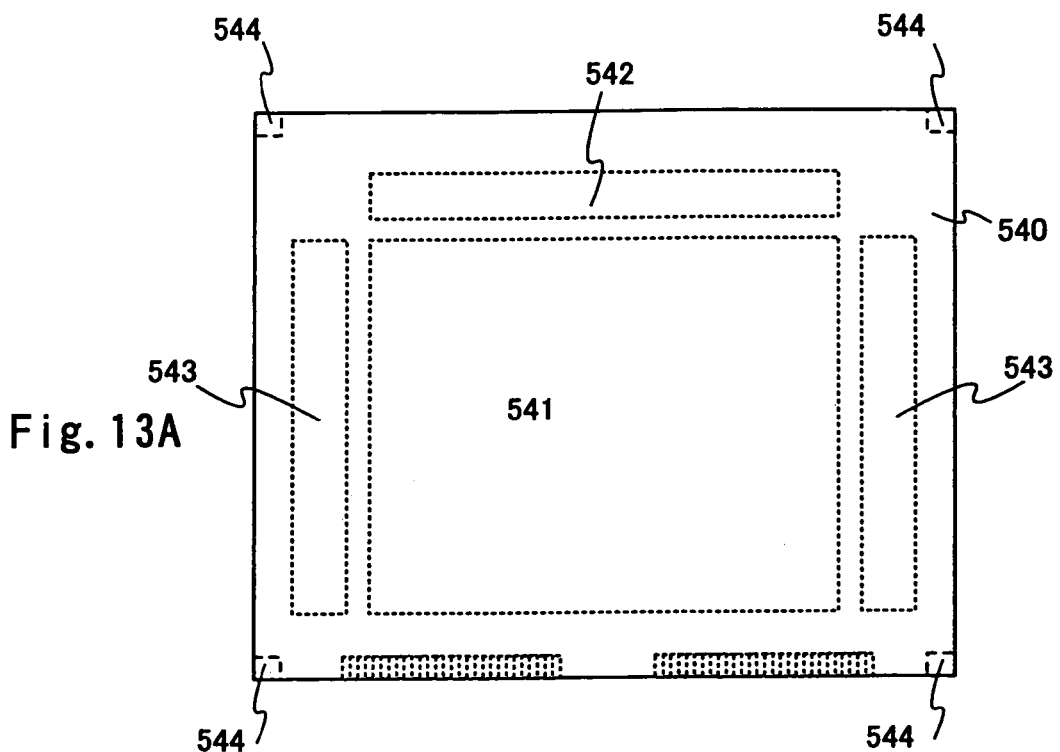
FIGS. 13A and 13B are diagrams each showing a position of a marker.
Figure 13B:
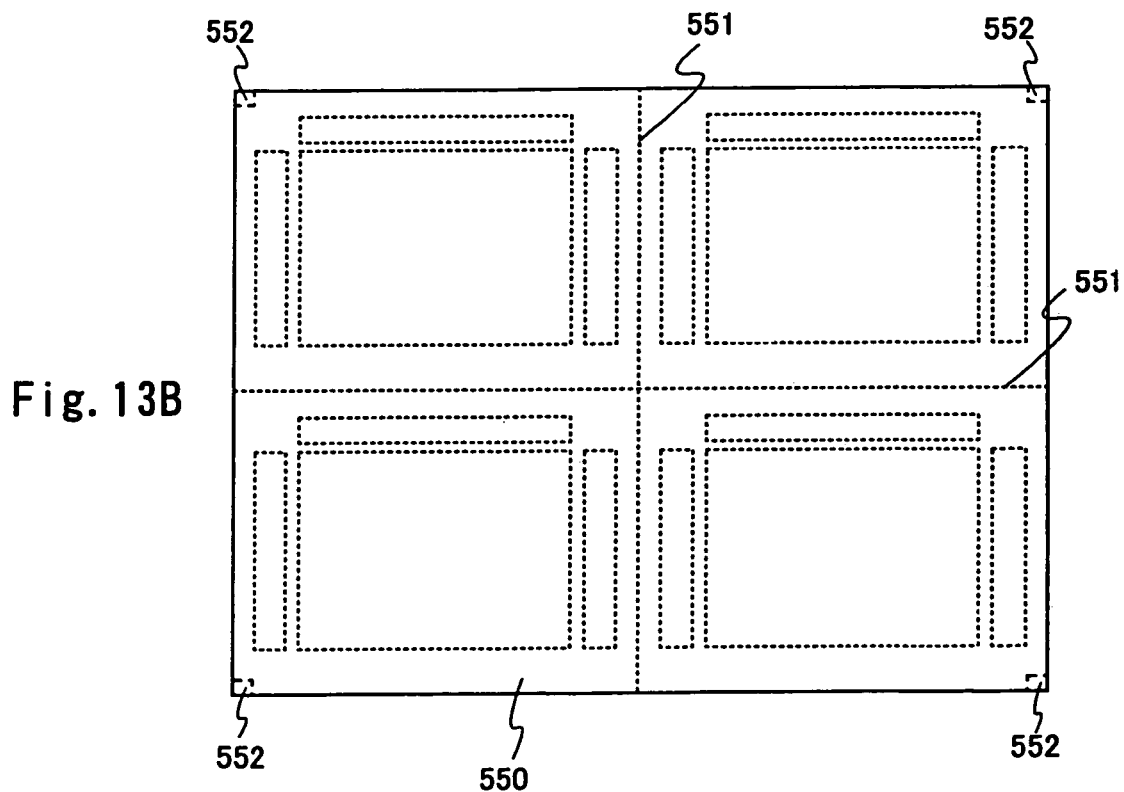

In order to define the area to be scanned by the laser light, a marker used for positioning the mask relative to a semiconductor film need be formed on the semiconductor film. FIGS. 13A and 13B show positions for forming a marker on a semiconductor film formed for the fabrication of an active matrix type semiconductor device. FIG. 13A illustrates an example where a single semiconductor device is formed on a single substrate, whereas FIG. 13B illustrates an example where four semiconductor devices are formed on a single substrate.

Referring to FIG. 13A, a reference numeral 540 denotes a semiconductor film formed on a substrate. A broken line 541 defines a pixel portion, a broken line 542 defining a signal line drive circuit, a broken line 543 defining a scanning line drive circuit. A reference numeral 544 denotes a portion where a marker is formed (marker forming portion). The marker forming portions are provided at four corners of the semiconductor film.

Although FIG. 13A shows the four marker forming portions 544 disposed at the four corners, the invention is not limited to this arrangement. The position or number of the marker forming portion is not limited to the above mode, so long as the marker forming portion provides for the alignment between the area of the semiconductor film that is to be scanned with the laser light and the patterning mask on the semiconductor film.

Referring to FIG. 13B, a reference numeral 550 denotes a semiconductor film formed on a substrate. A broken line 551 represents a scribe line along which the substrate is divided in the subsequent step. According to FIG. 13B, four semiconductor devices can be obtained by dividing the substrate along the scribe lines 551. It is noted that the number of semiconductor devices obtained by dividing the substrate is not limited to this.

A reference numeral 552 denotes a portion where the marker is formed (marker forming portion). The marker forming portions are disposed at four corners of the semiconductor film. Although FIG. 13B shows the four marker forming portions 552 disposed at the four corners of the semiconductor film, the invention is not limited to this arrangement. The position or number of the marker forming portion is not limited to the above mode, so long as the marker forming portion provides for the alignment between the area of the semiconductor film that is to be scanned with the laser light and the patterning mask on the semiconductor film.

A typical example of a laser used for forming the marker include a YAG laser, $CO_2$ laser and the like. It goes without saying that other lasers may be used for forming the marker.

Next, description is made on a flow of fabrication of a semiconductor device using the semiconductor fabricating apparatus according to the invention.

Figure 14:
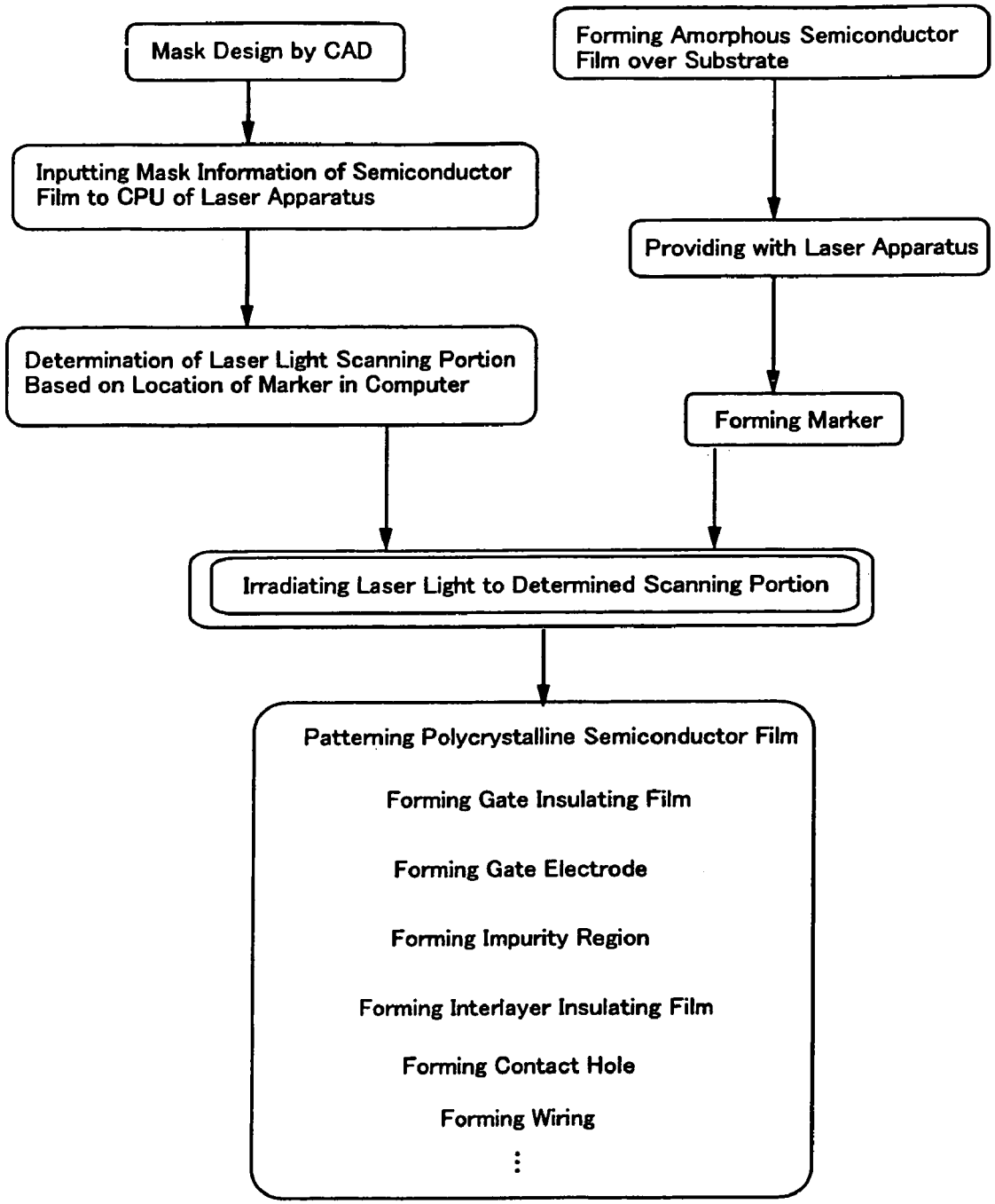
FIG. 14 is a flow chart showing the steps of a fabrication procedure according to the invention.

FIG. 14 is a flow chart of a fabrication process where a single laser irradiation process is performed. First, a semiconductor device is designed by means of a CAD. Then, information indicative of a configuration of a patterning mask for the designed semiconductor film is inputted to the computer of the laser irradiation equipment. On the other hand, an amorphous semiconductor film is formed on the substrate and then, the substrate formed with the amorphous semiconductor film is loaded in the laser irradiation equipment. A marker is formed on a surface of the semiconductor film by means of a laser.

Based on the mask information inputted to the computer, an area to be scanned with the laser light is determined with reference to the position of the marker. With reference to the marker, the laser light is irradiated on the area to be scanned for local crystallization of the semiconductor film.

After the irradiation with the laser light, the polycrystalline semiconductor film formed by the laser irradiation is patterned and etched, thereby to obtain semiconductor film islands. Subsequently, steps for forming TFTs from the semiconductor film islands are performed. Specific steps for forming the TFTs may vary depending upon the configurations of the TFTs, but may typically include the steps of forming a gate insulating film for forming impurity regions on the semiconductor film islands; forming an inter-layer insulating film in a manner to cover the gate insulating film and gate electrodes; forming contact holes in the inter-layer insulating film for partially exposing the impurity regions; and forming a wiring on the inter-layer insulating film in a manner to establish contact with the impurity regions via the contact holes.

Figure 15:
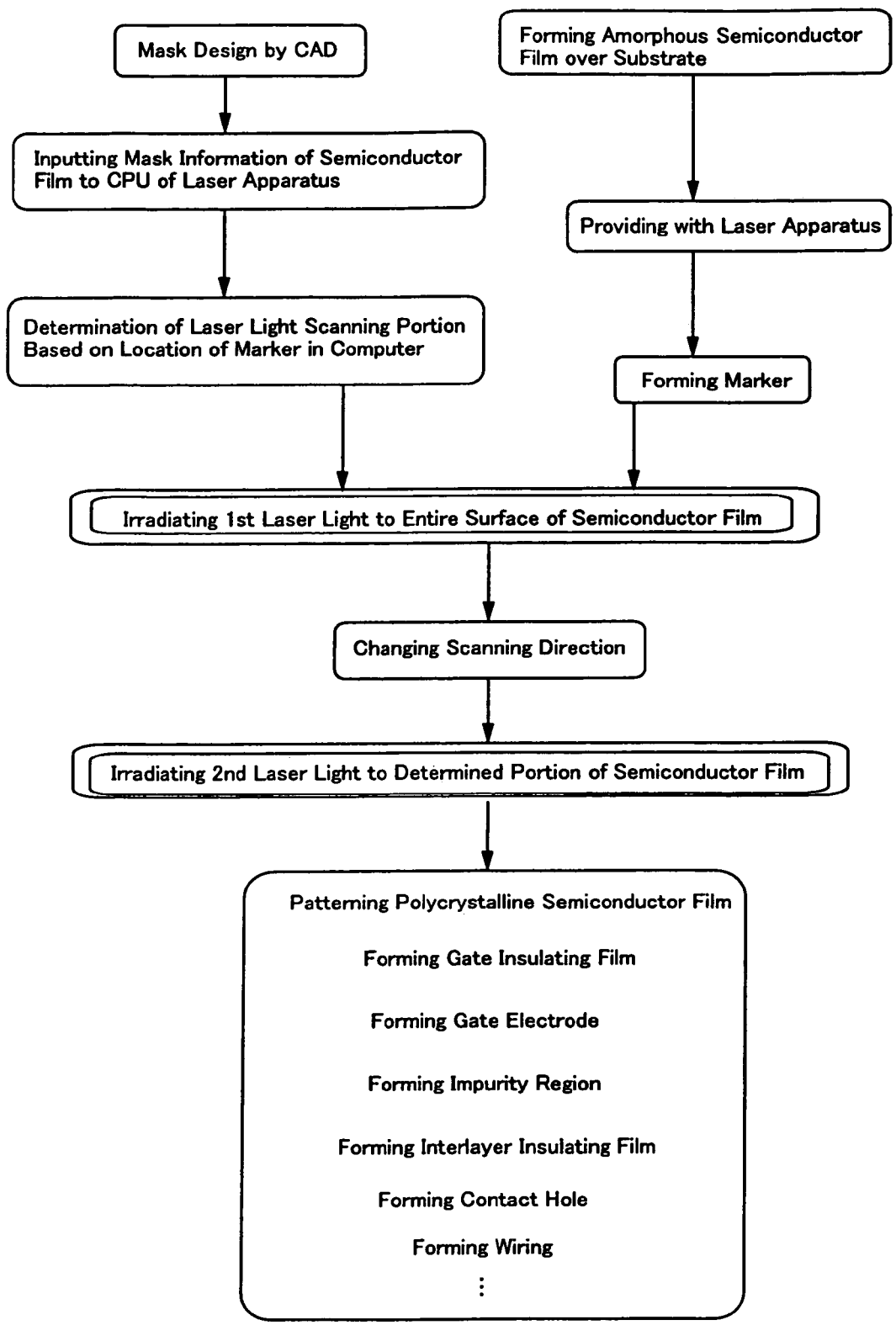
FIG. 15 is a flow chart showing the steps of a fabrication procedure according to the invention.

FIG. 15 is a flow chart of a fabrication process where two laser irradiation processes are performed. First, a semiconductor device is designed by means of a CAD. Then, information indicative of a configuration of a patterning mask for the designed semiconductor film is inputted to the computer of the laser irradiation equipment. On the other hand, an amorphous semiconductor film is formed on the substrate and then, the substrate formed with the amorphous semiconductor film is loaded in the laser irradiation equipment. A marker is formed on a surface of the semiconductor film by means of a laser.

Based on the mask information inputted to the computer, areas to be scanned with the first and second laser lights are determined with reference to the position of the marker. It is noted that the area to be scanned with the second laser light may vary depending upon an angle between the scanning direction of the first laser light and that of the second laser light. The angle between the scanning directions of the first and second laser lights may previously be stored in the memory or the like. Otherwise, the angle may be manually inputted as needed. With reference to the marker, the first laser light is irradiated on the area to be scanned for local crystallization of the semiconductor film.

Next, the first means is used to change the scanning direction of the laser light by a determined value before the second laser irradiation process is performed for locally crystallizing the semiconductor film.

After the irradiation with the laser light, the polycrystalline semiconductor film formed by the laser irradiation is patterned and etched, thereby to obtain semiconductor film islands. Subsequently, steps for forming TFTs from the semiconductor film islands are performed. Specific steps for forming the TFTs may vary depending upon the configurations thereof, but may typically include the steps of forming a gate insulating film for forming impurity regions on the semiconductor film islands; forming an inter-layer insulating film in a manner to cover the gate insulating film and gate electrodes;

forming contact holes in the inter-layer insulating film for partially exposing the impurity regions; and forming a wiring on the inter-layer insulating film in a manner to establish contact with the impurity regions via the contact holes.

Figure 16:
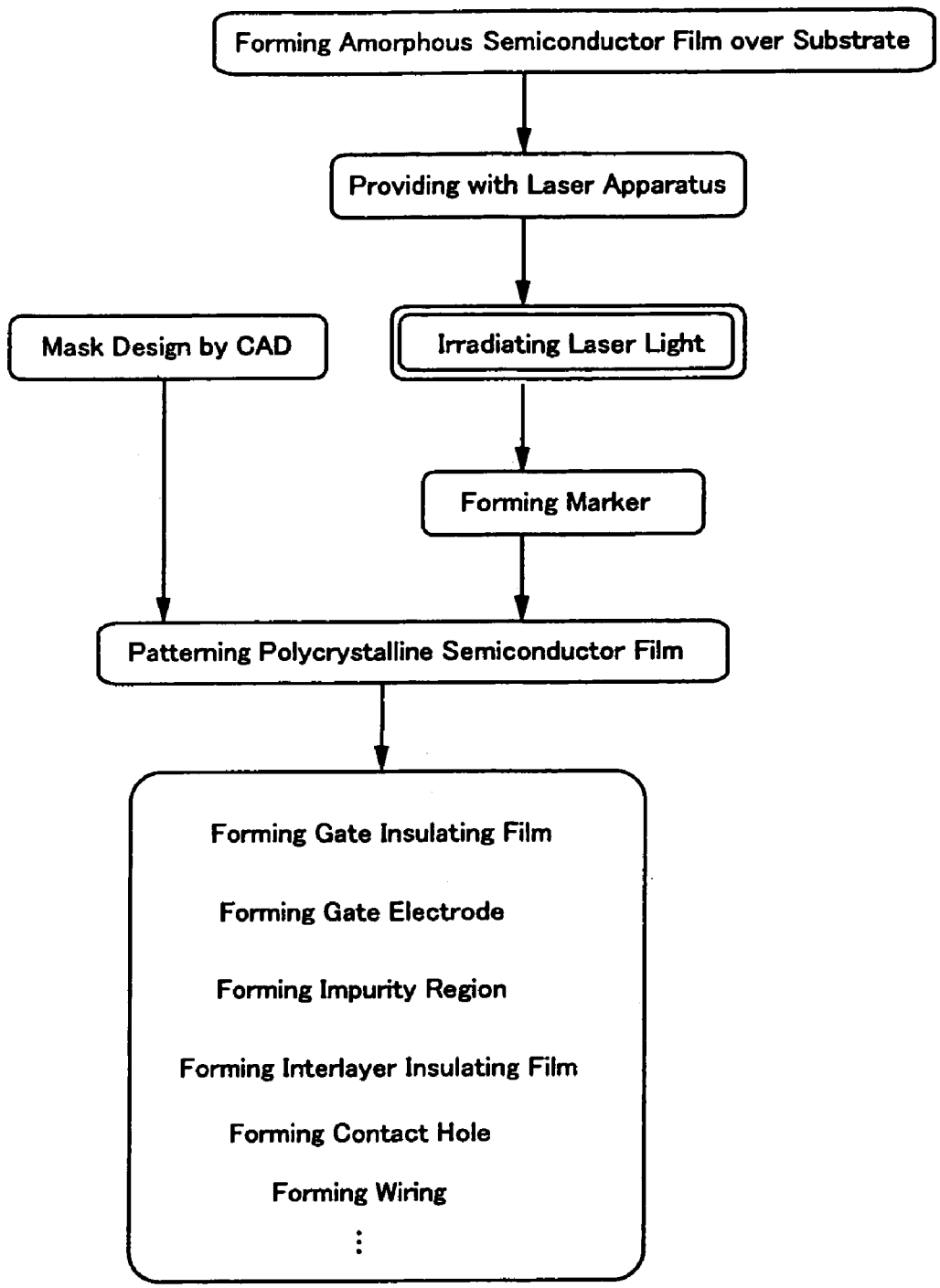
FIG. 16 is a flow chart showing the steps of a conventional fabrication procedure.

For comparison purpose, FIG. 16 shows a flow of the conventional fabrication process for semiconductor device. As shown in FIG. 16, a mask for a semiconductor device is designed by means of a CAD. On the other hand, an amorphous semiconductor film is formed on the substrate and then, the substrate formed with the amorphous semiconductor film is loaded in the laser irradiation equipment. Subsequently, the laser light is scanned for laser irradiation on the overall surface of the amorphous semiconductor film thereby crystallizing the whole amorphous semiconductor film. A marker is formed on the polycrystallinle semiconductor film thus crystallized, which is patterned with reference to the marker for forming semiconductor film islands. Then, TFTs are fabricated using the semiconductor film islands.

In contrast to the conventional fabrication process shown in FIG. 16, the inventive process is arranged such that the marker is formed before the amorphous semiconductor film is crystallized by means of the laser light. Subsequently, the semiconductor film is scanned with the laser light based on the information on the patterning mask for the semiconductor film.

The above arrangement obviates the time spent for irradiating the laser light on a portion to be removed by patterning after the crystallization of the semiconductor film, thus reducing the time required for the laser irradiation as well as increasing the processing speed for the substrate.

The fabrication process of the invention may include a step of crystallizing the semiconductor film using a catalyst. In a case where a catalyst element is used, techniques disclosed in JP-A-7-130652 and JP-A-8-78329 may preferably be used.

In the case where the fabrication process includes the step of crystallizing the semiconductor film using the catalyst, the formation of the amorphous semiconductor film is followed by a step of crystallizing the semiconductor film using Ni (NiSPC). In the case of the technique disclosed in JP-A-7-130652, the crystallization process includes the steps of applying a nickel acetate solution containing 10 ppm (by weight) of nickel to the amorphous semiconductor film thereby forming a nickel-containing layer thereon; performing 1-hour dehydrogenation at 500° C.; subjecting the semiconductor film to heat treatment at temperatures of 500-650° C. for 4-12 hours, or an 8-hour heat treatment process at 550° C. for example, thereby crystallizing the semiconductor film. Examples of a usable catalyst element besides nickel (Ni) include germanium (Ge), iron (Fe), palladium (Pd), tin (Sn), lead (Pb), cobalt (Co), platinum (Pt), copper (Cu), gold (Au) and the like.

Subsequently, the laser light is irradiated on the semiconductor film thereby further enhancing the crystallinity of the semiconductor film crystallized with NiSPC. The polycrystalline semiconductor film formed by the laser irradiation contains the catalyst element and hence, the laser irradiation is followed by a step (gettering) for removing the catalyst element from the polycrystalline semiconductor film. A technique disclosed in JP-A-10-135468 or JP-A-10-135469 may be used for the gettering.

Specifically, the gettering process includes the steps of implanting phosphorus into a part of the polycrystalline semiconductor film formed by laser irradiation, and heat treating the semiconductor film at 550-800° C. for 5-24 hours in a nitrogen atmosphere. For instance, a heat treatment process at 600° C. may be performed for 12 hours in the nitrogen atmosphere. A region of the polycrystalline semiconductor film that is doped with phosphorus acts as a gettering site, in which phosphorus present in the polycrystalline semiconductor film can be segregated. Subsequently, the region containing phosphorus is removed from the polycrystalline semiconductor film by patterning, thereby forming semiconductor film islands reduced in the concentrations of the catalyst element to $1\times10^{17}$ atms/cm$^3$ or less or preferably to about $1\times10^{16}$ atms/cm$^3$.

Thus, the invention is arranged such that the overall surface of the semiconductor film is not irradiated with the laser light by scanning but at least the minimum prerequisite area thereof is scanned with the laser light for crystallization. The above arrangement obviates the time spent for irradiating the laser light on the area to be removed by patterning after the crystallization of the semiconductor film, thus achieving a remarkable reduction of processing time per substrate.

PREFERRED EMBODIMENTS

Embodiments of the invention will be described as below.

Embodiment 1

The crystalline semiconductor film formed by irradiation of laser light comprises aggregations of a plurality of crystal grains. The crystal grains have random positions and sizes and hence, it is difficult to form a crystalline semiconductor film with specified position and size of crystal grains. Accordingly, the active layers formed by patterning the crystalline semiconductor film into the islands may contain grain interfaces (grain boundaries).

Unlike crystal grains, the grain boundaries contains therein an infinite number of recombination centers and trapping centers associated with amorphous structure and crystal defects. It is known that carriers trapped in the trapping centers increase the potential of the grain boundaries, which form barriers against carriers, so that the carriers are reduced in current transportability. Therefore, the grain boundaries present in the active layer of a TFT, or particularly in the channel forming region, will exert serious effects on the TFT characteristics, such as a significant decrease in the mobility of the TFT, or an increased OFF current due to current flow through the grain boundaries. Furthermore, a plurality of TFTs, fabricated based on the premise that the same characteristics can be obtained, will encounter varied characteristics due to the presence of the grain boundaries in the active layers.

The reason why the laser irradiation on the semiconductor film produces crystal grains of random sizes at random positions is as follows. That is, a certain length of time is taken before the formation of solid-phase nuclei takes place in a semiconductor film completely molten by the laser irradiation. With the passage of time, an infinite number of crystal nuclei occur in the fully molten region and crystals grow from the respective nuclei. Since the crystal nuclei occur at random positions, an irregular distribution of the crystal nuclei results. The crystal grains grow to collide with one another, where the crystal grow process terminates. Consequently, the crystal grains have random positions and sizes.

On the other hand, there has been proposed a method wherein the crystalline semiconductor film is formed by locally melting the semiconductor film instead of melting the whole semiconductor film. In this case, the laser irradiation produces a portion where the semiconductor film is completely molten and a portion where a solid-phase semiconductor region is present, the solid-phase semiconductor region acting as the crystal nuclei from which grains start growing. Nucleation in the completely molten region requires a certain length of time. During the lapse of time until the occurrence of nucleation in the completely molten region, the grains grow from the solid-phase semiconductor region, as the crystal nuclei, in a horizontal direction (hereinafter referred to as "lateral direction") with respect to the surface of the semiconductor film. Accordingly, the grains grow in lengths no less than dozens times the thickness of the semiconductor film. After the lapse of some time, crystal grains in the completely molten region also start growing and collide with the grains growing from the nuclei, where the lateral crystal grow terminates. Hereinafter, this phenomenon will be referred to as "superlateral growth".

The superlateral growth process provides relatively larger crystal grains, correspondingly reducing the number of grain boundaries. Unfortunately, laser light for effecting the superlateral growth is quite limited in the range of energy. In addition, it is difficult to control the location where large grains are formed. Furthermore, other regions than the large grains are minor crystal regions containing an infinite number of nuclei or amorphous regions and hence, irregular crystal sizes result.

It is contemplated that a location- and direction-controlled grain growth process is practicable if laser light in such an energy range as to completely melt the semiconductor film is used and a lateral temperature gradient can be controlled. A variety of attempts have been made to realize this process.

For instance, James. S. Im et al at Colombia University have proposed Sequential Lateral Solidification method (hereinafter referred to as SLS method) for effecting the superlateral growth at arbitrary locations. The SLS process is arranged such that crystallization is performed by translating a slit mask by a distance of superlateral growth (about 0.75 µm) at each shot of the laser light.

This embodiment illustrates an example where the SLS process is applied to the invention.

Firstly, a first laser light is irradiated on a semiconductor film. In this case, a pulse oscillation type laser and a continuous wave type laser are both usable. The first laser light is irradiated exclusively on an area defined by a mask. Although the energy density of the first laser light varies depending upon the thickness of the semiconductor film, the first laser light may have such a degree of energy density as to enhance the crystallinity of the area defined by the mask.

Next, the scanning direction is changed and a second laser light is irradiated on the area defined by the mask. The second laser light is emitted from the pulse oscillation type laser and is irradiated at such an energy density as to melt a local portion of the area defined by the mask to the full depth of the semiconductor film.

Figure 17A:
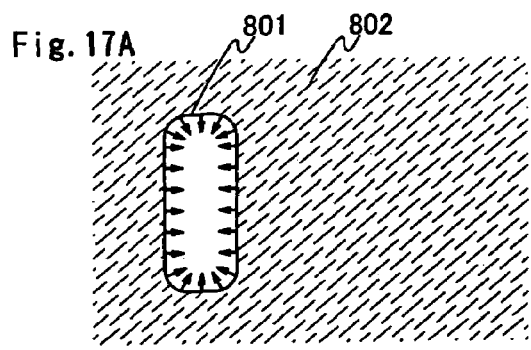
FIGS. 17A to 17E are diagrams explanatory of a crystallization mechanism using SLS technique.

FIG. 17A schematically shows a state of the semiconductor film immediately after a first shot of the second laser light. A semiconductor film 802 is equivalent to the area enhanced in crystallinity by the irradiation of the first laser light. The irradiation of the second laser light locally melts the semiconductor film 802 to the full depth thereof at the portion thereof under a beam spot 801.

At this time, the semiconductor film 802 is fully molten at its portion under the beam spot 801 whereas a portion out of the beam spot is not molten or molten at much lower temperature than the beam spot portion. Therefore, an edge of the beam spot portion forms seed grains, which grow laterally from the edge of the beam spot portion toward center as indicated by arrows in the figure.

As the crystal growth proceeds with time, the grains collide with grains from seed grains produced in the fully molten portion or with the growing seed grains on the opposite side so that the grain growth stops at a central portion 803 of the beam spot. FIG. 17B schematically shows a state of the semiconductor film at the termination of the crystal growth. The semiconductor film has an irregular surface at the central portion 803 of the beam spot, where a greater number of fine crystals are present than in the other portion or the crystal grains collide with one another.

Next, a second shot of the second laser light is applied. The second shot is applied to place slightly shifted from the beam spot of the first shot. FIG. 17C schematically shows a state of the semiconductor film immediately after the second shot. In FIG. 17C, a beam spot of the second shot is shifted from the portion 801 under the beam spot of the first shot to a degree that the beam spot of the second shot covers the central portion 803 formed by the first shot.

At this time, a portion under a beam spot 804 of the second shot is fully molten whereas a portion out of the beam spot is not molten or molten at much lower temperature than the beam spot portion. Therefore, an edge of the beam spot portion forms seed grains, which grow laterally from the edge of the beam spot portion toward center as indicated by arrows in the figure. At this time, out of the portion 801 crystallized by the first shot, a part unirradiated by the beam spot of the second shot forms seed grains so that the laterally grown grains due to the first shot further grow along the scanning direction.

As the crystal growth proceeds with time, the grains collide with grains from seed grains produced in the fully molten portion or with the growing seed grains on the opposite side so that the grain growth stops at a central portion 805 of the beam spot of the second shot. FIG. 17D schematically shows a state of the semiconductor film at the termination of the crystal growth. The semiconductor film has an irregular surface at the central portion 805 of the beam spot, where a greater number of fine crystals are present than in the other portion or the crystal grains collide with one another.

Figure 17E:
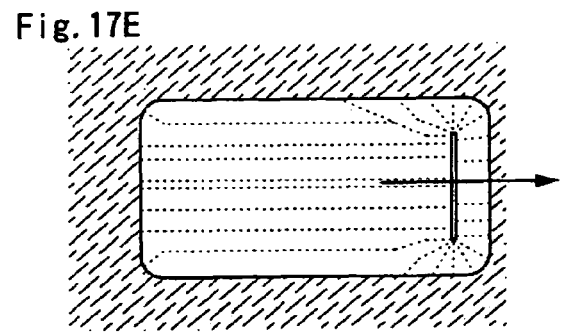
Figure 17B:
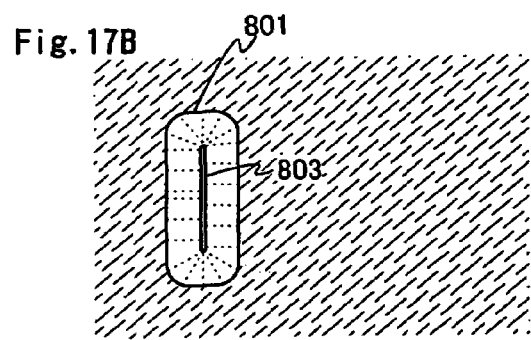
Figure 17C:
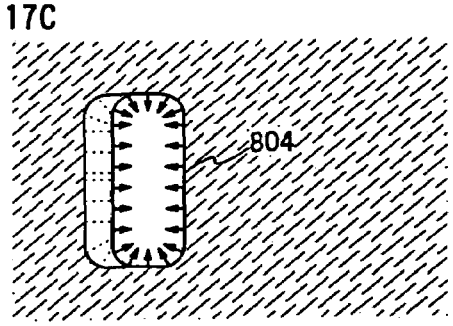
Figure 17D:
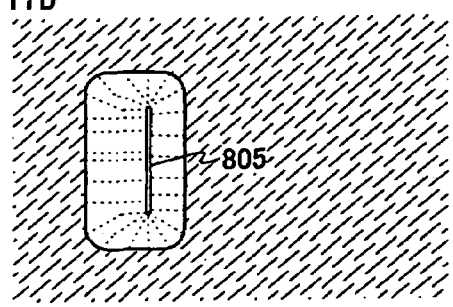

In a similar manner, a third shot and the subsequent shots are applied as slightly shifting beam spots thereby accomplishing the crystal growth extending in parallel with the scanning direction, as shown in FIG. 17E.

According to the above arrangement, the local crystallization can be accomplished while controlling the location and size of the crystal grains.

Next, description is made on another embodiment than that of FIGS. 17A to 17E, which applies the SLS process to the invention.

Firstly, a first laser light is irradiated on a semiconductor film. In this case, a pulse oscillation type laser and a continuous wave type laser are both usable. The first laser light is irradiated exclusively on an area defined by a mask. Although the energy density of the first laser light varies depending upon the thickness of the semiconductor film, the first laser light may have such a degree of energy density as to enhance the crystallinity of the area defined by the mask.

Next, the scanning direction is changed and a second laser light is irradiated on the area defined by the mask. The second laser light is emitted from the pulse oscillation type laser and irradiated at such an energy density as to melt a local portion of the area defined by the mask to the full depth of the semiconductor film.

Figure 18A:
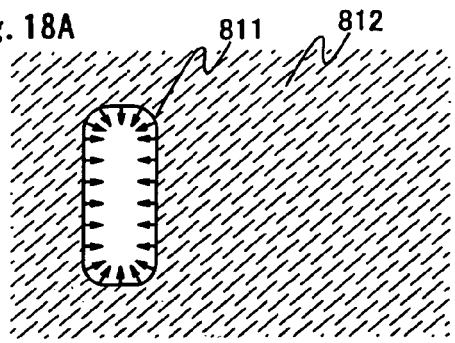
FIGS. 18A to 18E are diagrams explanatory of a crystallization mechanism using SLS technique.

FIG. 18A schematically shows a state of the semiconductor film immediately after the first shot of the second laser light. A semiconductor film 812 is equivalent to the area enhanced in crystallinity by the irradiation of the first laser light. The irradiation of the second laser light locally melts the semiconductor film 812 to the full depth thereof at the portion thereof under a beam spot 811. An edge of the beam spot portion forms seed grains, which grow laterally from the edge of the beam spot portion toward center as indicated by arrows in the figure.

As the crystal growth proceeds with time, the grains collide with grains from seed grains produced in the fully molten portion or with the growing seed grains on the opposite side so that the grain growth stops at a central portion 813 of the beam spot. FIG. 18B schematically shows a state of the semiconductor film at the termination of the crystal growth. The semiconductor film has an irregular surface at the central portion 813 of the beam spot, where a greater number of fine crystals are present than in the other portion or the crystal grains collide with one another.

Next, a second shot of the second laser light is applied. The second shot is applied to place slightly shifted from the beam spot of the first spot. FIG. 18C schematically shows a state of the semiconductor film immediately after the second shot. A beam spot of the second shot is shifted from the portion 811 under the beam spot of the first shot. In FIG. 18C, a beam spot of the second shot does not cover the central portion 813 formed by the first shot, shifted therefrom to a degree that the beam spot of the second shot overlaps a part of the beam spot of the first shot.

An edge of the portion under the beam spot of the second shot forms seed grains, which grow laterally from the edge of the beam spot portion toward center as indicated by arrows in the figure. At this time, out of the portion 811 crystallized by the first shot, a part unirradiated by the second shot forms seed grains so that the laterally grown grains due to the first shot further grow along the scanning direction.

As the crystal growth proceeds with time, the grains collide with grains from seed grains produced in the fully molten portion or with the growing seed grains on the opposite side so that the grain growth stops at a central portion 815 of the beam spot of the second shot. FIG. 18D schematically shows a state of the semiconductor film at the termination of the crystal growth. The semiconductor film has an irregular surface at the central portion 815 of the beam spot, where a greater number of fine crystals are present than in the other portion or the crystal grains collide with one another.

Figure 18E:
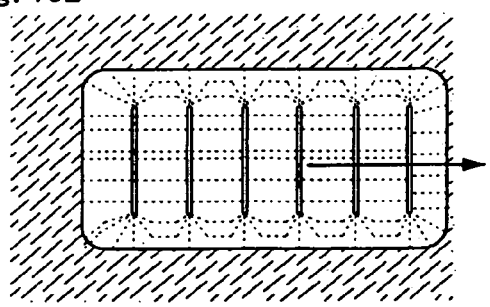
Figure 18B:
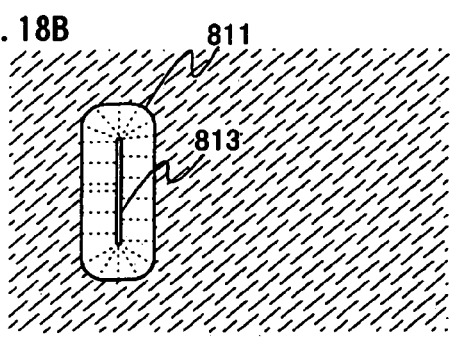
Figure 18C:
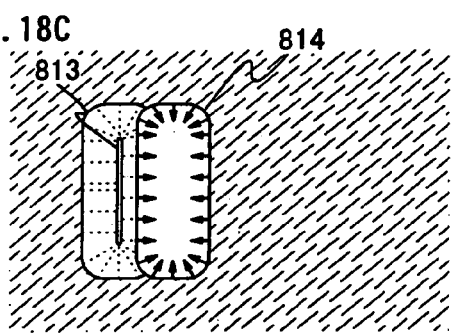
Figure 18D:
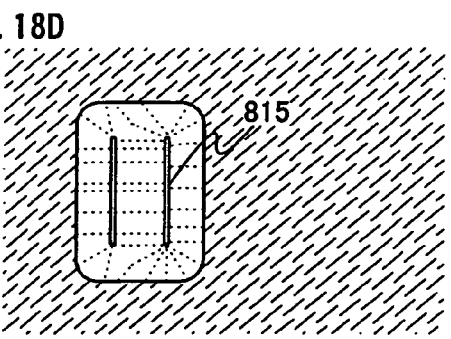

In a similar manner, a third shot and the subsequent shots are applied as slightly shifting beam spots thereby accomplishing the crystal growth extending in parallel with the scanning direction, as shown in FIG. 18E. According to the above arrangement, the local crystallization can be accomplished while controlling the location and size of the crystal grains.

The central portions of the beam spots remain in the crystals formed by the irradiation method shown in FIGS. 18A to 18E. Since the center of the beam spot does not present a favorable crystallinity, it is preferred to lay out the active layers in a manner to preclude the beam spot centers from the channel forming regions or more preferably from the active layers.

In the both laser irradiation methods shown in FIGS. 17A to 17E and 18A to 18E, the channel forming regions contain a reduced number of grain boundaries if the active layers are laid out in a manner that the crystal grains grow in parallel with the direction of carrier movement in the channel forming regions. This leads to an increased carrier mobility and a decreased OFF current. If, on the other hand, the active layers are laid out in a manner that the crystal grains grow in an angled direction relative to the direction of carrier movement in the channel forming regions rather than in parallel therewith, the channel forming regions contain an increased number of grain boundaries. According to a comparison among plural active layers, however, the individual active layers have a smaller difference percentage of the total grain boundaries in the channel forming region, leading to decreased variations of the mobility and OFF current of the resultant TFTs.

Although the embodiment uses the SLS process in the radiation of the second laser light, the embodiment is not limited to this arrangement. For instance, a first laser irradiation may be performed for crystallization using the SLS process, and a second laser irradiation may be performed using a pulse oscillation laser thereby eliminating defects in the crystal grains formed by the first laser irradiation and further enhancing crystallinity. The pulse oscillation laser generally has a higher energy density than a continuous wave laser and provides a relatively larger beam spot, thus reducing the processing time per substrate and achieving a higher processing efficiency.

It is noted that the embodiment may employ a mask for shaping the beam spot of the laser light in order to define a region for nucleation. Usable lasers include, but not limited to, pulse oscillation type excimer lasers, YLF lasers and the like.

Embodiment 2

In this embodiment, description is made on a shape of a beam spot formed by a plurality of laser oscillators.

Figure 19A:
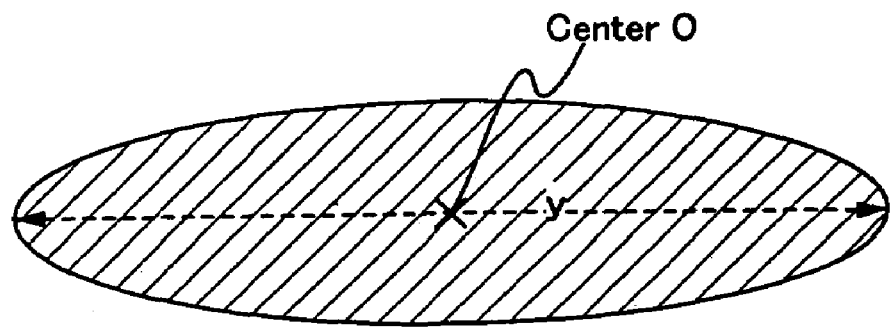
FIGS. 19A and 19B are diagram and graph showing a shape of a beam spot and an energy density distribution thereof.

FIG. 19A shows an exemplary shape of a beam spot of a laser beam on an irradiation object, the laser beam emitted from each of plural laser oscillators. The beam spot shown in FIG. 19A has an elliptical shape. In the laser irradiation equipment provided at the semiconductor fabricating apparatus of the invention, the shape of the beam spot of the laser light emitted from the respective laser oscillators is not limited to the elliptical shape. The shape of the beam spot may vary depending upon the type of the laser. Furthermore, the beam spot can be shaped by means of an optical system. For instance, XeCl excimer laser L3308 (wave length: 308 nm, pulse width: 30 ns) commercially available from Lambda Inc. emits laser light of a 10 mm×30 mm (half widths in beam profile) rectangular shape. On the other hand, a YAG laser having a cylindrical rod emits laser light of a circular shape whereas a YAG laser having a slab-shaped rod emits laser light of a rectangular shape. Such laser light may be further shaped by means of the optical system thereby to form laser light of a desired size.

Figure 19B:
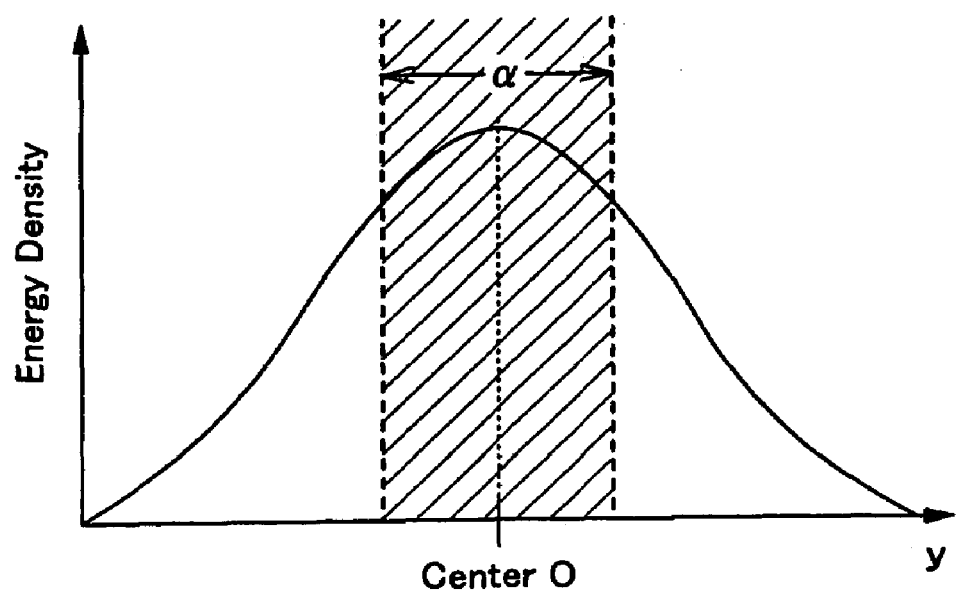

FIG. 19B shows a distribution of energy densities with respect to a longitudinal axis y of the beam spot shown in FIG. 19A. The laser light of the elliptical beam spot has the energy density distribution skewed toward a center O of the elliptical shape. A symbol α represents a width with respect to the longitudinal axis y, in which width the energy density exceeds a value required for forming desired crystals.

Next, FIG. 20A shows a shape of a beam spot formed by synthesizing the laser beams having the beam spot shown in FIGS. 19A and 19B. Although FIG. 20A illustrates an example where the beam spots of four laser beams are superpositioned on each other to form a single beam spot, the number of beam spots to be superpositioned is not limited to this.

As shown in FIG. 20A, a single beam spot is formed by partially superpositioning the beam spots of the laser beams on each other, the beam spots having their longitudinal axes aligned with each other. It is noted that a straight line obtained by interconnecting the respective centers O of the elliptical shapes will hereinafter be referred to as "center axis".

FIG. 20B shows a center-axis distribution of energy densities in the synthesized laser beam spot shown in FIG. 20A. At a portion where unsynthesized beam spots are superpositioned on each other, the respective energy densities thereof are combined together. According to the illustration, energy densities A and B of the superpositioned beam portions may be combined to give a value substantially equal to a peak value C of the energy density of each beam. Thus, the energy densities are smoothed between the respective centers O of the elliptical beams. It is ideal that the sum of the values A and B is equal to the value C. In fact, however, the sum is not always equal to the value C. A difference between the sum of A and B and the value C may preferably be in the range of ±10% of the value C, or more preferably of ±5% thereof. However, the tolerances may properly be defined by a designer.

As seen from FIG. 20B, the arrangement wherein the plural laser beams are superpositioned on each other for compensating for the respective low energy density portions thereof provides a more efficient enhancement of the crystallinity of the semiconductor film, as compared to the arrangement wherein the plural laser beams are not superpositioned and applied independently. Assume that, for example, only a hatched region shown in FIG. 20B exceeds the required value of energy density for forming the desired crystals, whereas the other regions have lower energy densities. In this case, the desired crystals can be formed only in the hatched region of the center-axis width α, unless the four beam spots are superpositioned on each other. On the other hand, the beam spots may be superpositioned on each other as shown in FIG. 20B so as to form the desired crystals in the region of the center-axis width β (β>4α), thus achieving a more efficient crystallization of the semiconductor film.

It is noted that the superpositioned portion of the beam spot may not necessarily have a value equal to the maximum energy density of each beam spot. For instance, the superpositioned portion may have a value within ±10% or more preferably ±5% of the energy density of each beam spot.

Additionally, the laser light may be changed in the width of its path while maintaining its energy density at a constant level. This prevents an edge of the laser light path from overlapping a semiconductor device obtained by patterning. Furthermore, the substrate may be reduced in damage caused by the laser light irradiated on an unwanted portion thereof.

The arrangement of this embodiment may be implemented in free combination with Embodiment 1.

Embodiment 3

In this embodiment, description is made on an optical system in the laser irradiation equipment of the semiconductor fabricating apparatus of multi-chamber system according to the invention.

FIGS. 21A to 21D illustrates exemplary optical systems according to the embodiment. An optical system shown in FIG. 21A includes two cylindrical lenses 401, 402. An incident laser beam along a direction of an arrow in the figure impinges upon an irradiation object 403, having its beam spot shaped by the two cylindrical lenses 401, 402. The cylindrical lens 402 closer to the irradiation object 403 has a smaller focal length than the cylindrical lens 401. For the purposes of preventing return light and effecting uniform laser irradiation, an incidence angle of the laser beam with respect to the substrate may preferably be maintained in the range of more than 0° or more preferably of 5-30°.

Figure 21A:
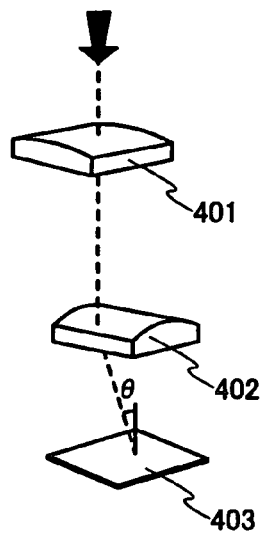
FIGS. 21A to 21D are diagrams showing exemplary optical systems of the laser irradiation equipment.
Figure 21B:
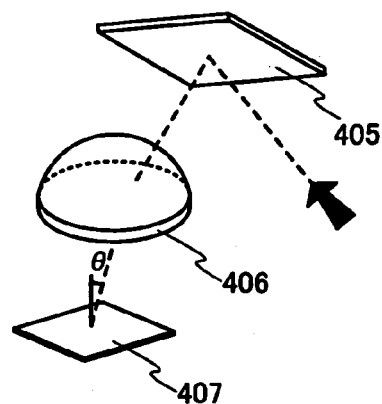

An optical system shown in FIG. 21B includes a mirror 405 and a semi-spherical lens 406. An incident laser beam along a direction of an arrow in the figure is reflected by the mirror 405 and impinges upon an irradiation object 407, having its beam spot shaped by the semi-spherical lens 406. A curvature radius of the semi-spherical lens may properly be defined by the designer. For the purposes of preventing return light and effecting uniform laser irradiation, an incidence angle of the laser beam with respect to the substrate may preferably be maintained in the range of more than 0° or more preferably of 5-30°.

Figure 21C:
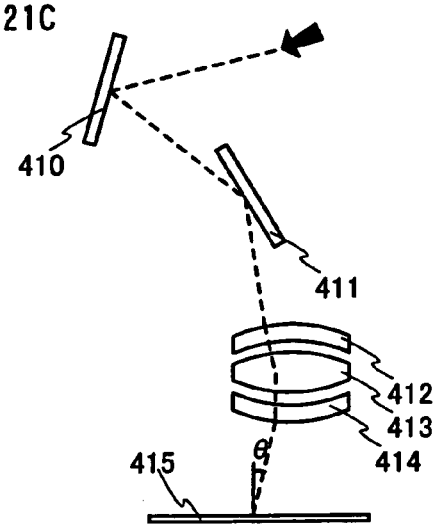

An optical system shown in FIG. 21C includes galvano mirrors 410, 411 and lenses 412, 413, 414. An incident laser beam along a direction of an arrow in the figure is reflected by the galvano mirrors 410, 411 and impinges upon an irradiation object 415, having its beam spot shaped by the lenses 412, 413, 414. Controlling the inclination of the galvano mirrors 410, 411 provides the scanning of the irradiation object 415 with the beam spot of the laser beam. For the purposes of preventing return light and effecting uniform laser irradiation, an incidence angle of the laser beam with respect to the substrate may preferably be maintained in the range of more than 0° or more preferably of 5-30°.

Figure 21D:
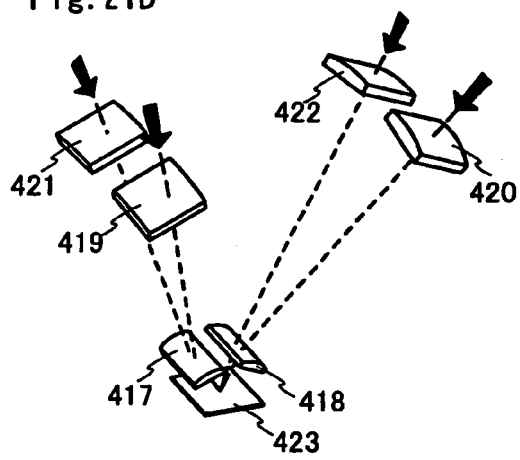

FIG. 21D shows an optical system which is illustrated by Embodiment 2 and adapted to synthesize the four beam spots into a single beam spot. The optical system of FIG. 21D includes 6 cylindrical lenses 417-422. The four incident laser beams along directions of arrows in the figure pass through the respective cylindrical lenses 419-422. The two laser beams shaped by the cylindrical lenses 419, 421 enter the cylindrical lens 417 to be shaped again and impinge upon an irradiation object 423. On the other hand, the two laser beams shaped by the cylindrical lenses 420, 422 enter the cylindrical lens 418 to be shaped again and impinge upon the irradiation object 423.

The beam spots of the laser beams on the irradiation object 423 are partially superpositioned on each other so as to be synthesized into a single beam spot.

A focal length and incidence angle of each lens may properly be defined by the designer, provided that a focal length of the cylindrical lenses 417, 418 closest to the irradiation object 423 is defined to be smaller than that of the cylindrical lenses 419-422. For instance, the focal length of the cylindrical lenses 417, 418 closest to the irradiation object 423 is defined to be 20 mm, whereas the focal length of the cylindrical lenses 419-422 is defined to be 150 mm. In this embodiment, the cylindrical lenses 417, 418 are so positioned as to apply the laser beams to the irradiation object 423 at an incidence angle of 25°, whereas the cylindrical lenses 419-422 are so positioned as to apply the laser beams to the cylindrical lenses 417, 418 at an incidence angle of 10°. For the purposes of preventing return light and effecting uniform laser irradiation, an incidence angle of the laser light with respect to the substrate may preferably be maintained in the range of more than 0° or more preferably of 5-30°.

FIG. 21D illustrates the example where the four beam spots are synthesized. In this case, the optical system includes the four cylindrical lenses individually provided at a corresponding one of four laser oscillators and the two cylindrical lenses each provided in correspondence to a respective pair of the lenses. The number of beam spots to be synthesized is not limited to this, and may range between 2 and 8 (inclusive). In a case where n beam spots (n=2, 4, 6, 8) are synthesized, the optical system includes n cylindrical lenses individually provided at a corresponding one of n laser oscillators and n/2 cylindrical lenses in correspondence to the n cylindrical lenses. In a case where n beam spots (n=3, 5, 7) are synthesized, the optical system includes n cylindrical lenses individually provided at a corresponding one of n laser oscillators and (n+1)/2 cylindrical lenses in correspondence to the n cylindrical lenses.

In a case where 5 or more beam spots are synthesized, it is preferred in the light of the location of the optical system or interference that the fifth or the subsequent laser beam may be irradiated from the opposite side of the substrate. Thus, the substrate must have light transmission.

Assumed that a plane perpendicular to an irradiation face and including either a shorter side or a longer side of say, a rectangular beam spot of each laser beam is defined as an incidence plane. It is desirable that the incidence angle θ of the laser beam satisfies θ≧arctan(W/2d) where W denotes a length of the shorter or longer side included in the incidence plane, and d denotes a thickness of the substrate disposed at the irradiation face and being transparent to the laser beam. In a case where a path of a laser beam is out of the incidence plane, the incidence angle θ thereof is defined by that of a laser beam having its path on the incidence plane. Irradiating the laser beam at this incidence angle θ provides uniform laser radiation free from interference between light reflected by the surface of the substrate and light reflected by a back side of the substrate. The above logic is made with the proviso that the substrate has a reflectivity of 1. In reality, many of the substrates have reflectivities on the order of 1.5 so that a calculated value based on the reflectivity of 1.5 is greater than the angle determined by the above logic. However, the energy of the beam spot is attenuated at longitudinal opposite ends and hence, the effect of interference at the opposite end portions is insignificant. Thus, the above logical value provides an adequate effect to attenuate interference.

It is noted that the optical system in the laser irradiation equipment of the semiconductor fabricating apparatus of multi-chamber system according to the invention is not limited to the arrangement illustrated by this embodiment.

This embodiment may be implemented in combination with Embodiment 1 or 2.

Embodiment 4

In this embodiment, description is made on an example where the size of the laser beam spots is changed in the course of laser irradiation using a plurality of laser oscillators.

The laser irradiation equipment provided at the semiconductor fabricating apparatus of the invention is arranged such that the computer determines an area to be scanned with the laser light based on the mask information inputted to the computer. The embodiment is further adapted to change the length of the beam spot according to the configuration of the mask.

Figure 22A:
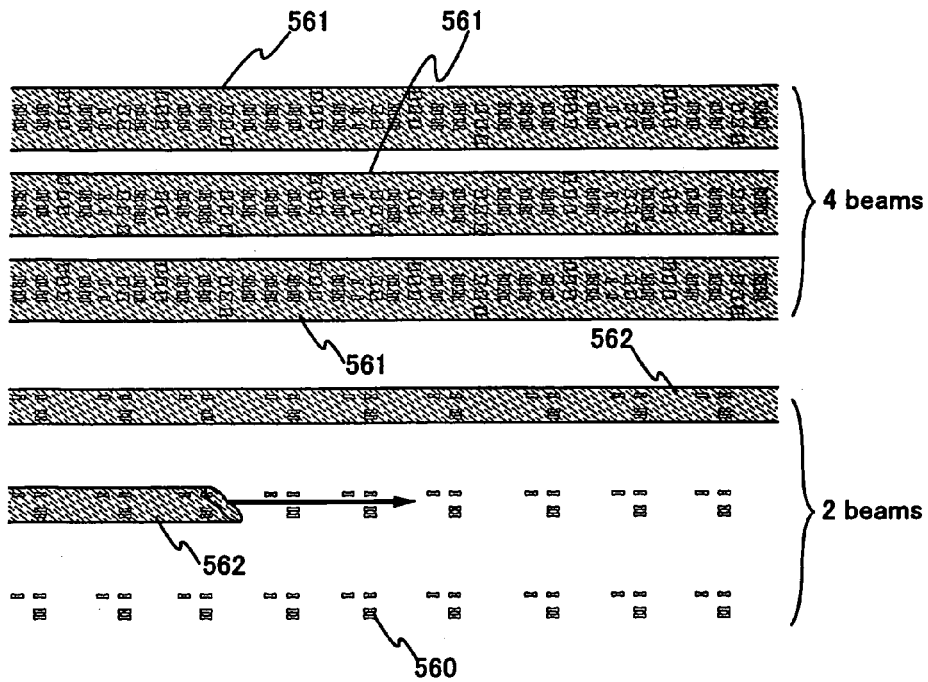
FIGS. 22A and 22B are diagrams showing a positional relation between an area irradiated with the laser light and masks.

FIG. 22A shows an exemplary relation between a configuration of a mask used for patterning the semiconductor film and a length of the beam spot in a case where a single laser irradiation process is performed. A reference numeral 560 denotes a configuration of the mask used for patterning the semiconductor film. After crystallization by the laser irradiation, the semiconductor film is patterned using the mask.

Reference numerals 561, 562 denote areas irradiated with the laser light. The reference numeral 561 denotes the area scanned with a beam spot formed by synthesizing beam spots of laser beams outputted from four laser oscillators. On the other hand, the reference numeral 562 denotes the area scanned with a beam spot formed by superpositioning beam spots of laser beams outputted from two laser oscillators.

The beam spot formed by synthesizing the laser beams from the two laser oscillators can be obtained by deactivating two of the four laser oscillators. It is important, however, that the two beam spots outputted from the two active laser oscillators are superpositioned on each other.

Figure 22B:
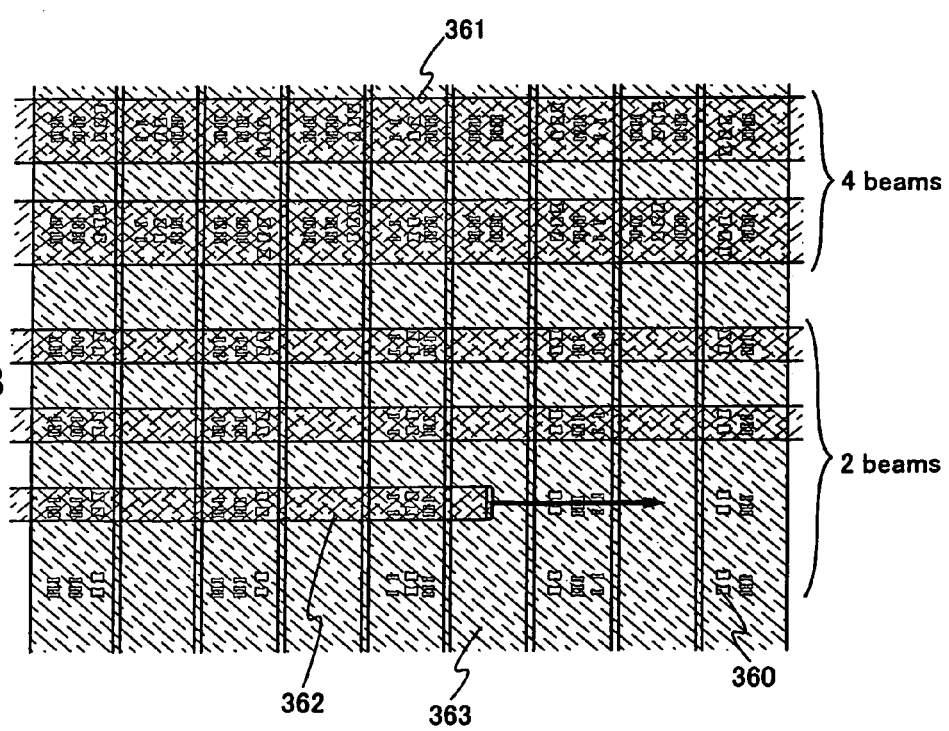

FIG. 22B shows an exemplary relation between a configuration of a mask used for patterning the semiconductor film and a length of the beam spot in a case where two laser irradiation processes are performed. A reference numeral 360 denotes a configuration of the mask used for patterning the semiconductor film. After crystallization by the two laser irradiation processes, the semiconductor film is patterned using the mask.

A reference numeral 363 denotes an area irradiated with a first laser light. Although the first laser light is irradiated on the overall surface of the semiconductor film according to this embodiment, the laser light may be locally irradiated such that at least a portion forming an active layer after patterning may be crystallized. It is critical that the portion forming the active layer after patterning is not overlapped by an edge of the beam spot.

Reference numerals 361, 362 denote areas irradiated with the second laser light. The reference numeral 361 denotes the area scanned with a beam spot formed by synthesizing beam spots of laser beams outputted from four laser oscillators. On the other hand, the reference numeral 362 denotes the area scanned with a beam spot formed by superpositioning beam spots of laser beams outputted from two laser oscillators.

The beam spot formed by synthesizing the laser beams from the two laser oscillators can be obtained by deactivating two of the four laser oscillators. It is important, however, that the two beam spots outputted from the two active laser oscillators are superpositioned on each other.

In an alternative approach, the first laser light may be locally irradiated and the second laser light may be irradiated on the overall surface of the semiconductor film.

In the case exemplified by the embodiment where the length of the beam spot is changed in the course of laser scanning, it is more preferred to change a longer beam spot to a shorter one than to change the shorter beam spot to the longer one because the laser oscillators provide more stable outputs in the former case. Accordingly, it is preferred for the computer to determine the laser scanning order based on the information on the mask configuration such that the longer beam spot is changed to the shorter beam spot. Alternatively, the mask may be designed taking the laser scanning order into consideration.

The above arrangement permits the path of the laser light to be changed in width and therefore, an edge of the laser light path is prevented from overlapping a semiconductor device obtained by patterning. Furthermore, the substrate may be further reduced in damage caused by the laser light irradiated on an unwanted portion thereof.

The embodiment may be implemented in combination with any one of Embodiments 1 to 3.

Embodiment 5

In this embodiment, description is made on an example where the laser light is selectively irradiated on a predetermined portion by operating a shutter of the optical system for blocking the laser light in the course of laser irradiation performed by a plurality of laser oscillators.

The laser irradiation equipment provided at the semiconductor fabricating apparatus of the invention is arranged such that the computer determines an area to be scanned with the laser light based on the mask information inputted to the computer. The embodiment is further adapted to block the laser light by means of the shutter in order that the laser light is selectively irradiated on the portion to be scanned. In this case, the shutter may preferably be formed of a material capable of blocking the laser light and being less susceptible to deformation or damage caused by the laser light.

Figure 23A:
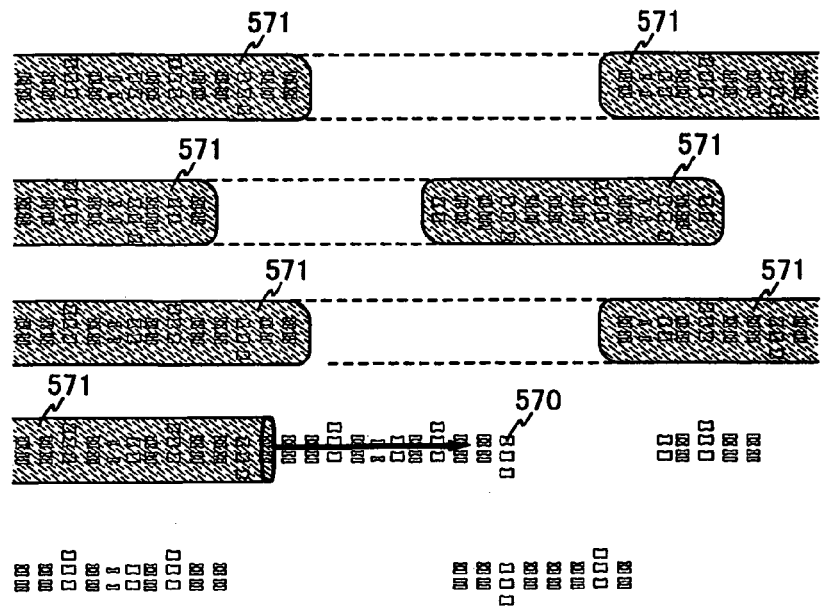
FIGS. 23A and 23B are diagrams showing a positional relation between an area irradiated with the laser light and masks.

FIG. 23A shows an exemplary relation between a configuration of a mask used for patterning the semiconductor film and an area to be irradiated with the laser light. A reference numeral 570 denotes a configuration of the mask used for patterning the semiconductor film. After crystallization by the laser irradiation, the semiconductor film is patterned using the mask.

A reference numeral 571 denotes a portion irradiated with the laser light. A broken line denotes a portion where the laser light is blocked by the shutter. Thus, the embodiment is arranged such that the portion where crystallization is not required is not irradiated with the laser light or irradiated with light of a reduced energy density. Accordingly, the substrate may be further reduced in damage caused by the laser light irradiated on an unwanted portion thereof.

Figure 23B:
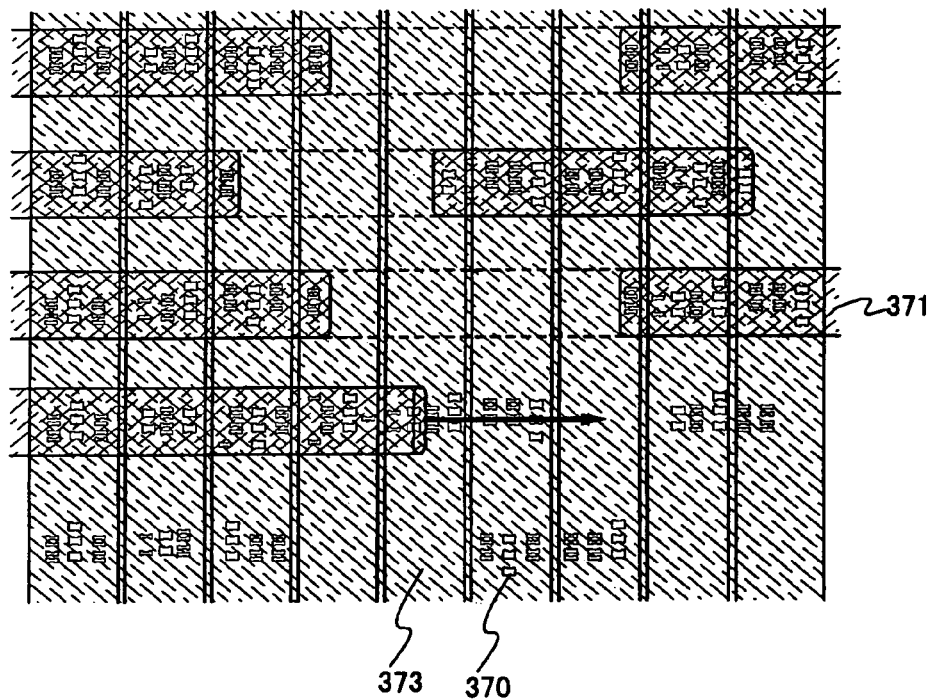

FIG. 23B shows an exemplary relation between a configuration of a mask used for patterning the semiconductor film and an area irradiated with the laser light in a case where two laser irradiation processes are performed. A reference numeral 370 denotes a configuration of the mask used for patterning the semiconductor film. After crystallization by the laser irradiations, the semiconductor film is patterned using the mask.

A reference numeral 373 denotes an area irradiated with a first laser light. Although the first laser light is irradiated on the overall surface of the semiconductor film in this embodiment, the laser light may be locally applied such that at least a portion forming an active layer after patterning may be crystallized. It is critical that the portion forming the active layer after patterning is not overlapped by an edge of the beam spot.

A reference numeral 371 denotes a portion irradiated with a second laser light. A broken line denotes a portion where the laser light is blocked by the shutter. Thus, the embodiment is arranged such that the portion where crystallization is not required is not irradiated with the laser light or irradiated with light of a reduced energy density. Accordingly, the substrate may be further reduced in damage caused by the laser light irradiated on an unwanted portion thereof.

In an alternative approach, the first laser light may be locally irradiated and the second laser light may be irradiated on the overall surface of the semiconductor film.

Next, description is made on a process for fabricating a semiconductor display unit including a pixel portion, signal line drive circuit and scanning line drive circuit, the process wherein the shutter is used for selectively subjecting the pixel portion, the signal line drive circuit and the scanning line drive circuit to a single laser irradiation process.

Figure 6A:
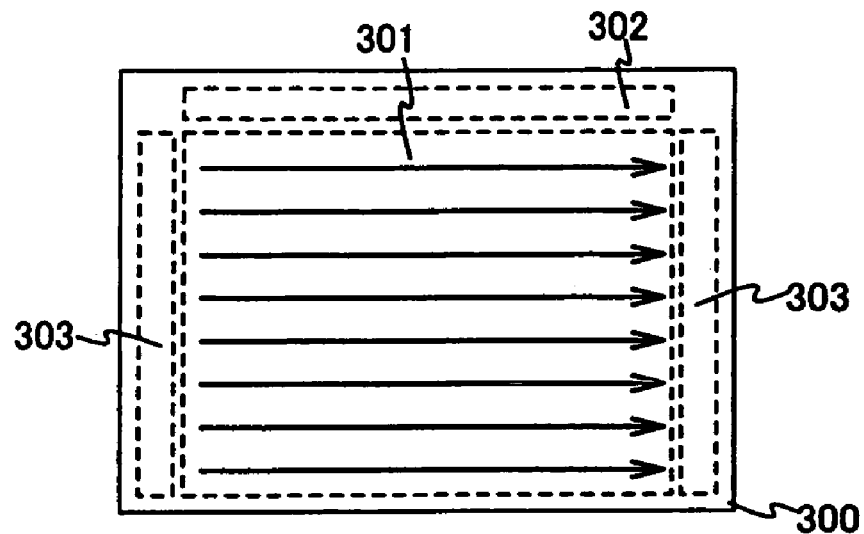
FIGS. 6A and 6B is are diagrams showing a movement direction of laser light on an irradiation object.

As shown in FIG. 6A, the laser light is scanned along a direction of an arrow in the figure thereby exposing the signal line drive circuit 302 and the pixel portion 301 to the laser light. In this process, the laser light is not irradiated on the overall surface of the substrate. The shutter is used for blocking the laser light thereby obviating the light irradiation on the scanning line drive circuit 303.

Figure 6B:
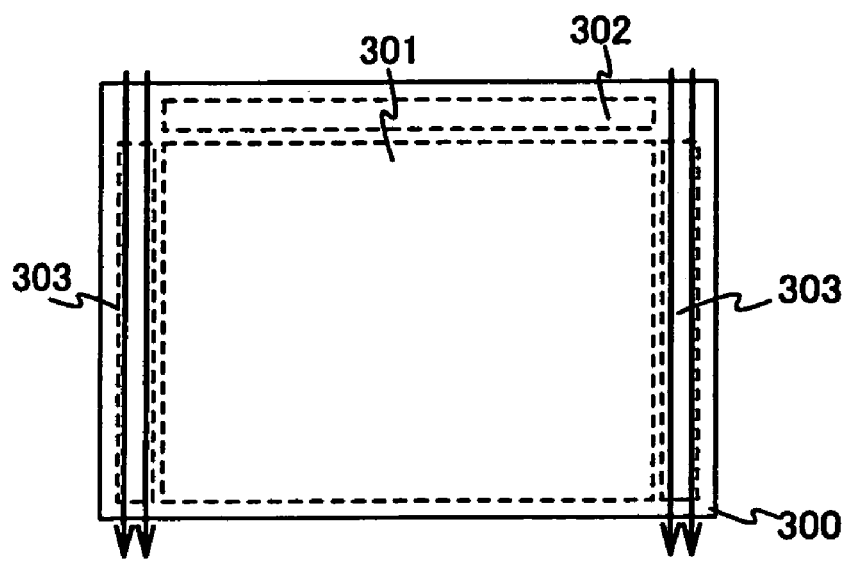

Next, as shown in FIG. 6B, the laser light is scanned along a direction of an arrow in the figure thereby exposing the scanning line drive circuit 303 to the laser light. In this process, the signal line drive circuit 302 and the pixel portion 301 are not exposed to the laser light.

Figure 33A:
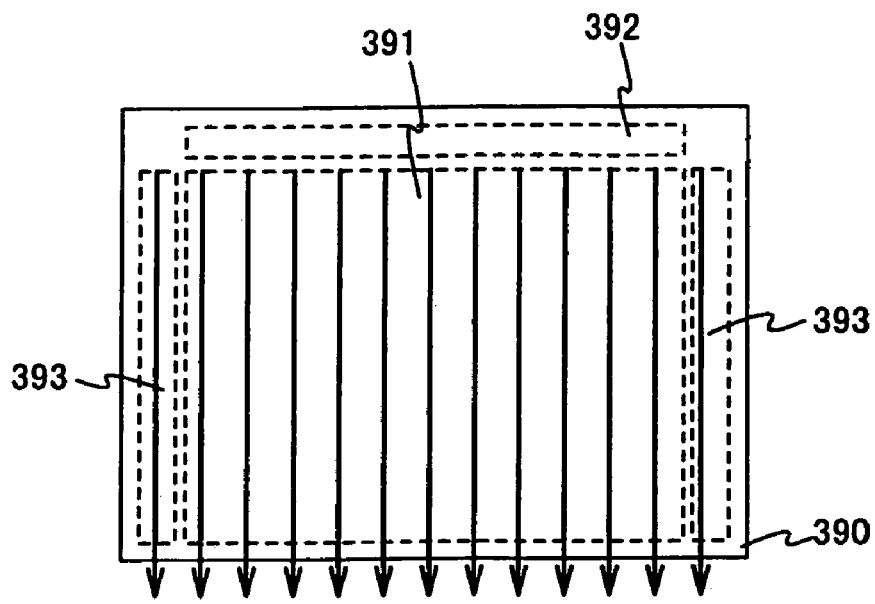
FIGS. 33A and 33B are diagrams showing a movement direction of the laser light on an irradiation object.
Figure 33B:
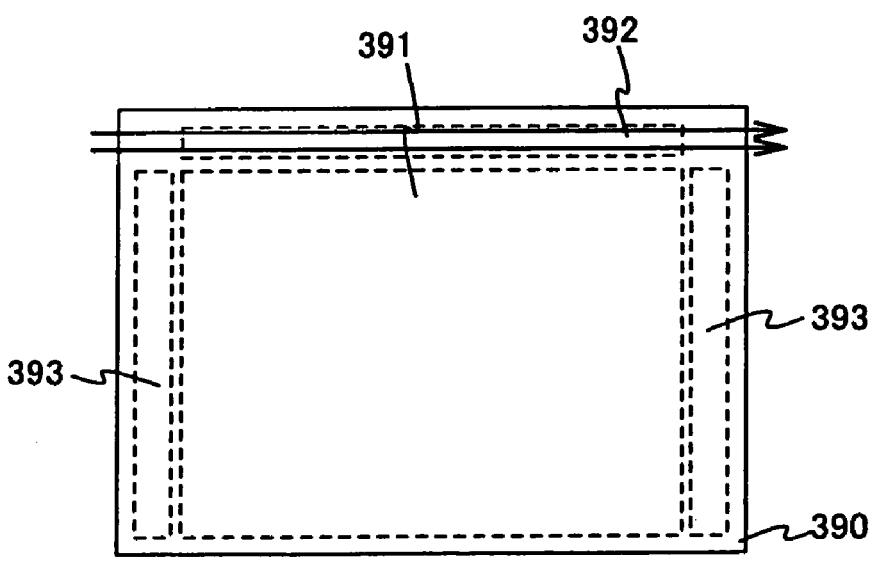

Next, referring to FIGS. 33A and 33B, description is made on another example where the shutter is used for selectively subjecting the pixel portion, the signal line drive circuit and the scanning line drive circuit to a single laser irradiation process.

As shown in FIG. 33A, the laser light is scanned along a direction of an arrow in the figure, thereby exposing a scanning line drive circuit 393 and a pixel portion 391 to the laser light. In this Process, the laser light is not irradiated on the overall surface of the substrate and the shutter is used for blocking the laser light thereby obviating the light irradiation on a signal line drive circuit 392.

Next, as shown in FIG. 33B, the laser light is scanned along a direction of an arrow in the figure thereby exposing the signal line drive circuit 392 to the laser light. In this process, the signal line drive circuit 393 and the pixel portion 391 are not exposed to the laser light.

The shutter may be used in this manner for selectively irradiating the laser light so that the scanning direction of the laser light on each circuit may be changed according to the layout of the channel forming regions of the active layers in each circuit. This prevents double laser irradiation on the same circuit, thus negating the need for restrictions on the definition of the laser light path and on the layout of the active layers in order to prevent the edge of the second laser light from overlapping the laid out active layers.

Next, description is made on an example where a plurality of panels are formed from a large substrate and the shutter is used for selectively subjecting the pixel portion, the signal line drive circuit and the scanning line drive circuit to a single laser irradiation process.

Figure 37:
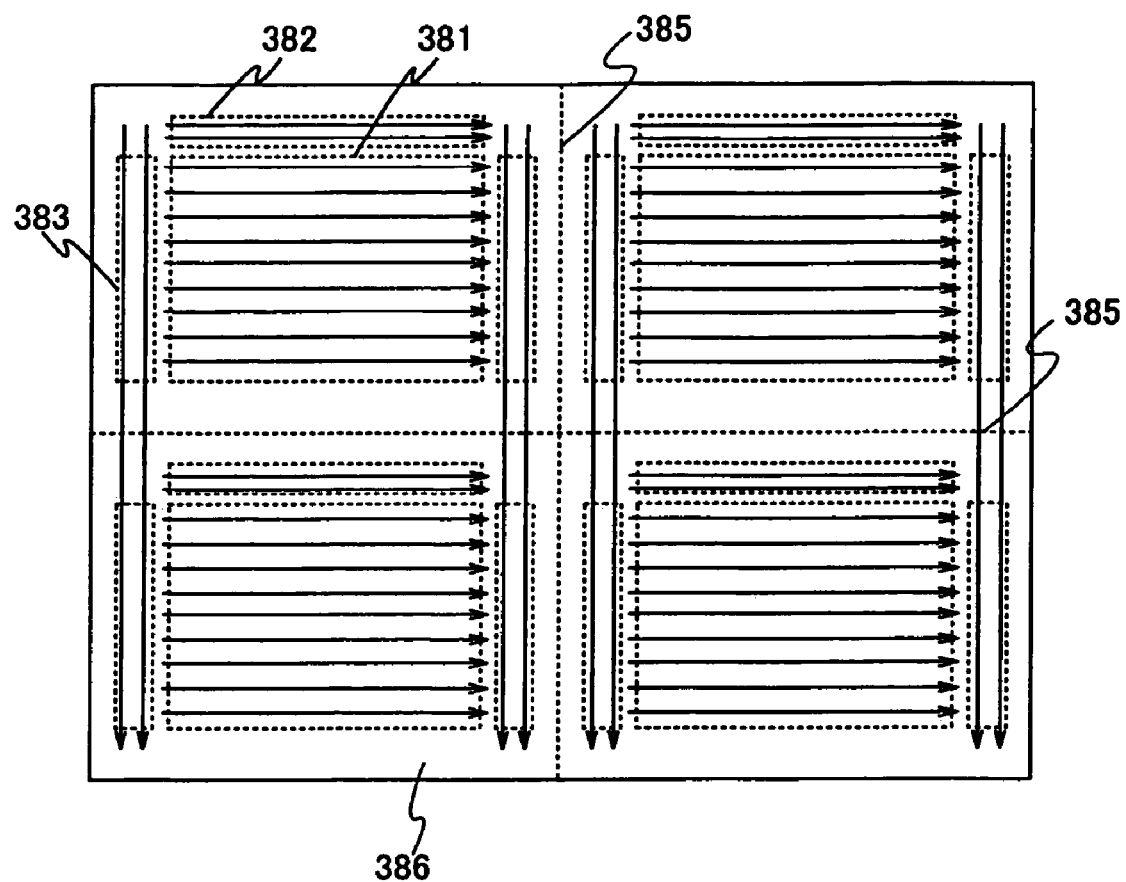
FIG. 37 is a diagram showing a movement direction of the laser light on an irradiation object.

First, as shown in FIG. 37, the laser light is scanned along a direction of an arrow in the figure thereby exposing a signal line drive circuit 382 and a pixel portion 381 of each panel to the laser light. In this process, the laser light is not irradiated on the overall surface of the substrate and the shutter is used for blocking the laser light thereby obviating the light irradiation on a scanning line drive circuit 383.

Next, the laser light is scanned along a direction of an arrow in the figure, thereby exposing the scanning line drive circuit 383 to the laser light. In this process, the signal line drive circuit 382 and the pixel portion 381 are not exposed to the laser light. Incidentally, a reference numeral 385 denotes a scribe line on a substrate 386.

This embodiment may be implemented in combination with any one of. Embodiments 1 to 4.

Embodiment 6

In this embodiment, there will be described an example of a marker provided on a marker forming portion 463.

Figure 24A:
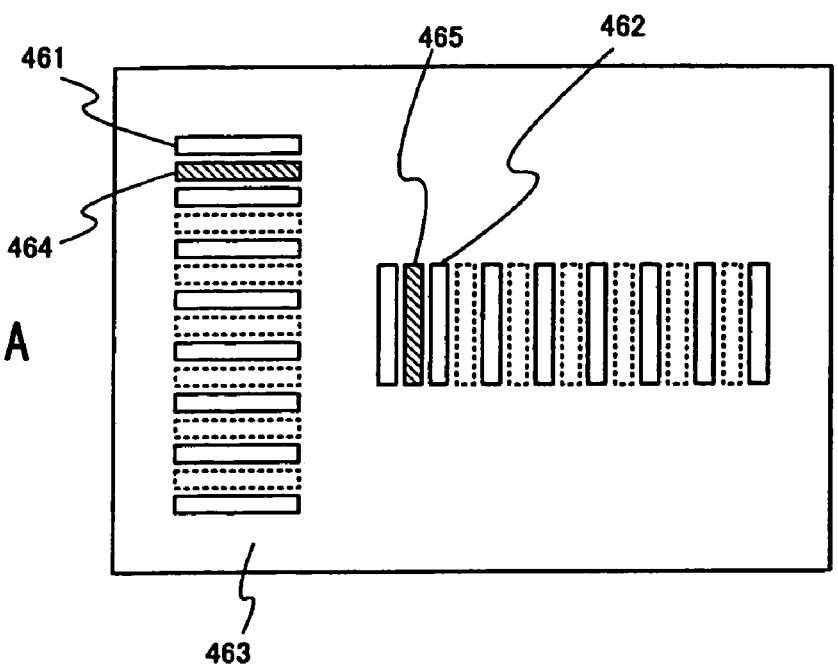
FIGS. 24A and 24B are diagrams showing a structure of a marker.

FIG. 24A shows the top view of markers of this embodiment. Reference numerals 461 and 462 denote markers (hereinafter referred to as the "reference markers") that will function as reference points formed in a semiconductor film, with each of the reference markers having a rectangular shape. All of the reference markers 461 are disposed so that long sides of the rectangles extend in the horizontal direction, with respective reference markers 461 being disposed in the vertical direction at regular intervals. All of the reference markers 462 are disposed so that long sides of the rectangles extend in the vertical direction, with respective reference markers 462 being disposed in the horizontal direction at regular intervals.

The reference markers 461 become reference points with reference to which there are determined the positions of the masks in the vertical direction, while the reference markers 462 become reference points with reference to which there are determined the positions of the masks in the horizontal direction. Reference numerals 464 and 465 denote markers for the masks for patterning the semiconductor film, with each of the markers having a rectangular shape. The positions of the masks for the semiconductor patterning are determined so that the long sides of the rectangular marker 464 are disposed in the horizontal direction and the long sides of the rectangular marker 465 are disposed in the vertical direction. In addition, the positions of the masks for the semiconductor patterning are determined so that the masks are precisely positioned at the center between two adjacent reference markers 461 that determine the markers 464 and are also precisely positioned at the center between two adjacent reference markers 462 that determine the markers 465.

Figure 24B:
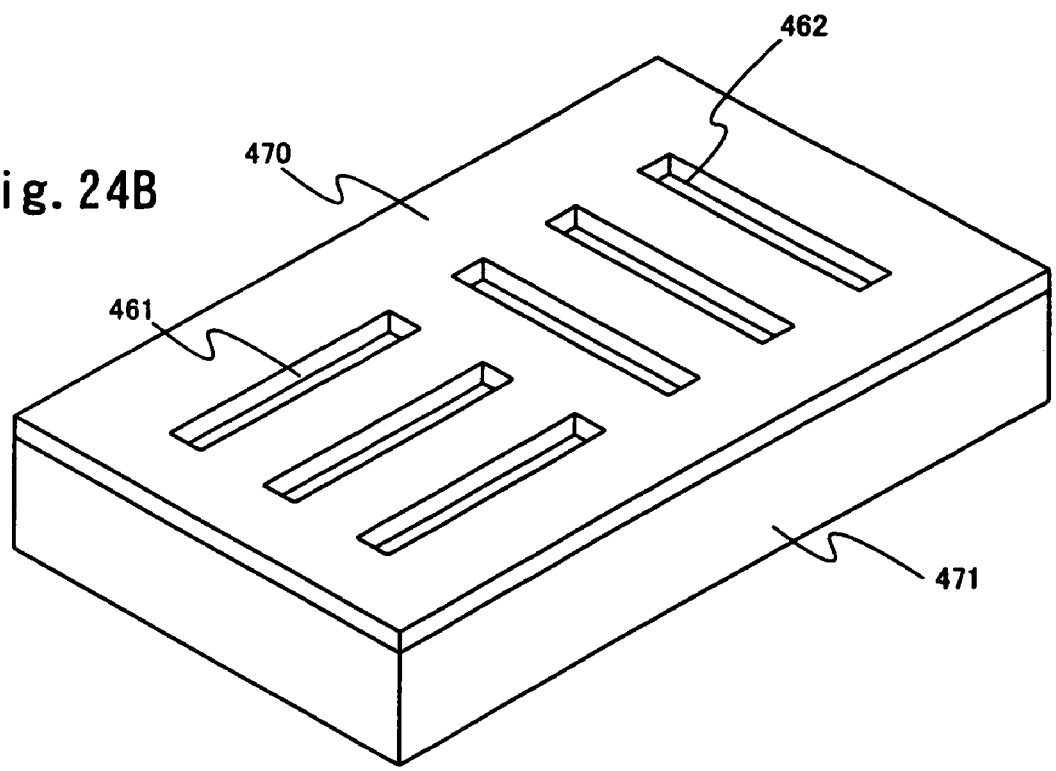

FIG. 24B is a perspective view of the reference markers formed in the semiconductor film. Parts of the semiconductor film 470 formed on the substrate 471 are cut away by a laser in a rectangular shape and the cut-away portions function as the reference markers 461 and 462.

It should be noted here that the markers described in this embodiment are just an example and the markers of the present invention are not limited to these markers. There occurs no problem so long as it is possible to form the markers of the present invention prior to the crystallization of the semiconductor film with the laser beams and also to use the markers even after the crystallization by the irradiation of the laser beams.

It is possible to implement this embodiment in combination with Embodiments 1 to 5.

Embodiment 7

In this embodiment, a method of manufacturing an active matrix substrate when the semiconductor film is crystallized in the case that a laser beam is irradiated two times will be described with reference to FIGS. 25A to 25C, 26A to 26C, 27A to 27C and 28. A substrate on which a CMOS circuit, a driver circuit, and a pixel portion having a pixel TFT and a retention capacity are formed together is referred to as an active matrix substrate for convenience.

First of all, a substrate 600 formed of glass such as barium borosilicate glass and aluminum borosilicate glass is used in this embodiment. The substrate 600 may be a quartz substrate, a silicon substrate, a metal substrate or stainless substrate, which has an insulating film on the surface. The substrate 600 may be a plastic substrate having heat resistance, which withstands a processing temperature in this embodiment.

Next, a base film 601 comprising of a silicon oxide film, a silicon nitride film, or a silicon oxynitride film is formed on the substrate 601 by publicly known method (such as the sputtering method, LPCVD method and plasma CVD method). In this embodiment, as a base film 601, two-layer base film 601a and 601b are used, however, a single layer of the insulating film or two or more laminated layers may also be used (FIG. 25A).

Next, an amorphous semiconductor film 692 is formed on the substrate 601 by publicly known method (such as the sputtering method, LPCVD method and plasma CVD method) to have a thickness of 25 to 80 nm (preferably, 30 to 60 nm) (FIG. 25A). In this embodiment, an amorphous semiconductor film is formed. However, micro-crystalline semiconductor film and crystalline semiconductor film may be formed. In addition, a compound semiconductor film having an amorphous structure such as an amorphous silicon germanium film may be used.

The amorphous semiconductor film 692 is crystallized by using the laser crystallization. The laser crystallization is conducted by using the laser apparatus of the present invention. In the present invention, the amorphous semiconductor film is irradiated the laser beam two times according to a mask information inputted into CPU of the laser apparatus. Of course, the crystallization may be conducted by using not only the laser crystallization, but also being combined with another known crystallization method (thermal crystallization method using RTA and an annealing furnace or using metal elements promoting crystallization).

When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a wavelength of 532 nm) or the third harmonic (with a wavelength of 355 nm) of an Nd:YVO$_4$ laser (basic wave of 1064 nm) is applied. Specifically, laser beams emitted from the continuous oscillation type YVO$_4$ laser with 10 W output is converted into a harmonic by using the non-linear optical elements. Also, a method of emitting a harmonic by applying crystal of YVO$_4$ and the non-linear optical elements into a resonator. Then, more preferably, the laser beams are formed so as to have a rectangular shape or an elliptical shape by an optical system, thereby irradiating a substance to be treated. At this time, the energy density of approximately 0.01 to 100 MW/cm$^2$ (preferably 0.1 to 10 MW/cm$^2$) is required. The semiconductor film is moved at approximately 10 to 2000 cm/s rate relatively corresponding to the laser beams so as to irradiate the semiconductor film.

Note that, for a two times laser irradiation, a gas laser or solid-state laser of continuous oscillation type or pulse oscillation type can be used. The gas laser such as an excimer laser, Ar laser, Kr laser and the solid-state laser such as YAG laser, YVO$_4$ laser, YLF laser, YAlO$_3$ laser, glass laser, ruby laser, alexandrite laser, Ti: sapphire laser, Y$_2$O$_3$ laser can be used as the laser beam. Also, crystals such as YAG laser, YVO$_4$ laser, YLF laser, YAlO$_3$ laser wherein Cr, Nd, Er, Ho, Ce, Co, Ti, Yb or Tm is doped can be used as the solid-state laser. A basic wave of the lasers is different depending on the materials of doping, therefore a laser beam having a basic wave of approximately 1 µm is obtained. A harmonic corresponding to the basic wave can be obtained by the using non-linear optical elements.

By the above-mentioned laser crystallization, the regions 693, 694, and 695 are formed that is increased the crystallinity by two times laser irradiation with respect to the amorphous semiconductor film (FIG. 25B).

The island like semiconductor films 602 to 606 are formed from the crystallized regions 693, 694, and 695 by performing patterning processing the crystallized semiconductor film into desired shape that is increased the crystallinity in part (FIG. 25C).

After the island like semiconductor films 602 to 606 are formed, a small amount of impurity element (boron or phosphorus) may be doped in order to control a threshold value of the TFT.

Next, a gate insulating film 607 covering the island like semiconductor films 602 to 606 is formed. The gate insulating film 607 is formed by using an insulating film containing silicon with a thickness of 40 to 150 nm by using plasma CVD method or sputtering method. In this embodiment, a silicon oxynitride film (compositional ratio: Si=32%, O=59%, N=7% and H=2%) with a thickness of 110 nm is formed by the plasma CVD method. Notably, the gate insulating film is not limited to the silicon oxynitride film but an insulating film containing other silicon may be used as a single layer or as a laminated pad.

When a silicon oxide film is used, it is formed by mixing Tetraethyl Orthosilicate (TEOS) and O$_2$ by plasma CVD method, which is discharged under a condition with reaction pressure of 40 Pa, a substrate temperature of 300 to 400° C. and high frequency (13.56 MHz) power density of 0.5 to 0.8 W/cm$^2$. Thermal annealing at 400 to 500° C. thereafter can give good characteristics to the silicon oxide film produced in this way as a gate insulating film.

Next, a first conductive film 608, which is 20 to 100 nm in thickness, and a second conductive film 609, which is 100 to 400 nm in thickness, is stacked on the gate insulating film 607. In this embodiment, the first conductive film 608 formed by a TaN film with a thickness of 30 nm and the second conductive film 609 formed by a W film with a thickness of 370 nm are stacked. The TaN film is formed by using Ta target to perform sputtering in an atmosphere containing nitrogen. The W film is formed by using W target to perform sputtering. Alternatively, it can be formed by thermal CVD method using tungsten hexafluoride (WF$_6$). In both cases, the use of the gate electrode needs low resistance. Therefore, the resistivity of the W film is desirably 20 μΩcm or less. The low resistance of the W film can be achieved by increasing the size of the crystal grains. However, when the W film contains a large amount of impurity element such as oxygen, the crystallization is inhibited, which raises the resistance. Accordingly, in this embodiment, the W film is formed by the sputtering method using high purity (purity of 99.9999%) W target and by taking the prevention of intrusion of impurity from a vapor phase during the film forming into special consideration. Thus, the resistivity of 9 to 20 μΩcm can be achieved.

While, in this embodiment, the first conductive film 608 is TaN and the second conductive film 609 is W, they are not limited in particular. Both of them can be formed by an element selected from Ta, W, Ti, Mo, Al, Cu, Cr and Nd or an alloy material or a compound material mainly containing the element. Alternatively, a semiconductor film, such as a polycrystalline silicon film to which an impurity element such as phosphorus is doped, can be used. An AgPdCu alloy may be used. A combination of the first conductive film formed by a tantalum (Ta) film and the second conductive film formed by a W film, a combination of the first conductive film formed by a titan nitride (TiN) film and the second conductive film formed by a W film, a combination of the first conductive film formed by a tantalum nitride (TaN) film and the second conductive film formed by a W film, a combination of the first conductive film formed by a tantalum nitride (TaN) film and the second conductive film formed by an Al film, or a combination of the first conductive film formed by a tantalum nitride (TaN) film and the second conductive film formed by a Cu film is possible.

Further, the present invention is not limited to a two-layer structure. For example, a three-layer structure may be adopted in which a tungsten film, an alloy film of aluminum and silicon (Al—Si), and a titanium nitride film are sequentially laminated. Moreover, in case of a three-layer structure, tungsten nitride may be used in place of tungsten, an alloy film of aluminum and titanium (Al—Ti) may be used in place of the alloy film of aluminum and silicon (Al—Si), and a titanium film may be used in place of the titanium nitride film.

Note that, it is important that appropriate etching method or kinds of etchant is properly selected depending on the materials of a conductive film.

Next, masks 610 to 615 made of resist using photolithography method are formed, and first etching processing is performed thereon in order to form electrodes and wires. The first etching processing is performed under first and second etching conditions (FIG. 26B). The first etching condition in this embodiment is to use Inductively Coupled Plasma (ICP) etching and to use CF$_4$ and Cl$_2$ and O$_2$ as an etching gas, whose amount of gases are 25/25/10 (sccm), respectively. 500 W of RF (13.56 MHz) power was supplied to a coil type electrode by 1 Pa pressure in order to generate plasma and then to perform etching. 150 W of RF (13.56 MHz) power was also supplied to a substrate side (test sample stage) and substantially negative self-bias voltage was applied. The W film was etched under the first etching condition so as to obtain the end of the first conductive layer in a tapered form.

After that, the first etching condition is shifted to the second etching condition without removing the masks 610 to 615 made of resist. Then, CF$_4$ and Cl$_2$ are used as etching gases. The ratio of the amounts of flowing gasses is 30/30 (sccm). 500 W of RF (13.56 MHz) power is supplied to a coil type electrode by 1 Pa pressure in order to generate plasma and then to perform etching for amount 30 seconds. 20 W of RF (13.56 MHz) power is also supplied to a substrate side (test sample stage) and substantially negative self-bias voltage is applied. Under the second etching condition where CF$_4$ and Cl$_2$ are mixed, both W film and TaN film were etched to the same degree. In order to etch without leaving a residue on the gate insulating film, the etching time may be increased 10 to 20% more.

In the first etching processing, when the shape of the mask made of resist is appropriate, the shape of the ends of the first and the second conductive layers are in the tapered form due to the effect of the bias voltage applied to the substrate side. The angle of the tapered portion is 15 to 45°. Thus, conductive layers 617 to 622 in a first form are formed which include the first conductive layers and the second conductive layers (first conductive layers 617a to 622a and second conductive layer 617b to 622b) through the first etching processing. In a gate insulating film 616, an area not covered by the conductive layers 617 to 622 in the first form is etched by about 20 to 50 nm so as to form a thinner area.

Next, second etching processing is performed without removing masks made of resist (FIG. 26C). Here, CF$_4$, Cl$_2$ and O$_2$ are used as an etching gas to etch the W film selectively. Then, second conductive layers 628b to 633b are formed by the second etching processing. On the other hand, the first conductive layers 617a to 622a are hardly etched, and conductive layers 628 to 633 in the second form are formed.

First doping processing is performed without removing masks made of resist and low density of impurity element, which gives n-type to the semiconductor film, is added. The doping processing may be performed by the ion-doping method or the ion-implanting method. The ion doping method is performed under a condition in the dose of $1 \times 10^{13}$ to $5 \times 14$ atoms/cm$^2$ and the accelerating voltage of 40 to 80 kV. In this embodiment, the ion doping method is performed under a condition in the dose of $1.5 \times 10^{13}$ atoms/cm$^2$ and the accelerating voltage of 60 kV. The n-type doping impurity element may be Group 15 elements, typically phosphorus (P) or arsenic (As). Here, phosphorus (P) is used. In this case, the conductive layers 628 to 633 function as masks for the n-type doping impurity element. Therefore, impurity areas 623 to 627 are formed in the self-alignment manner. An n-type doping impurity element in the density range of $1 \times 10^{18}$ to $1 \times 10^{20}$ atoms/cm$^2$ are added to the impurity areas 623 to 627.

When masks made of resist are removed, new masks 634a to 634c made of resist are formed. Then, second doping processing is performed by using higher accelerating voltage than that used in the first doping processing. The ion doping method is performed under a condition in the dose of $1 \times 10^{13}$ to $1 \times 10^{15}$ atoms/cm$^2$ and the accelerating voltage of 60 to 120 kV. In the doping processing, the second conductive layers 628b to 632b are used as masks against the impurity element. Doping is performed such that the impurity element can be added to the semiconductor film at the bottom of the tapered portion of the first conductive layer. Then, third doping processing is performed by having lower accelerating voltage than that in the second doping processing to obtain a condition shown in FIG. 27A. The ion doping method is performed under a condition in the dose of $1\times10^{15}$ to $1\times10^{17}$ atoms/cm$^2$ and the accelerating voltage of 50 to 100 kV. Through the second doping processing and the third doping processing, an n-type doping impurity element in the density range of $1\times10^{18}$ to $5\times10^{19}$ atoms/cm$^3$ is added to the low density impurity areas 636, 642 and 648, which overlap with the first conductive layer. An n-type doping impurity element in the density range of $1\times10^{19}$ to $5\times10^{21}$ atoms/cm$^3$ is added to the high density impurity areas 635, 641, 644 and 647.

With proper accelerating voltage, the low density impurity area and the high density impurity area can be formed by performing the second doping processing and the third doping processing once.

Figures 27A, 27B, 27C:
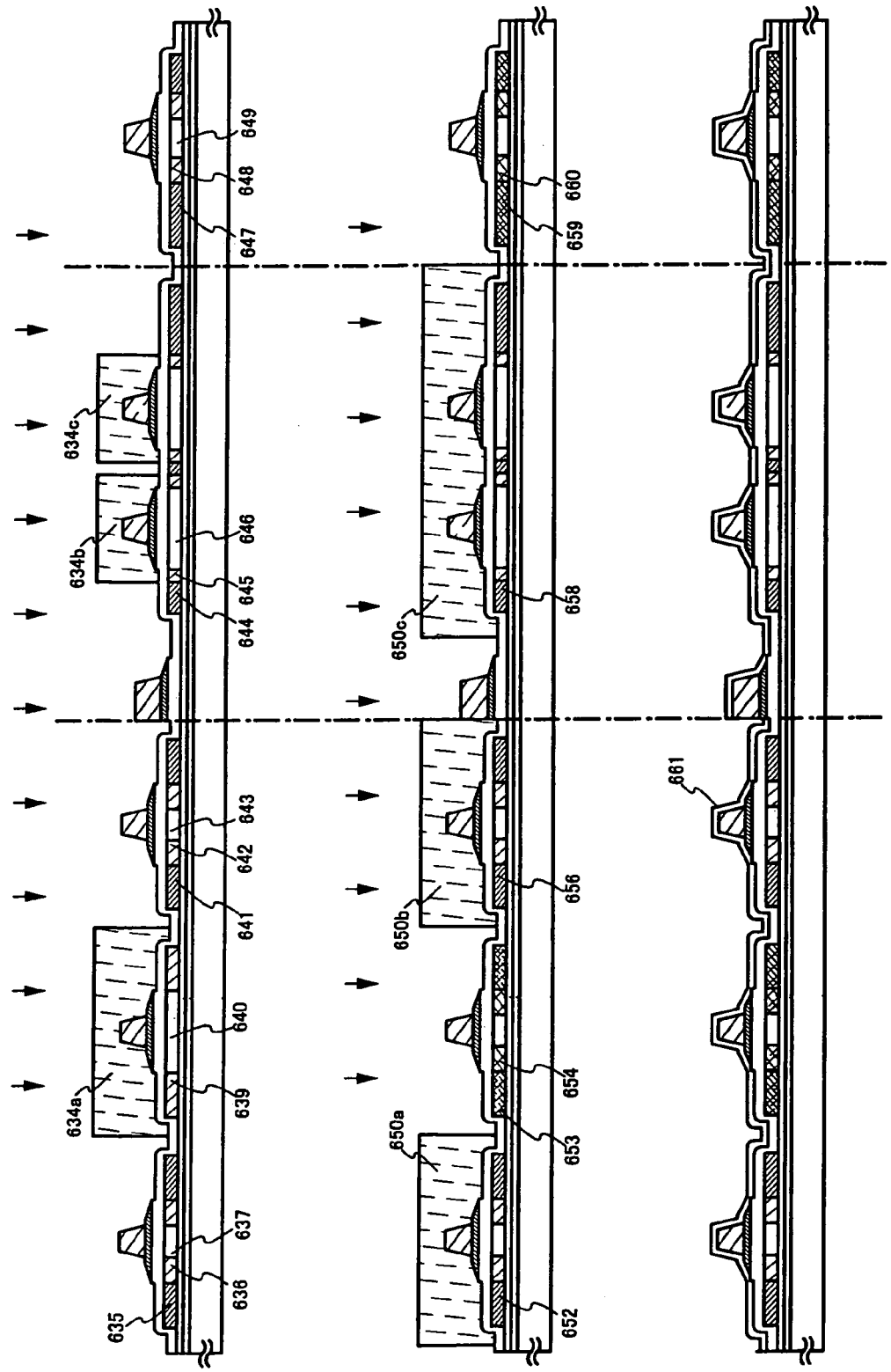
FIGS. 27A to 27C are diagrams showing the method for fabricating the semiconductor device using the semiconductor fabricating apparatus of the invention.

Next, after removing masks made of resist, new masks 650a to 650c made of resist are formed to perform the fourth doping processing. Through the fourth doping processing, impurity areas 653, 654, 659 and 660, to which an impurity element doping a conductive type opposite to the one conductive type is added, in a semiconductor layer, which is an active layer of a p-channel type TFT. Second conductive layers 628a to 632a are used as mask against the impurity element, and the impurity element giving p-type is added so as to form impurity areas in the self-alignment manner. In this embodiment, the impurity areas 653, 654, 659 and 660 are formed by applying ion-doping method using diborane ($B_2H_6$) (FIG. 27B). During the fourth doping processing, the semiconductor layer forming the n-channel TFT is covered by masks 650a to 650c made of resist. Thorough the first to the third doping processing, phosphorus of different densities is added to each of the impurity areas 653, 654, 659 and 660. Doping processing is performed such that the density of p-type doping impurity element can be $1\times10^{19}$ to $5\times10^{21}$ atoms/cm$^3$ in both areas. Thus, no problems are caused when they function as the source region and the drain region of the p-channel TFT.

Impurity areas are formed in the island like semiconductor layers, respectively, through the processes above.

Next, the masks 650a to 650c made of resist are removed and a first interlayer insulating film 661 is formed thereon. The first interlayer insulating film 661 may be an insulating film with a thickness of 100 to 200 nm containing silicon, which is formed by plasma CVD method or sputtering method. In this embodiment, silicon oxynitride film with a thickness of 150 nm is formed by plasma CVD method. The first interlayer insulating film 661 is not limited to the silicon oxynitride film but may be the other insulating film containing silicon in a single layer or in a laminated pad.

Next, as shown in FIG. 27C, activation processing is performed by using laser irradiation method. When a laser annealing method is used, the laser used in the crystallization can be used. When the activation processing is performed, the moving speed is same as the crystallization, and an energy density of about 0.01 to 100 MW/cm$^2$ (preferably, 0.01 to 10 MW/cm$^2$) is required. Also, a continuous oscillation laser may be used in the case the crystallization is performed and a pulse oscillation laser may be used in the case the activation is performed.

Also, the activation processing may be conducted before the first interlayer insulating film is formed.

After the heating processing (thermal processing at 300 to 550° C. for 1 to 12 hours) is performed, hydrogenation can be performed. This process terminates the dangling bond of the semiconductor layer with hydrogen contained in the first interlayer insulating film 661. Alternatively, the hydrogenation may be plasma hydrogenation (using hydrogen excited by plasma) or heating processing in an atmosphere containing 3 to 100% of hydrogen at 300 to 650° C. for 1 to 12 hours.

Next, a second interlayer insulating film 662 formed by an inorganic insulating material or an organic insulator material is formed on the first interlayer insulating film 661. Subsequently, the third interlayer insulating film 672 is formed to contact with the second interlayer insulating film 662 after the second interlayer insulating film is formed.

Figure 28:
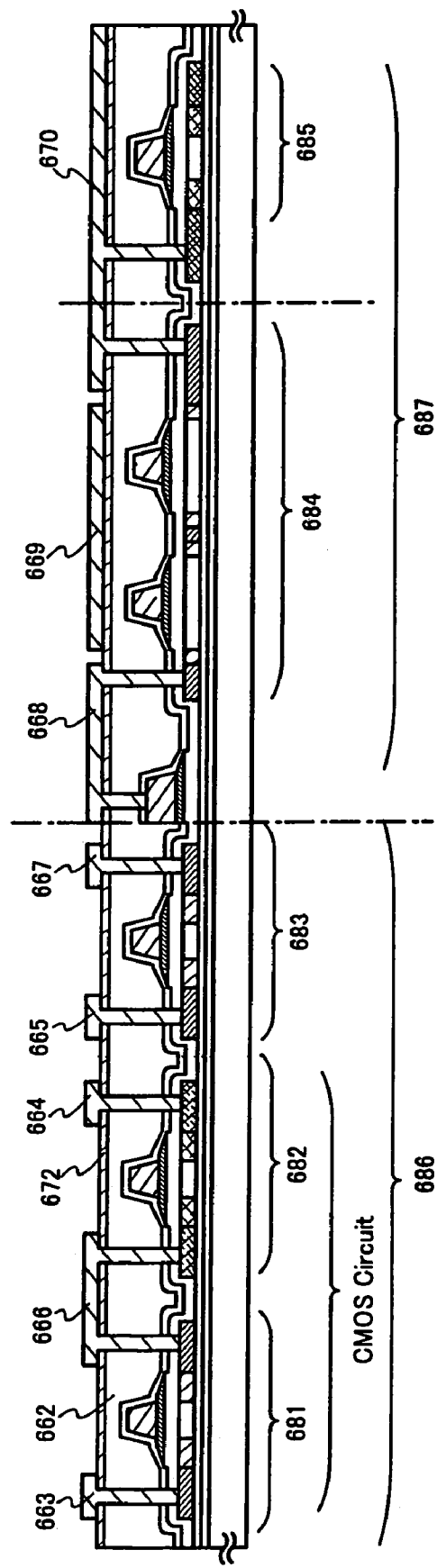
FIG. 28 is a diagram showing the method for fabricating the semiconductor device using the semiconductor fabricating apparatus of the invention.

Wirings 663 to 667 electrically connecting to impurity areas, respectively, are formed in a driver circuit 686. These wirings are formed by patterning a film laminating a Ti film with a thickness of 50 nm and an alloy film (alloy film of Al and Ti) with a thickness of 500 nm. It is not limited to the two-layer structure but may be a one-layer structure or a laminate pad including three or more layers. The materials of the wirings are not limited to Al and Ti. For example, the wiring can be formed by forming Al or Cu on a TaN film and then by patterning the laminate film in which a Ti film is formed (FIG. 28).

In a pixel portion 687, a pixel electrode 670, a gate wiring 669 and a connecting electrode 668 are formed. Source wirings (a laminate of layers 643a and 643b) are electrically connected with a pixel TFT by the connecting electrode 668. The gate wiring 669 is electrically connected with a gate electrode of the TFT pixel 684. A pixel electrode 670 is electrically connected with a drain region 642 of the pixel TFT. Furthermore, the pixel electrode 670 is electrically connected with an island-like semiconductor film 658 functioning as one electrode forming a storage capacitor. Desirably, a material having excellent reflectivity such as a film mainly containing Al or Ag or the laminate film is used for the pixel electrode 671.

In this way, the driver circuit 686 having a CMOS circuit including an n-channel TFT 681 and a p-channel TFT 682 and a n-channel TFT 683, and the pixel portion 687 having the pixel TFT 684 and the retention capacitor 685 can be formed on the same substrate. Thus, an active matrix substrate is completed.

The n-channel TFT 681 of the driver circuit 686 has a channel forming region 637, a low density impurity area 636 overlapping with the first conductive layer 628a, which constructs a part of the gate electrode (GOLD area), and a high density impurity area 652 functioning as the source region or the drain region are implanted. The p-type channel TFT 682 forming a CMOS circuit together with the n-channel TFT 681, which are connected by an electrode 666, has a channel forming region 640, a high density impurity area 653 functioning as the source region or the drain region, and an impurity area 654 to which a p-type doping impurity element are implanted. The n-channel TFT 683 has a channel forming region 643, a low density impurity area 642 overlapping with the first conductive layer 630a, which constructs a part of the gate electrode, (GOLD area), and a high density impurity area 656 functioning as the source region or the drain region.

The pixel TFT 684 of the pixel portion has a channel forming region 646, a low density impurity area 645 formed outside of the gate electrode (LDD region) and a high density impurity area 658 functioning as the source region or the drain region. An n-type doping impurity element and a p-type doping impurity element are added to a semiconductor layer functioning as one electrode of the storage capacitor 685. The storage capacitor 685 is formed by an electrode (a laminate of layers 632a and 632b) and a semiconductor layer by using the insulating film 616 as a dielectric.

The pixel structure in this embodiment is arranged such that light can be blocked in a space between pixel electrodes and the ends of the pixel electrodes can overlap with the source wiring without using the black matrix.

This embodiment can be implemented by combining with Embodiments 1 to 6.

Embodiment 8

Figure 29:
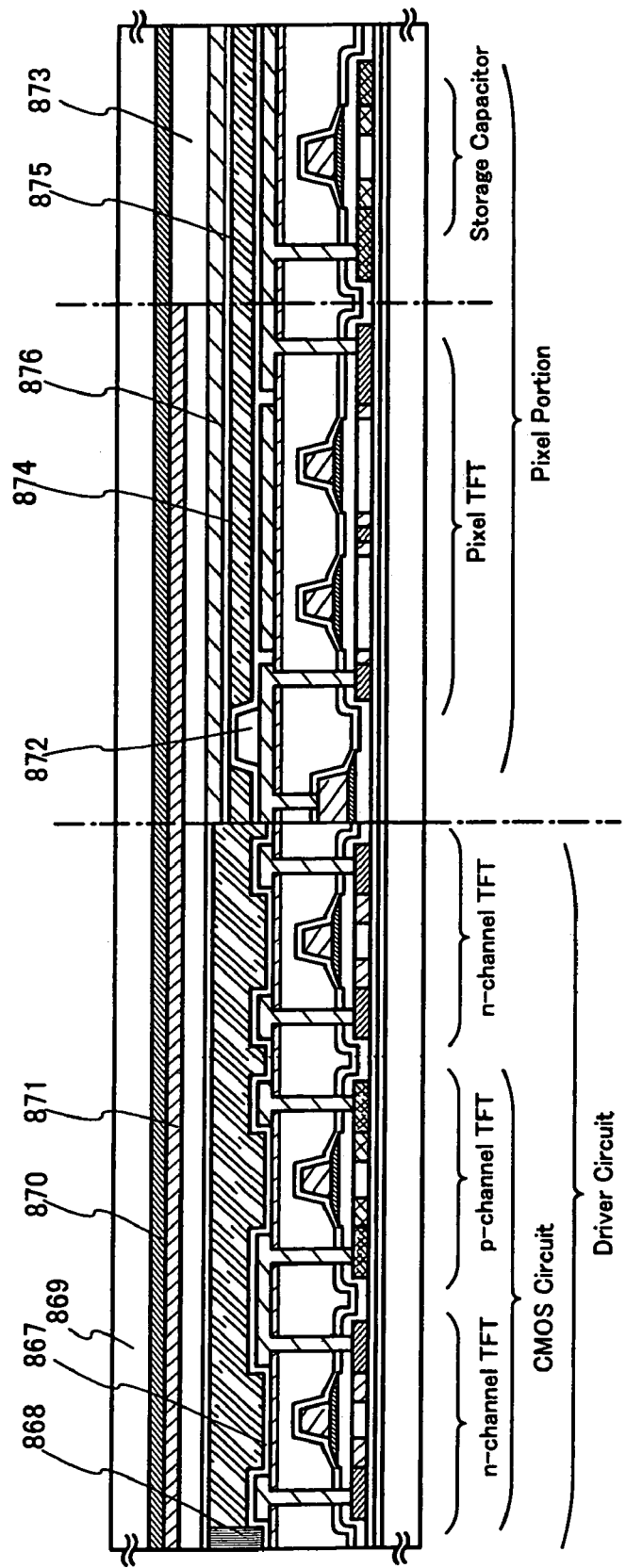
FIG. 29 is a diagram showing a liquid crystal display unit fabricated using the semiconductor fabricating apparatus of the invention.

This embodiment explains, below, a process to manufacture a reflection type liquid crystal display device from the active matrix substrate made in Embodiment 7, using FIG. 29.

First, after obtaining an active matrix substrate in the state of FIG. 28 according to Embodiment 7, an orientation film 867 is formed at least on the pixel electrodes 670 on the active matrix substrate of FIG. 28 and subjected to a rubbing process. Incidentally, in this embodiment, prior to forming an orientation film 867, an organic resin film such as an acryl resin film is patterned to form columnar spacers 872 in a desired position to support the substrates with spacing. Meanwhile, spherical spacers, in place of the columnar spacers, may be distributed over the entire surface of the substrate.

Then, a counter substrate 869 is prepared. Then, coloring layers 870, 871 and a planarizing film 873 are formed on a counter substrate 869. A shade portion is formed by overlapping a red coloring layer 870 and a blue coloring layer 871 together. Meanwhile, the shade portion may be formed by partly overlapping a red coloring layer and a green coloring layer.

In this embodiment is used a substrate shown in Embodiment 7. There is a need to shade at least the gap between the gate wiring 669 and the pixel electrode 670, the gap between the gate wiring 669 and the connecting electrode 668, and the gap between the connecting electrode 668 and the pixel electrode 670. In this embodiment were bonded together the substrates by arranging the coloring layers so that the shading portion having a lamination of coloring layers is overlapped with the to-be-shading portion.

In this manner, the gaps between the pixels are shaded by the shading portion having a lamination of coloring layers without forming a shading layer such as a black mask, thereby enabling to reduce the number of processes.

Then, a counter electrode 876 of a transparent conductive film is formed on the planarizing film 873 at least in the pixel portion. An orientation film 874 is formed over the entire surface of the counter substrate and subjected to a rubbing process.

Then, the active matrix substrate formed with the pixel portion and driver circuit and the counter substrate are bonded together by a seal member 868. The seal member 868 is mixed with filler so that the filler and the columnar spacers bond together the two substrates through an even spacing. Thereafter, a liquid crystal material 875 is poured between the substrates, and completely sealed by a sealant (not shown). The liquid crystal material 875 may be a known liquid crystal material. In this manner, completed is a reflection type liquid crystal display device shown in FIG. 29. If necessary, the active matrix substrate or counter substrate is divided into a desired shape. Furthermore, a polarizing plate (not shown) is bonded only on the counter substrate. Then, an FPC is bonded by a known technique.

The liquid crystal display device manufactured as above comprises TFT manufactured by a semiconductor film, wherein a laser beam having a periodic or uniform energy distribution is irradiated and a crystal grain with a large grain size is formed. Thus, the liquid crystal display device ensures a good operational characteristic and high reliability. The liquid crystal display device can be used as a display portion for an electronic appliance in various kinds.

Incidentally, this embodiment can be implemented by combining with Embodiments 1 to 7.

Embodiment 9

This embodiment explains an example of manufacturing a light emitting device by using a method of manufacturing TFT when an active matrix substrate is fabricated in the Embodiment 7. In this specification, the light-emitting device refers, generally, to the display panel having light-emitting elements formed on a substrate sealed between the substrate and a cover member, and the display module having TFTs or the like mounted on the display panel. Incidentally, the light emitting element has a layer including an organic compound that electroluminescence caused is obtained by applying an electric field (light emitting layer), an anode layer and a cathode layer. Meanwhile, the electroluminescence in compound includes the light emission upon returning from the singlet-excited state to the ground state (fluorescent light) and the light emission upon returning from the triplet-excited state to the ground state (phosphorous light), including any or both of light emission.

Note that, all the layers that are provided between an anode and a cathode in a light emitting element are defined as an organic light emitting layer in this specification. Specifically, the organic light emitting layer includes a light emitting layer, a hole injection layer, an electron injection layer, a hole transporting layer, an electron transporting layer, etc. A basic structure of a light emitting element is a laminate of an anode layer, a light emitting layer, and a cathode layer layered in this order. The basic structure can be modified into a laminate of an anode layer, a hole injection layer, a light emitting layer, and a cathode layer layered in this order, or a laminate of an anode layer, a hole injection layer, a light emitting layer, an electron transporting layer, and a cathode layered in this order.

The light emitting element comprising the hole injection layer, the electron injection layer, the hole transporting layer, and the electron transporting layer may be solely formed by inorganic compounds, or materials mixed with organic compounds and inorganic compounds. The light emitting element may be formed by mixture of these layers.

FIG. 30A is a sectional view of a light-emitting device of this embodiment manufactured up through the third interlayer insulating film 750. In FIG. 30A, the switching TFT 733 and the current controlling TFT 734 provided on the substrate 700 is formed by using the manufacturing method in Embodiment 7. Incidentally, although this embodiment is of a double gate structure formed with two channel forming regions, it is possible to use a single gate structure formed with one channel forming region or a triple gate structure formed with three channel forming regions.

The n-channel TFT 731 and the p-channel TFT 732 in the driver circuit provided on the substrate 700 is formed by using the manufacturing method in Embodiment 7. Incidentally, although this embodiment is of a single gate structure, it is possible to use a double gate structure or a triple gate structure.

In the case of the light-emitting device, the third interlayer insulating film 750 is effective to prevent water contained in the second interlayer insulating film 751 from penetrating into the organic light emitting layer. If the second interlayer insulating film 751 has organic resin material, providing the third interlayer insulating film 750 is effective because the organic resin materials contain water a lot.

Completed the manufacture process up through the step of forming the third interlayer insulating film in Embodiment 7, the pixel electrode 711 is formed on the third interlayer insulating film 750.

Meanwhile, reference numeral 711 is a pixel electrode (anode of a light-emitting element) formed by a transparent conductive film. As the transparent conductive film can be used a compound of indium oxide and tin oxide, a compound of indium oxide and zinc oxide, zinc oxide, tin oxide or indium oxide. A transparent conductive film added with gallium may also be used. The pixel electrode 711 is formed on a planar third interlayer insulating film 750 prior to forming the wirings. In this embodiment, it is very important to planarize the step due to the TFT by using the second interlayer insulating film 751 made of resin. A light emitting layer to be formed later, because being extremely thin, possibly causes poor light emission due to the presence of a step. Accordingly, it is desired to provide planarization prior to forming a pixel electrode so that a light emitting layer can be formed as planar as possible.

After the pixel electrode 711 is formed, contact holes are formed in the gate insulating film 752, the first interlayer insulating film 753, the second interlayer insulating film 751, the third interlayer insulating film 750, respectively. The conductive film is formed to overlap the pixel electrode 711 on the third interlayer insulating film 750, and the resist 760 is formed. Wirings 701 to 707 are formed connected electrically to each impurity region of TFT by etching the conductive film using the resist 760. Note that a lamination film of a 50 nm thick Ti film and a 500 nm thick alloy film (Al and Ti alloy film) is patterned in order to form the wirings. There are no limitations regarding the two layer structure, of course, and a single layer structure or a laminate structure having three or more layers may also be used. Further, the wiring material is not limited to Al and Ti. For example, a lamination film, in which Al or Cu is formed on a TaN film, and then a Ti film is formed, may be patterned, forming the wirings (FIG. 30A).

The wiring 707 is a source wiring (corresponding to the current supply line) of the current controlling TFT 734. Reference numeral 706 is an electrode that connects to the pixel electrode 711 by overlapping with the pixel electrode 711 of the current controlling TFT 734.

After forming wirings 701 to 707, the passivation film 712 is formed without removing resist 760 as shown in FIG. 30B. The passivation film 712 is formed to overlap the wirings 701 to 707, the third interlayer insulating film 750, and the resist 760. The passivation film 712 is composed of a silicon nitride film, a silicon oxynitride film, an aluminum nitride, or an insulating film containing aluminum oxynitride. The insulating films are used in a single layer or a combined lamination. A part of the pixel electrode 711 is exposed by etching the passivation film 712.

A light emitting layer 713 is formed on the pixel electrode 711. Incidentally, although FIG. 30B shows only one pixel, this embodiment separately forms light emitting layers correspondingly to the respective colors of R (red), G (green) and B (blue). Meanwhile, in this embodiment is formed a low molecular weight organic light-emitting material by the deposition method. Specifically, this is a lamination structure having a copper phthalocyanine (CuPc) film provided with a thickness of 20 nm as a hole injecting layer and a tris-8-qyuinolinolato aluminum complex ($Alq_3$) film provided thereon with a thickness of 70 nm as a light emitting layer. The color of emission light can be controlled by adding a fluorescent pigment, such as quinacridone, perylene or DCM1, to $Alq_3$.

However, the foregoing example is an example of organic light-emitting material to be used for a light emitting layer and not necessarily limited to this. It is satisfactory to form a light emitting layer (layer for light emission and carrier movement therefore) by freely combining a light emitting layer, a charge transporting layer and a charge injection layer. For example, although in this embodiment was shown the example in which a low molecular weight organic light-emitting material is used for a light emitting layer, it is possible to use an intermediate molecular weight organic light-emitting material or high molecular weight organic light-emitting material. In this specification, an intermediate molecular weight organic light-emitting material can be defined that an aggregate of an organic compound which does not have subliming property or dissolving property (preferably, an aggregate which has molecularity of 10 or less), or an organic compound which has a molecular chain length of 5 μm of less (preferably 50 nm or less). As an example of using high molecular electroluminescent emitting material, the laminated pad can be made polythiophene (PEDOT) films with a thickness of 20 nm is provided by spin coating method as a hole injection layer, and paraphenylene-vinylene (PPV) films with a thickness of 100 nm is provided thereon as a light emitting layer. The light emitting wave length can be selected from red through blue by using π-conjugated system high molecular of PPV. The inorganic material such as a silicon carbide can be used as a charge transporting layer and a charge injection layer. These organic light-emitting material and inorganic light-emitting material are formed by using known materials.

Next, a cathode 714 of a conductive film is provided on the light emitting layer 713. In this embodiment, as the conductive film is used an alloy film of aluminum and lithium. A known MgAg film (alloy film of magnesium and silver) may be used. As the cathode material may be used a conductive film of an element belonging to the periodic-table group 1 or 2, or a conductive film added with such an element.

A light-emitting element 715 is completed at a time having formed up to the cathode 714. Incidentally, the light-emitting element 715 herein refers to a diode formed with a pixel electrode (anode) 711, a light emitting layer 713 and a cathode 714.

It is effective to provide a protective film 754 in such a manner to completely cover the light-emitting element 715. The protective film 754 is formed by an insulating film including a carbon film, a silicon nitride film or a silicon oxynitride film, and used is an insulating film in a single layer or a combined lamination.

In such a case, it is preferred to use a film favorable in coverage as a protective film 754. It is effective to use a carbon film, particularly DLC (diamond-like carbon) film. The DLC film, capable of being deposited in a temperature range of from room temperature to 100° C. or less, can be easily deposited over the light emitting layer 713 low in heat resistance. Meanwhile, the DLC film, having a high blocking effect to oxygen, can suppress the light emitting layer 713 from oxidizing. Consequently, prevented is the problem of oxidation in the light emitting layer 713 during the following seal process.

In this embodiment, the light emitting layer 713 is overlapped completely with a inorganic insulating film having high barrier property such as a carbon film, a silicon nitride, a silicon oxynitride, aluminum nitride, or aluminum oxynitride, so that it can prevent effectively the deterioration of the light emitting layer due to water and oxygen from penetrating thereof into the light emitting layer.

Furthermore, it is preferable to use the silicon nitride film formed by sputtering method using silicon as a target for the third interlayer insulating film 750, the passivation film 712, the protective film 754 that the penetration of impurities into the light emitting layer is prevented effectively. The deposition condition may be appropriately selected, preferably, nitride ($N_2$) or a mixed gas of nitride and argon are used for sputtering gas, and sputtering is performed by applying a high frequency electric. The substrate temperature may be set as room temperature, and heating means are unnecessary to be used. If the organic insulating film and the organic compound layer are formed already, it is preferable that the deposition is conducted without heating the substrate. However, to remove completely absorbed water or occluded water, it is preferable to perform dehydration by heating for several minutes to hours in vacuum at about 50 to 100° C.

The silicon nitride film formed- by sputtering method at the condition: at room temperature using silicon as a target; applying 13.56 MHz high frequency electric; and using nitride gas is characterized in that not only the absorption peak of N—H association and Si—H association are not observed but also the absorption peak of Si—O in the infrared absorption spectrum. The oxide density and the hydrogen density is not more than 1 atomic %. Thus, it can prevent more effectively impurities such as oxygen and water more effectively from penetrating into the light emitting layer.

Furthermore, a seal member 717 is provided to overlap the light emitting layer 715 to bond a cover member 718. For the seal member 717 used may be an ultraviolet curable resin. It is effective to provide therein a substance having a hygroscopic effect or an antioxidant effect. Meanwhile, in this embodiment, for the cover member 718 used is a glass substrate, quartz substrate or plastic substrate (including a plastic film) having carbon films (preferably diamond-like carbon films) formed on the both surfaces thereof.

Thus, completed is a light-emitting device having a structure as shown in FIG. 30B. Incidentally, it is effective to continuously carry out, without release to the air, the process to form a protective film after forming a passivation film 712 by using a deposition apparatus of a multi-chamber scheme (or in-line scheme). In addition, with further development it is possible to continuously carry out the process up to bonding a cover member 718, without release to the air.

In this manner, n-channel TFTs 731, p-channel TFT 732, a switching TFT (n-channel TFT) 733 and a current control TFT (p-channel TFT) 734 are formed on the substrate 700.

Furthermore, as was explained using FIGS. 30A and 30B, by providing an impurity region overlapped with the gate electrode through an insulating film, it is possible to form an n-channel TFT resistive to the deterioration resulting from hot-carrier effect. Consequently, a reliable light emitting device can be realized.

Meanwhile, this embodiment shows only the configuration of the pixel portion and driver circuit. However, according to the manufacturing process in this embodiment, besides there, it is possible to form logic circuits such as a signal division circuit, a D/A converter, an operation amplifier, a y-correction circuit on a same insulator. Furthermore, a memory or microprocessor can be formed.

The light emitting device manufactured, wherein a laser beam having a periodic or uniform energy distribution is irradiated and a crystal grain with a large grain size is formed. Thus, the light emitting device ensures a good operational characteristic and high reliability. The light emitting device can be used as a display portion for an electronic appliance in various kinds.

Incidentally, this embodiment can be implemented by combining any one of Embodiments 1 to 7.

Embodiment 10

Figure 31:
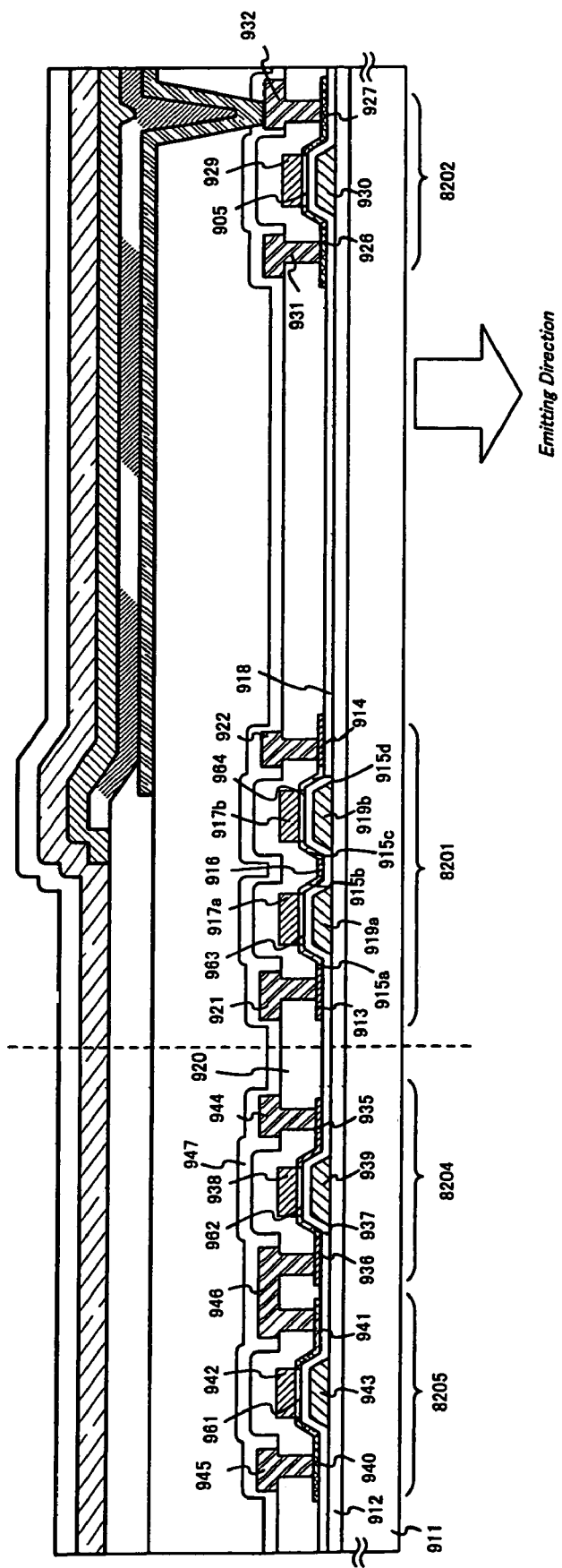
FIG. 31 is a sectional view showing a light emitting device employing a semiconductor fabricating device according to the invention.

This embodiment describes a pixel configuration of a light emitting device that is one of a semiconductor device of the present invention. FIG. 31 shows a cross-sectional view of a pixel of the light emitting device of this embodiment.

Reference numeral 911 denotes a substrate and reference numeral 912 denotes an insulating film which becomes a base (hereafter referred to as a base film) in FIG. 31. A light transmitting substrate, typically a glass substrate, a quartz substrate, a glass ceramic substrate, or a crystalline glass substrate can be used as the substrate 911. However, the substrate used must be one able to withstand the highest process temperature during the manufacturing processes.

Reference numeral 8201 denotes a switching TFT, reference numeral 8202 denotes a current controlling TFT, and both are formed by n-channel TFT and p-channel TFTs respectively. When the direction of light emitted from the light emitting layer is toward bottom of the substrate (surface where TFTs and the organic light emitting layer are not formed), the above structure is preferable. However, the present invention is not limited to this structure. The switching TFT and the current controlling TFT may be either n-channel TFTs or p-channel TFTs.

The switching TFT 8201 has an active layer containing a source region 913, a drain region 914, LDD regions 915a to 915d, a separation region 916, and an active layer including channel forming regions 917a and 917b, a gate insulating film 918, gate electrodes 919a and 919b, a first interlayer insulating film 920, a source signal line 921 and a drain wiring 922. Note that the gate insulating film 918 and the first interlayer insulating film 920 may be common among all TFTs on the substrate, or may differ depending upon the circuit or the element.

Furthermore, the switching TFT 8201 shown in FIG. 31 is electrically connected to the gate electrodes 917a and 917b, becoming namely a double gate structure. Not only the double gate structure, but also a multi gate structure (a structure containing an active layer having two or more channel forming regions connected in series) such as a triple gate structure, may of course also be used.

The multi gate structure is extremely effective in reducing the off current, and provided that the off current of the switching TFT is sufficiently lowered, a capacitor connected to the gate electrode of the current controlling TFT 8202 can be have its capacitance reduced to the minimum necessary. Namely, the surface area of the capacitor can be made smaller, and therefore using the multi gate structure is effective in expanding the effective light emitting surface area of the light emitting elements.

In addition, the LDD regions 915a to 915d are formed so as not to overlap the gate electrodes 919a and 919b through the gate insulating film 918 in the switching TFT 8201. This type of structure is extremely effective in reducing the off current. Furthermore, the length (width) of the LDD regions 915a to 915d may be set from 0.5 to 3.5 µm, typically between 2.0 and 2.5 µm. Further, when using a multi gate structure having two or more gate electrodes, the separation region 916 (a region to which the same impurity element, at the same concentration, as that added to the source region or the drain region, is added) is effective in reducing the off current.

Next, the current controlling TFT 8202 is formed having an active layer containing a source region 926, a drain region 927, and a channel forming region 929; the gate insulating film 918; a gate electrode 930, the first interlayer insulating film 920; a source wiring 931; and a drain wiring 932. The current controlling TFT 8202 is a p-channel TFT in this embodiment.

Further, the drain region 914 of the switching TFT 8201 is connected to the gate electrode 930 of the current controlling TFT 8202. Although not shown in the figure, specifically the gate electrode 930 of the current controlling TFT 8202 is electrically connected to the drain region 914 of the switching TFT 8201 through the drain wiring (also referred to as a connection wiring) 922. The gate electrode 930 is a single gate structure in this embodiment, however, the multi gate structure can be also applied. The source wiring 931 of the current controlling TFT 8202 is connected to a power source supply line (not shown in the figure).

The structures of the TFTs formed within the pixel are explained above, but a driver circuit is also formed simultaneously at this point. A CMOS circuit, which becomes a basic unit for forming the driver circuit, is shown in FIG. 31.

A TFT having a structure in which hot carrier injection is reduced without an excessive drop in the operating speed is used as an n-channel TFT 8204 of the CMOS circuit in FIG. 31. Note that the term driver circuit indicates a source signal line driver circuit and a gate signal line driver circuit here. It is also possible to form other logic circuit (such as a level shifter, an A/D converter, and a signal division circuit).

An active layer of the n-channel TFT 8204 of the CMOS circuit contains a source region 935, a drain region 936, an LDD region 937, and a channel forming region 962. The LDD region 937 overlaps with a gate electrode 939 through the gate insulating film 918.

Formation of the LDD region 937 on only the drain region 936 side is so as not to have drop the operating speed. Further, it is not necessary to be very concerned about the off current with the n-channel TFT 8204, and it is good to place more importance on the operating speed. Thus, it is desirable that the LDD region 937 is made to completely overlap the gate electrode to decrease a resistance component to a minimum. It is therefore preferable to eliminate so-called offset.

Furthermore, there is almost no need to be concerned with degradation of a p-channel TFT 8205 of the CMOS circuit, due to hot carrier injection, and therefore no LDD region need be formed in particular. Its active layer therefore contains a source region 940, a drain region 941, and a channel forming region 961, and a gate insulating film 918 and a gate electrode 943 are formed on the active layer. It is also possible, of course, to take measures against hot carrier injection by forming an LDD region similar to that of the n-channel TFT 8204.

The references numeral 961 to 965 are masks to form the channel forming regions 942, 938, 917a, 917b and 929.

Further, the n-channel TFT 8204 and the p-channel TFT 8205 have source wirings 944 and 945, respectively, on their source regions, through the first interlayer insulating film 920. In addition, the drain regions of the n-channel TFT 8204 and the p-channel TFT 8205 are mutually connected electrically by a drain wiring 946.

Next, there will be described a semiconductor fabricating device of the present invention that uses the forming of a semiconductor film, the crystallization of an activation layer, the activation, or the step using laser annealing.

Figure 35:
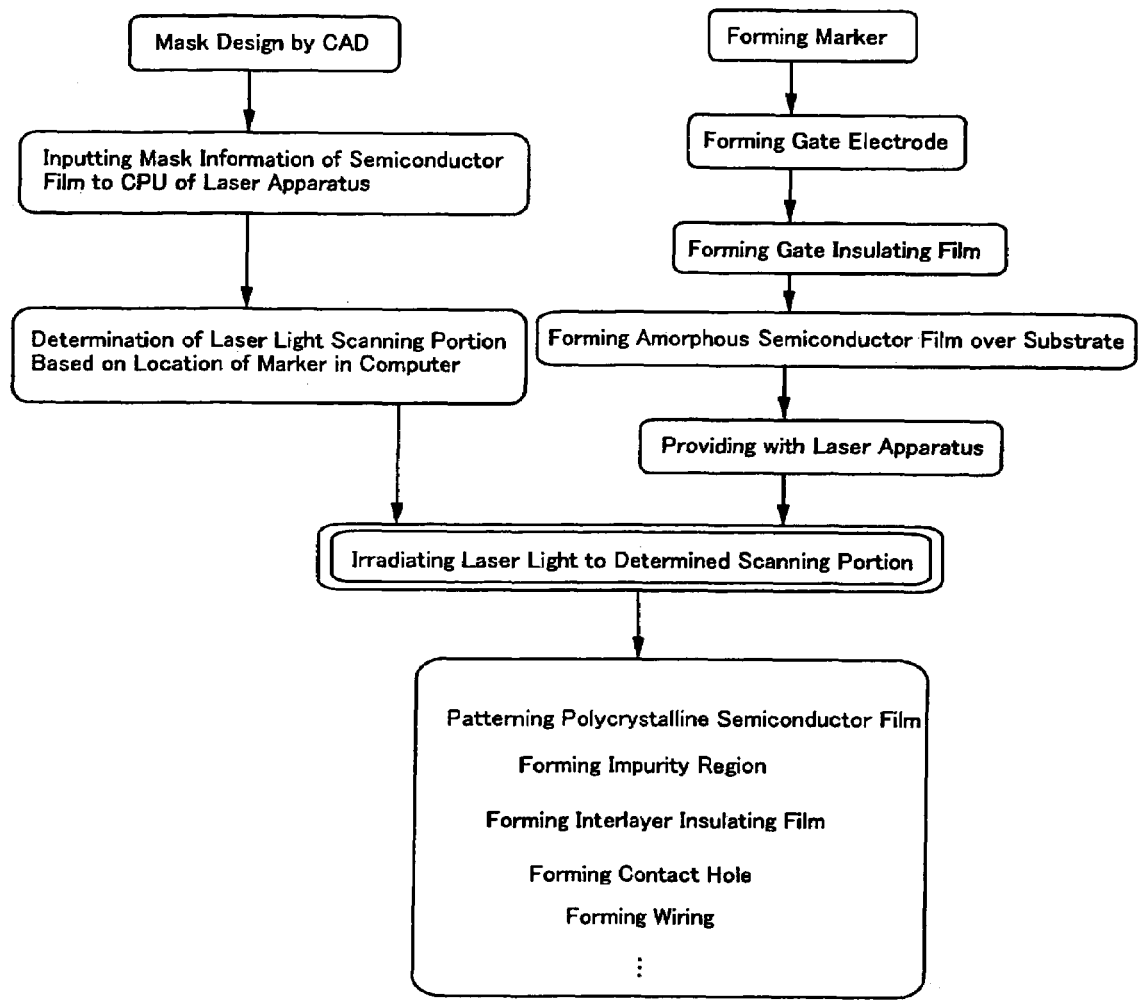
FIG. 35 is a flow chart showing the steps of a fabrication procedure according to the invention.

A manufacturing flow of the light emitting device of the present invention is shown in FIG. 35 as a flowchart. First, there is performed the designing of a semiconductor device using CAD. Then, information concerning the shape of each designed mask for patterning a semiconductor film is inputted into a computer possessed by the laser apparatus.

On the other hand, the gate electrode is formed according to the marker formed on the substrate. The gate insulating film is formed to cover the gate electrode, and the amorphous semiconductor film is formed to contact with the gate insulating film. After an amorphous semiconductor film is formed on a substrate, the substrate, on which the amorphous semiconductor film has been formed, is set in the laser apparatus.

On the basis of inputted information concerning the masks, the computer determines each portion to be scanned with laser lights with reference to the positions of the markers. Then, with reference to the formed markers, the laser lights are irradiated onto the portion to be scanned with the laser lights, thereby partially crystallizing the semiconductor film.

Then, after the irradiation of the laser beams, a polycrystalline semiconductor film obtained by the irradiation of the laser beams is patterned and etched, thereby forming island-like semiconductor films. The timing of patterning of the polycrystalline semiconductor film is possible to change appropriately according to the TFT design. Following this, there is performed a step for manufacturing a TFT from these island-like semiconductor films. The concrete step for manufacturing the TFT differs depending on the shape of the TFT. Representatively, however, a gate insulating film is formed and an impurity region is formed in the island-like semiconductor films. Then, an interlayer insulating film is formed so as to cover the island-like semiconductor film, and a contact hole is established in the interlayer insulating film. In this manner, there is obtained an exposed part of the impurity region. Then, wiring is formed on the interlayer insulating film so as to contact the impurity region through the contact hole.

The semiconductor fabricating device may be used to conduct not only steps from forming of the amorphous semiconductor film to the crystallization of the laser beam, but also steps from forming of the gate insulating film to the crystallization by the laser beam without exposing to the atmosphere in succession, or adding another steps in succession.

The structure of this embodiment may be implemented by combining freely with Embodiments 1 to 9.

Embodiment 11

Given as embodiments of electric equipment employing a semiconductor device formed by the laser apparatus of the present invention is applied are: a video camera; a digital camera; a goggle type display (head mounted display); a navigation system; an audio reproducing device (car audio, an audio component, and the like); a laptop computer; a game machine; a portable information terminal (a mobile computer, a cellular phone, a portable game machine, an electronic book, etc.); and an image reproducing device equipped with a recording medium (specifically, a device equipped with a display device which can reproduce a recording medium such as a digital versatile disk (DVD), and can display the image). Specific examples of the electric equipment are shown in FIGS. 32A to 32H.

Figure 32A:
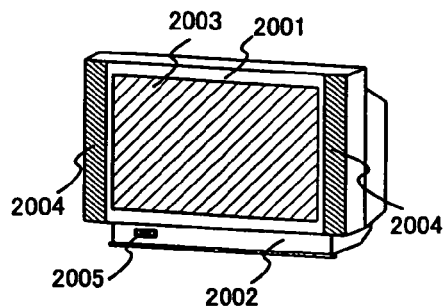
FIGS. 32A to 32H are diagrams showing exemplary electronic apparatuses employing the semiconductor device according to the invention.

FIG. 32A shows a display device, which comprises a casing 2001, a supporting base 2002, a display portion 2003, speaker portions 2004, a video input terminal 2005, etc. The light emitting device formed by the present invention is applied can be used for the display portion 2003. The semiconductor device is self-luminous and does not need a backlight, so that it can make a thinner display portion than liquid display devices can. The term display device includes every display device for displaying information such as one for a personal computer, one for receiving TV broadcasting, and one for advertisement.

Figure 32B:
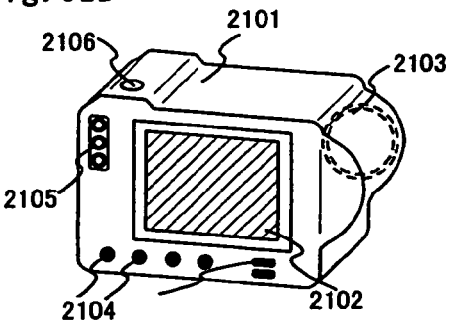

FIG. 32B shows a digital still camera, which comprises a main body 2101, a display portion 2102, an image receiving portion 2103, operation keys 2104, an external connection port 2105, a shutter 2106, etc. The light emitting device formed by the present invention is applied can be used for the display portion 2102, and other circuits.

Figure 32C:
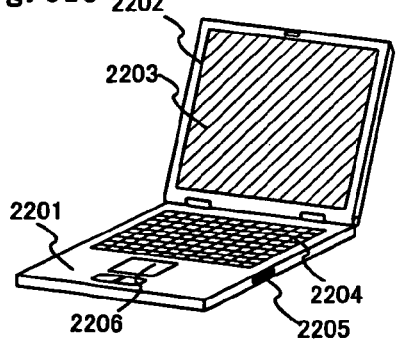

FIG. 32C shows a laptop computer, which comprises a main body 2201, a casing 2202, a display portion 2203, a keyboard 2204, an external connection port 2205, a pointing mouse 2206, etc. The light emitting device formed by the present invention is applied can be used for the display portion 2203, and other circuits.

Figure 32D:
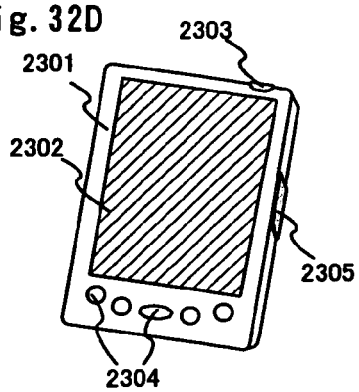
Figure 32E:
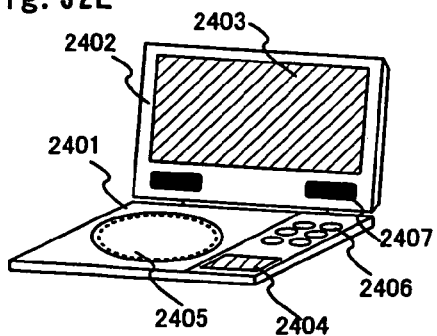

FIG. 32D shows a mobile computer, which comprises a main body 2301, a display portion 2302, a switch 2303, operation keys 2304, an infrared ray port 2305, etc. The light emitting device formed by the present invention is applied can be used for the display portion 2302, and other circuits.

FIG. 232E shows a portable image reproducing device equipped with a recording medium (a DVD player, to be specific). The device comprises a main body 2401, a casing 2402, a display portion A 2403, a display portion B 2404, a recording medium (DVD or the like) reading portion 2405, operation keys 2406, speaker portions 2407, etc. The display portion A 2403 mainly displays image information whereas the display portion B 2404 mainly displays text information. The light emitting device formed by the present invention is applied can be used for the display portions A 2403 and B 2404, and other circuits. The term image reproducing device equipped with a recording medium includes domestic game machines.

Figure 32F:
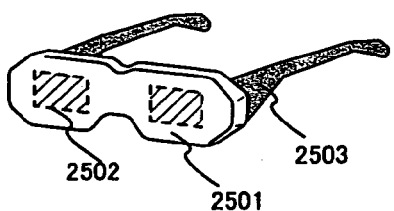

FIG. 32F shows a goggle type display (head mounted display), which comprises a main body 2501, display portions 2502, and arm portions 2503. The light emitting device formed by the present invention is applied can be used for the display portions 2502, and other circuits.

Figure 32G:
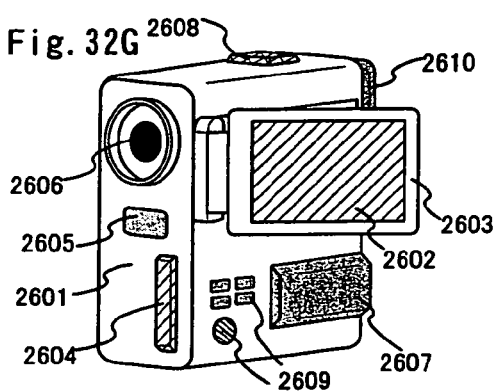

FIG. 32G shows a video camera, which comprises a main body 2601, a display portion 2602, a casing 2603, an external connection port 2604, a remote control receiving portion 2605, an image receiving portion 2606, a battery 2607, an audio input portion 2608, operation keys 2609, eyepiece portion 2610 etc. The light emitting device formed by the present invention is applied can be used for the display portion 2602, and other circuits.

Figure 32H:
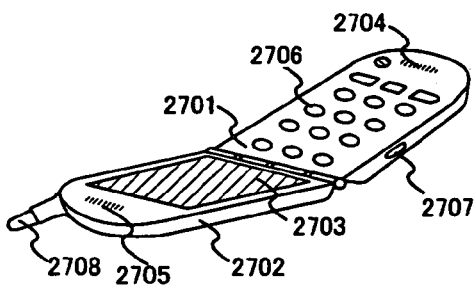

FIG. 32H shows a cellular phone, which comprises a main body 2701, a casing. 2702, a display portion 2703, an audio input portion 2704, an audio output portion 2705, operation keys 2706, an external connection port 2707, an antenna 2708, etc. The light emitting device formed by the present invention is applied can be used for the display portion 2703, and other circuits. If the display portion 2703 displays white characters on a black background, power consumption of the cellular phone can be reduced.

The light emitting device can be used also in a front or rear projector besides above-mentioned electronic apparatuses.

As described above, the application range of the light emitting device to which the present invention is applied is very wide and electric equipment of every field can employ the device. The electric equipments in this embodiment may use any configuration of semiconductor devices shown in Embodiments 1 to 10.

Embodiment 12

Figure 34:
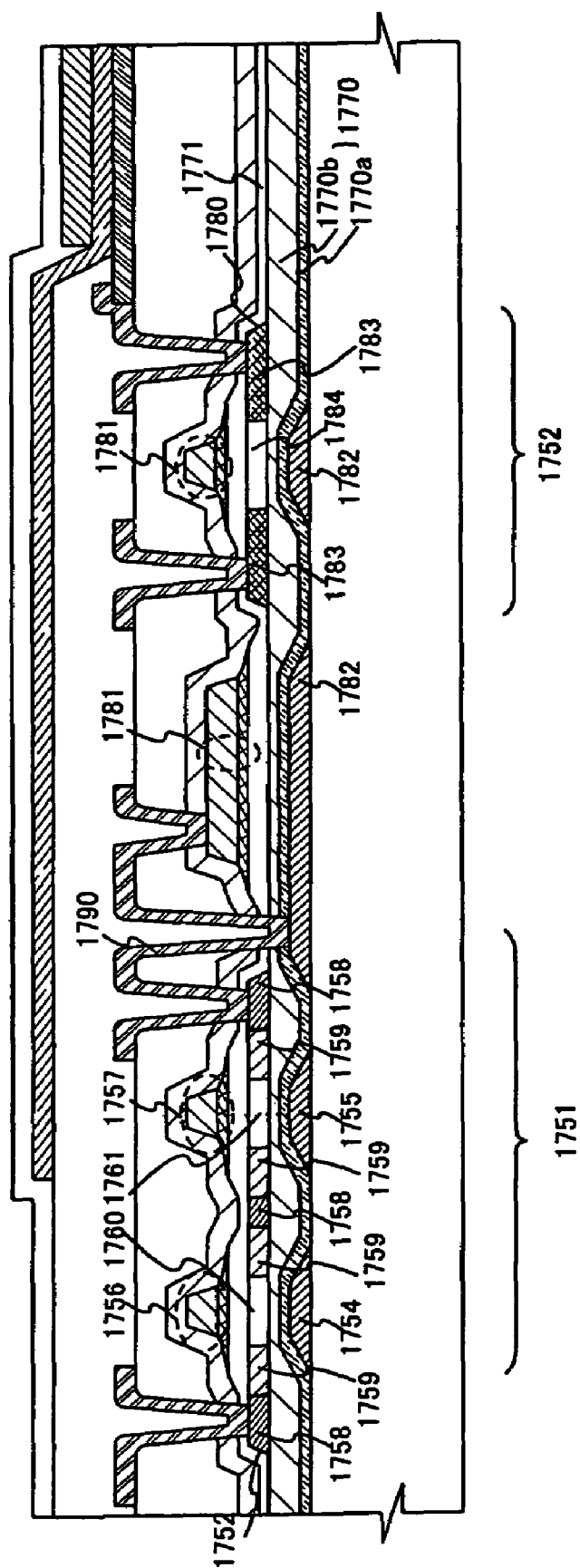
FIG. 34 is a diagram showing a method for fabricating a light emitting device using the semiconductor fabricating apparatus of the invention.

In this embodiment, description is made on a construction of a pixel of a light emitting device fabricated by the semiconductor fabricating apparatus of the invention. FIG. 34 is a sectional view showing a pixel of the light emitting device according to the embodiment.

A reference numeral 1751 denotes an n-channel TFT whereas a numeral 1752 denotes a p-channel TFT. The n-channel TFT 1751 includes a semiconductor film 1753, a first insulating film 1770, first electrodes 1754, 1755, a second insulating film 1771, and second electrodes 1756, 1757. The semiconductor film 1753 includes a one-conductive type impurity region of a first concentration 1758, a one-conductive type impurity region of a second concentration 1759, and channel forming regions 1760, 1761.

The first electrodes 1754, 1755 and the channel forming regions 1760, 1761 are in stacked relation with the first insulating film 1770 interposed therebetween. The second electrodes 1756, 1757 and the channel forming regions 1760, 1761 are in stacked relation with the second insulating film 1771 interposed therebetween.

The p-channel TFT 1752 includes a semiconductor film 1780, the first insulating film 1770, a first electrode 1781, the second insulating film 1771, and a second electrode 1782. The semiconductor film 1780 includes a one-conductive type impurity region of a third concentration 1783, and a channel forming region 1784.

The first electrode 1781 and the channel forming region 1784 are in stacked relation with the first insulating film 1770 interposed therebetween. The second electrode 1782 and the channel forming region 1784 are in stacked relation with the second insulating film 1771 interposed therebetween.

The first electrode 1781 and the second electrode 1782 are electrically interconnected via a wiring 1790.

The semiconductor fabricating apparatus of the invention may be used in the steps of forming, crystallizing and activating the semiconductor films 502, 530 and other processes using laser annealing.

According to the embodiment, the TFT (the n-channel TFT 1751 in this embodiment), used as a switching device, applies a constant voltage to the first electrode. The application of the constant voltage to the first electrode is effective to reduce the variations of threshold as compared with an arrangement including a single electrode and to reduce OFF current.

In the TFT (the p-channel TFT 1752 in this embodiment) conducting a greater current than the TFT used as the switching device, the first electrode and the second electrode are electrically interconnected. The application of the same voltage to the first and second electrodes provides quick propagation of a depletion layer just as in a semiconductor film decreased in thickness, thus resulting in a decreased subthreshold voltage swing and an enhanced field effect mobility. Therefore, the TFT achieves a greater on current than a TFT including a single electrode. Hence, the use of the TFT of this structure in a drive circuit leads to a decreased drive voltage. Furthermore, the achievement of the increased on current permits the size reduction (channel width, in particular) of the TFT. This leads to an increased packaging density.

Figure 36:
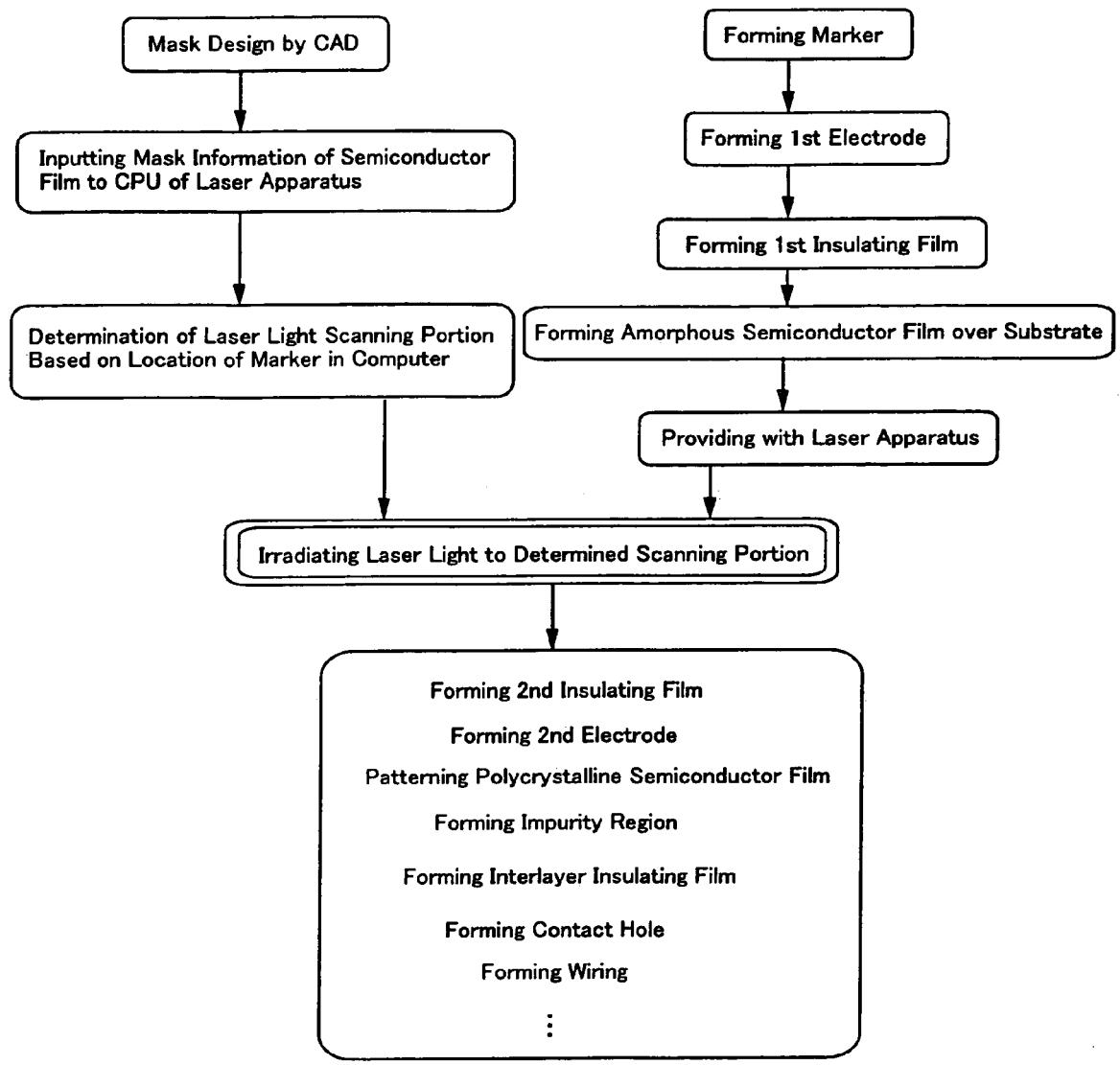
FIG. 36 is a flow chart showing the steps of a fabrication procedure according to the invention.

FIG. 36 is a flow chart showing the steps of fabricating a light emitting device according to the invention. First, a semiconductor device is designed by means of a CAD. Then, information indicative of a configuration of a patterning mask for the designed semiconductor film is inputted to the computer of the laser irradiation equipment.

On the other hand, first electrodes are formed based on markers formed on the substrate. In this process, the first electrodes may be formed in parallel with the markers. Subsequently, a first insulating film is formed in a manner to cover the first electrodes. Then an amorphous semiconductor film is formed in contacting relation with the first insulating film.

After the formation of the amorphous semiconductor film on the substrate, the substrate formed with the amorphous semiconductor film is loaded on the laser irradiation equipment.

According to the mask information inputted to the computer, the computer defines an area to be scanned with the laser light with reference to the position of the markers. With reference to the formed markers, the laser light is irradiated on the area to be scanned for local crystallization of the semiconductor film.

The laser irradiation is followed by sequential formation of a second insulating film and second electrodes. The polycrystalline semiconductor film formed by the laser irradiation is patterned and etched thereby forming semiconductor film islands. A timing at which the polycrystalline semiconductor film is patterned may properly be changed according to the TFT design. In the subsequent steps, TFTs are formed from the semiconductor film islands. Although specific steps may vary depending upon the configurations of the TFTs, the steps typically include: forming impurity regions in the semiconductor film islands; forming an interlayer insulating film in a manner to cover the second insulating film and the second electrodes; forming contact holes in the interlayer insulating film for partially exposing the impurity regions; and laying a wiring on the interlayer insulating film in a manner to establish contact with the impurity regions via the contact holes.

Instead of being used only for the formation of the amorphous semiconductor film and the irradiation of the laser light for crystallization, the semiconductor fabricating apparatus of the invention may be used in the process between the formation of the first insulating film and the formation of the second insulating film such that these steps may be sequentially performed without exposure to the atmosphere. Furthermore, the inventive apparatus may be operated for sequential performance of the above steps and other steps.

It is noted that this embodiment may be implemented in combination with any one of Embodiments 1 to 11.

Embodiment 13

This embodiment illustrates an example where the semiconductor device of the invention is used for forming a drive circuit (signal line drive circuit or scanning line drive circuit) which is mounted on a pixel portion formed from an amorphous semiconductor film by way of TAB or COG.

Figure 38A:
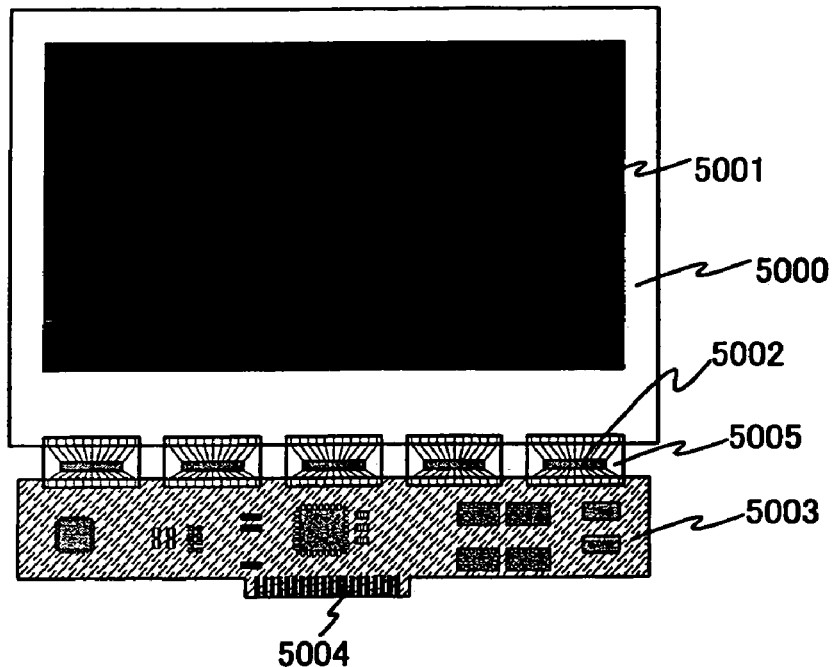
FIGS. 38A and 38B are diagrams each showing a drive circuit mounted on a panel.

FIG. 38A illustrates an example where a drive circuit is mounted on TAB, which is used for interconnecting a pixel portion and a printed wiring board formed with an external controller and the like. A pixel portion 5001 is formed on a glass substrate 5000 and is connected with a drive circuit 5002 via a TAB 5005, the drive circuit fabricated by the semiconductor fabricating apparatus of the invention. The drive circuit 5002 is also connected with a printed wiring board 5003 via the TAB 5005. The printed wiring board 5003 is provided with a terminal 5004 for connection with an external interface.

Figure 38B:
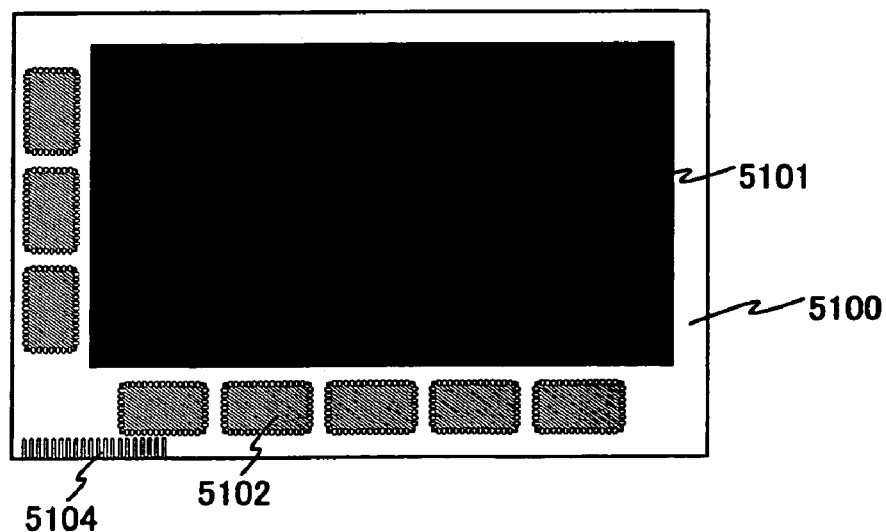

FIG. 38B illustrates an example where a drive circuit and a pixel portion are mounted by way of COG. A pixel portion 5101 is formed on a glass substrate 5100, on which a drive circuit 5102 fabricated by the semiconductor fabricating apparatus of the invention is mounted. The substrate 5100 is further provided with a terminal 5104 for connection with an external interface.

The TFT fabricated by the semiconductor fabricating apparatus of the invention is further enhanced in the crystallinity of the channel forming region and hence, is capable of high speed operation. Thus, the TFT is more suitable for forming the drive circuit required of a faster operation than the pixel portion. In addition, a higher yield can be achieved by separately fabricating the pixel portion and the drive circuit.

It is noted that this embodiment may be implemented in combination with any one of Embodiments 1 to 12.

Embodiment 14

In this embodiment, description is made on relation between an inter-center distance of beam spots superpositioned on each other and an energy density.

Figure 39:
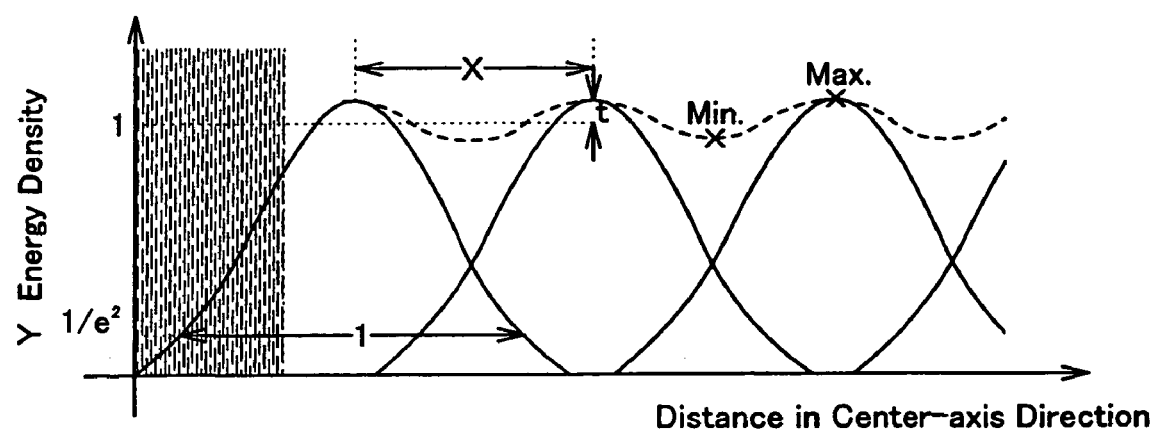
FIG. 39 is a graph representing a center-axis distribution of energy densities of superpositioned beam spots.

FIG. 39 is a graphical representation wherein a solid line represents a center-axis distribution of energy densities of each beam spot and a broken line represents a distribution of energy densities of a synthesized beam spot. Values of the center-axis energy densities of the beam spot generally follow Gaussian distribution.

Figure 40:
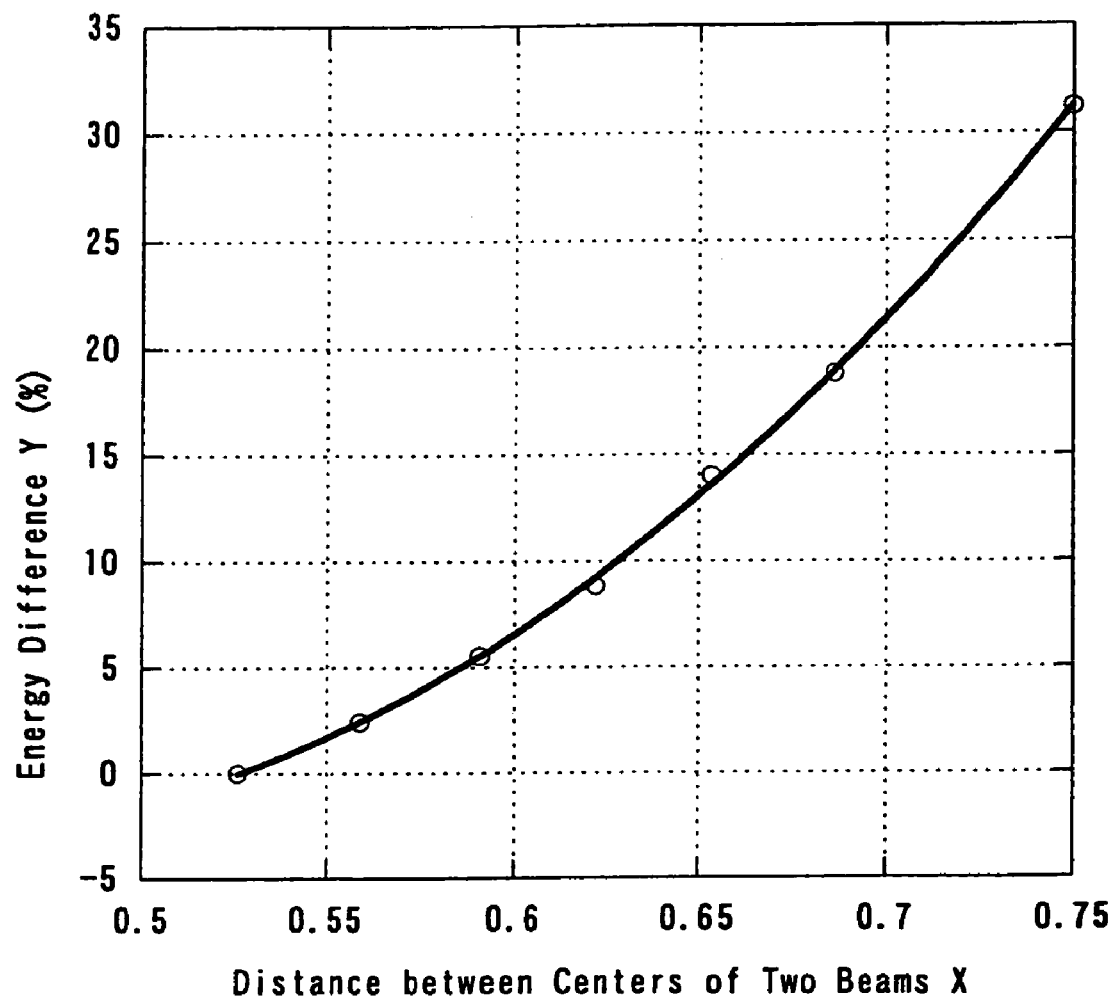
FIG. 40 is a graph representing a relation between an inter-center distance of the beam spots and an energy difference.

In an unsynthesized beam spot, X is defined to mean a peak-to-peak distance based on a center-axis distance defined as 1, where the energy density is not less than $1/e^2$ of the peak value. In the synthesized beam spot, Y is defined to mean an increase of peak value from a mean value between a peak value after synthesis and a valley value. FIG. 40 graphically represents a relation between X and Y obtained by simulation. Incidentally, Y is expressed in percentage in FIG. 40.

In FIG. 40, the energy difference Y is expressed by the following approximation expression 1.

$$Y=60-293X+340X^2 \text{ (X being a greater one of two solutions)} \quad \text{[Expression 1]}$$

Expression 1 indicates that in order to obtain an energy difference on the order of 5%, $X \cong 0.584$. Although Y=0 is ideal, this results in a decreased length of the beam spot. An optimum value X may be determined taking balance with throughput into consideration.

Figure 41:
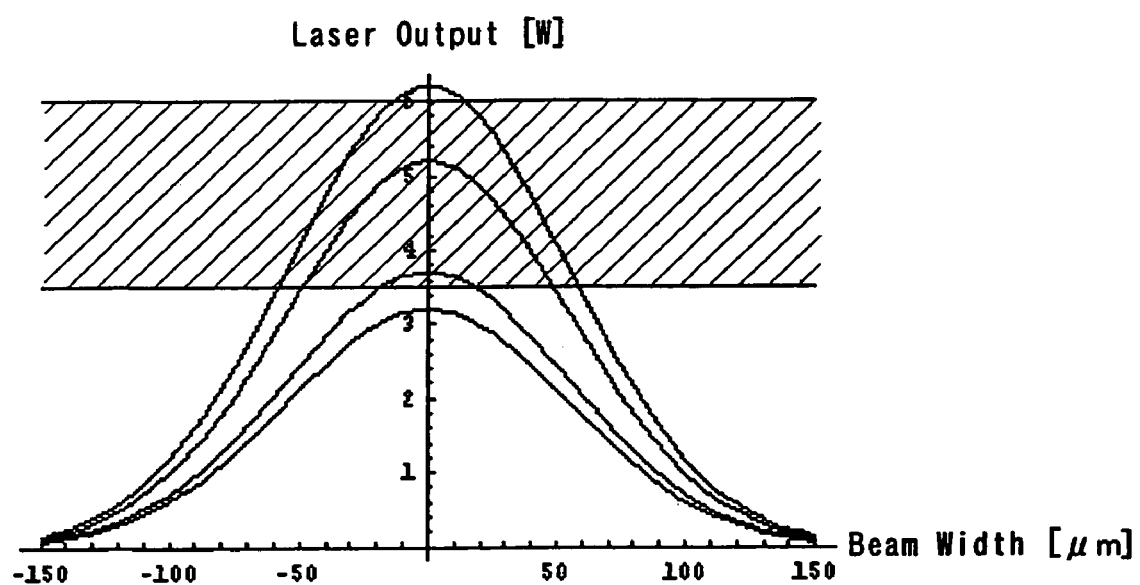
FIG. 41 is a graph representing a center-axis distribution of output energies of the beam spot.

Next, an allowable range of Y is described. FIG. 41 graphically represents a distribution of outputs (W) from a $YVO_4$ laser with respect to center-axis beam widths of beam spots of an elliptical shape. A hatched area represents a range of output energy required for obtaining favorable crystallinity. The graph indicates that the synthesized laser light may have the output energy in the range of 3.5 to 6 W.

When the maximum value and the minimum value of the output energy of the synthesized beam spot are at the upper limit and the lower limit of the range of the output energy required for the favorable crystallinity, the difference Y of the energy required for the favorable crystallinity has the greatest range. According to FIG. 41, therefore, the energy difference Y is ±26.3%. If the energy difference Y is within this range, the favorable crystallinity can be obtained.

The range of the output energy required for the favorable crystallinity may vary depending upon standards on which to base the favorable crystallinity. Furthermore, the distribution of output energies may vary depending upon the shape of the beam spot. Accordingly, the allowable range of the energy difference Y is not always limited by the above values. The designer need to define a proper range of the output energy required for the favorable crystallinity and to determine the allowable range of the energy difference Y based on the output energy distribution of a laser to be employed.

It is noted that this embodiment may be implemented in combination with any one of Embodiments 1 to 13.

Embodiment 15

One embodiment of the laser irradiation equipment of the semiconductor fabricating apparatus of the invention will be described.

Figure 42:
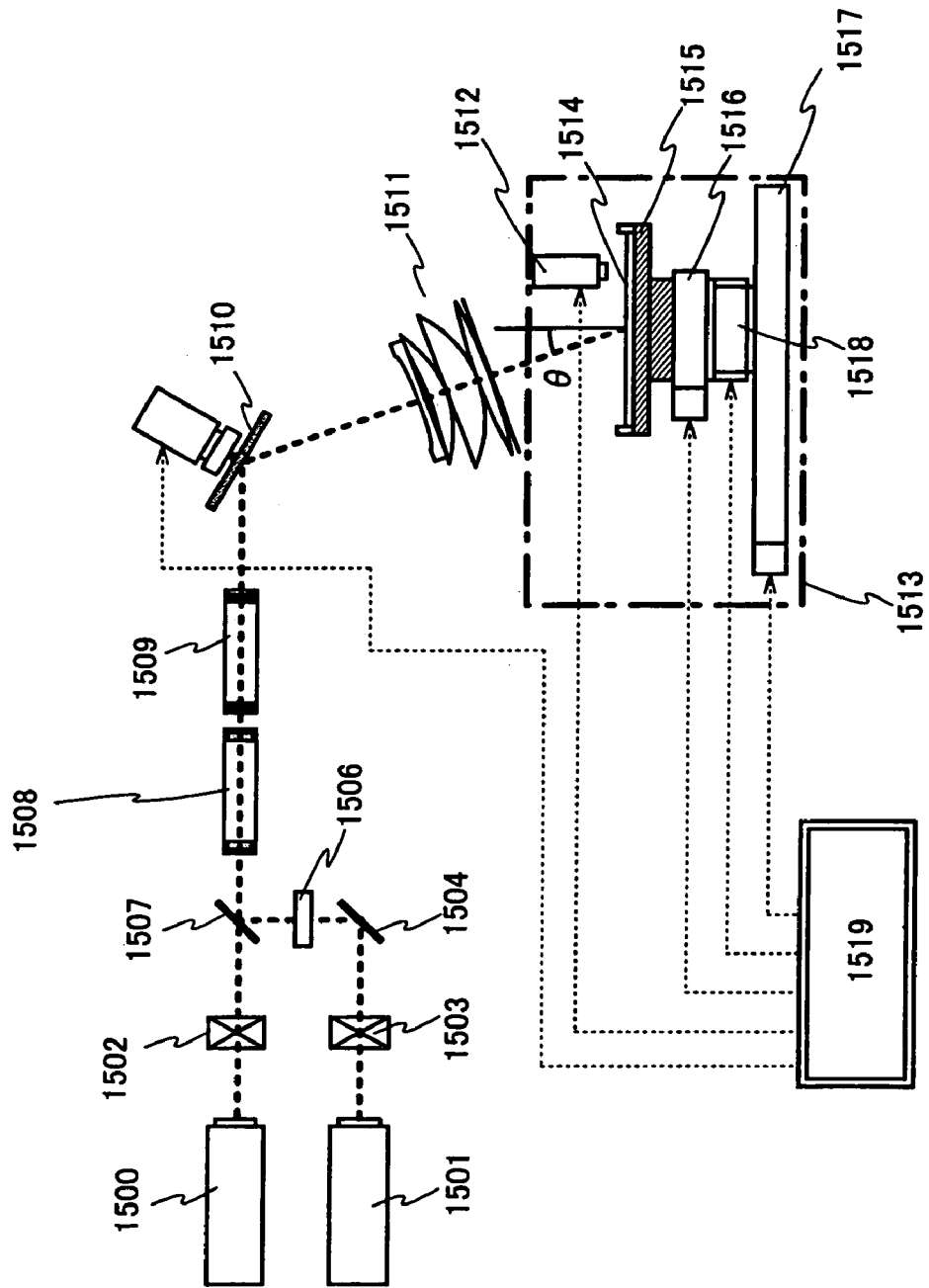
FIG. 42 is a diagram showing an exemplary laser irradiation equipment.

FIG. 42 illustrates an arrangement of the laser irradiation equipment according to the embodiment. Laser light emitted from a laser oscillator 1500 is linearly polarized by a polarizer 1507 and then becomes incident on a beam expander 1508. On the other hand, laser light emitted from a laser oscillator 1501 is linearly polarized by a polarizer 1504 and then becomes incident on a sheet polarizer 1506, where the polarization angle of the polarized light is changed by 90°. Then the polarized light together with the laser light from the laser oscillator 1500 are directed by the polarizer 1507 toward the beam expander 1508.

Although this embodiment interposes a shutter 1502 between the laser oscillator 1500 and the polarizer 1507 for blocking the laser light, the shutter is not necessarily required. On the other hand, a shutter 1503 is interposed between the laser oscillator 1501 and the polarizer 1504 but is not necessarily required.

The beam expander 1508 can regulate the size of a beam spot of the incident laser light while suppressing the expansion thereof.

The laser light outgoing from the beam expander 1508 is converged by a cylindrical lens 1509 in a manner that a beam spot has a rectangular, elliptical or linear shape. The laser light thus converged is reflected by a galvano mirror 1510 to become incident on a lens 1511. The incident laser light is converged again by the lens 1511 to be focused on a substrate 1514 in a laser irradiation chamber 1513. The embodiment employs a Fθ telecentric system as the lens 1511.

The inclination of the galvano mirror 1510 is controlled by a central processing unit 1519 thereby controlling the incidence angle θ of the laser light relative to the substrate 1514.

According to the embodiment, the polarizers 1504, 1507, the beam expander 1508, the polarizing plate 1506, the shutters 1502, 1503, the cylindrical lens 1509, the galvano mirror 1510 and the lens 1511 are included in the optical system.

In the laser irradiation chamber 1513, the substrate 1514 rests upon a stage 1515, a position of which is controlled by three position control means 1516-1518. Specifically, the φ-direction position control means 1516 causes the stage 1515 to rotate in a horizontal plane. The X-direction position control means 1517 causes the stage 1515 to move along an X-direction in the horizontal plane. The Y-direction position control means 1518 causes the stage 1515 to move along a Y-direction in the horizontal plane. The operations of the individual position control means are controlled by the central processing unit 1519.

A laser irradiation position on the substrate 1514 may be controlled by controlling of the operations of the above three position control means and the galvano mirror 1510.

As illustrated by the embodiment, a monitor 1512 employing a photo detector such as CCD may be provided for accurate determination of the position of the substrate.

It is noted that this embodiment may be implemented in combination with any one of Embodiments 1 to 14.

The invention is arranged such that the minimum prerequisite area of the semiconductor film is scanned with the laser light for crystallization instead of irradiating the laser light on the overall surface of the semiconductor film. The above arrangement obviates the time spent for irradiating the laser light on the portion to be removed by patterning subsequent to the crystallization of the semiconductor film, thereby achieving a dramatic reduction of processing time per substrate.

The above arrangement also prevents the semiconductor film under the laser irradiation from absorbing impurities in the clean room, such as boron and the like, that may affect the threshold or crystallinity of the TFTs, thus contributing to the further improvement of the mobility and threshold characteristics of the TFTs.

What is claimed is:

1. A manufacturing method for a semiconductor device having thin film transistors comprising:
    forming an amorphous semiconductor film on an insulating surface;
    forming a marker on the amorphous semiconductor film;
    selectively irradiating a laser light to perform crystallization to a region in which active layers of the thin film transistors are formed, based on information on arrangement of the thin film transistors with the marker used as a reference, and
    a direction in which the laser light is relatively moved on the amorphous semiconductor film is parallel to a direction in which carriers move in channel formation regions in the thin film transistors,
    wherein the amorphous semiconductor film is melted over entire thickness thereof through irradiation of the laser light.

2. A manufacturing method for a semiconductor device according to claim 1, wherein a solid laser oscillation apparatus is used as a light source for the laser light.

3. A manufacturing method for a semiconductor device according to claim 1, wherein at least one or a plurality of kinds selected from the group consisting of a YAG laser oscillation apparatus, a $YVO_4$ laser oscillation apparatus, a YLF laser oscillation apparatus, a $YAlO_3$ laser oscillation apparatus, a glass laser oscillation apparatus, a ruby laser oscillation apparatus, an alexandrite laser oscillation apparatus, a sapphire laser oscillation apparatus, and a forsterite laser oscillation apparatus are used as a light source for the laser light.

4. A manufacturing method for a semiconductor device according to claim 1, wherein the laser light is a second harmonic, a third harmonic, or a fourth harmonic.

5. A manufacturing method for a semiconductor device according to claim 1, wherein the laser light is converged onto the amorphous semiconductor film through a cylindrical lens.

6. A manufacturing method for a semiconductor device according to claim 1, wherein a relative movement direction of the spot on the amorphous semiconductor film is perpendicular to a longitudinal direction of the spot.

7. A manufacturing method for a semiconductor device having thin film transistors comprising:
    forming an amorphous semiconductor film on an insulating surface;
    forming a marker on the amorphous semiconductor film;
    determining a direction in which a spot of a laser light is relatively moved so as to be parallel to a direction in which carriers move in channel formation regions of the thin film transistors, based on information on arrangement of the thin film transistors with the marker used as a reference; and
    selectively irradiating the laser light to perform crystallization to a region in which active layers of the thin film transistors are formed, based on information on arrangement of the thin film transistors with the marker used as a reference,
    wherein the amorphous semiconductor film is melted over entire thickness thereof through irradiation of the laser light.

8. A manufacturing method for a semiconductor device according to claim 7, wherein a solid laser oscillation apparatus is used as a light source for the laser light.

9. A manufacturing method for a semiconductor device according to claim 7, wherein at least one or a plurality of kinds selected from the group consisting of a YAG laser oscillation apparatus, a $YVO_4$ laser oscillation apparatus, a YLF laser oscillation apparatus, a $YAlO_3$ laser oscillation apparatus, a glass laser oscillation apparatus, a ruby laser oscillation apparatus, an alexandrite laser oscillation apparatus, a sapphire laser oscillation apparatus, and a forsterite laser oscillation apparatus are used as a light source for the laser light.

10. A manufacturing method for a semiconductor device according to claim 7, wherein the laser light is a second harmonic, a third harmonic, or a fourth harmonic.

11. A manufacturing method for a semiconductor device according to claim 7, wherein the laser light is converged onto the amorphous semiconductor film through a cylindrical lens.

12. A manufacturing method for a semiconductor device according to claim 7, wherein a relative movement direction of the spot on the amorphous semiconductor film is perpendicular to a longitudinal direction of the spot.

13. A manufacturing method for a semiconductor device according to claim 1, wherein the laser light is a laser light of pulse oscillation.

14. A manufacturing method for a semiconductor device according to claim 1, wherein the laser light is a laser light of continuous oscillation.

15. A manufacturing method for a semiconductor device according to claim 7, wherein the laser light is a laser light of pulse oscillation.

16. A manufacturing method for a semiconductor device according to claim 7, wherein the laser light is a laser light of continuous oscillation.

* * * * *

UNITED STATES PATENT AND TRADEMARK OFFICE
CERTIFICATE OF CORRECTION

| | |
|---|---|
| PATENT NO. | : 7,439,115 B2 |
| APPLICATION NO. | : 11/370009 |
| DATED | : October 21, 2008 |
| INVENTOR(S) | : Shunpei Yamazaki et al. |

It is certified that error appears in the above-identified patent and that said Letters Patent is hereby corrected as shown below:

On the Title Page Item (73), the Assignee's name "Semiconductor Eneregy Laboratory Co., Ltd." should be deleted, and replaced with --Semiconductor Energy Laboratory Co., Ltd.--.

Signed and Sealed this

Sixteenth Day of December, 2008

JON W. DUDAS
*Director of the United States Patent and Trademark Office*